US011977207B2

(12) United States Patent
Gorodetsky et al.

(10) Patent No.: US 11,977,207 B2
(45) Date of Patent: May 7, 2024

(54) ADAPTIVE MATERIALS AND SYSTEMS FOR MANIPULATION OF ELECTROMAGNETIC RADIATION

(71) Applicant: The Regents of the University of California, Oakland, CA (US)

(72) Inventors: Alon A. Gorodetsky, Irvine, CA (US); Chengyi Xu, Irvine, CA (US); George Stiubianu, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 784 days.

(21) Appl. No.: 16/981,231

(22) PCT Filed: Mar. 15, 2019

(86) PCT No.: PCT/US2019/022600
§ 371 (c)(1),
(2) Date: Sep. 15, 2020

(87) PCT Pub. No.: WO2019/178553
PCT Pub. Date: Sep. 19, 2019

(65) Prior Publication Data
US 2021/0063612 A1    Mar. 4, 2021

Related U.S. Application Data

(60) Provisional application No. 62/643,403, filed on Mar. 15, 2018.

(51) Int. Cl.
*G02B 1/16* (2015.01)
*C23C 14/30* (2006.01)
(Continued)

(52) U.S. Cl.
CPC ............... *G02B 1/16* (2015.01); *C23C 14/30* (2013.01); *G02B 5/0841* (2013.01); *G02B 26/02* (2013.01); *G02B 26/0825* (2013.01)

(58) Field of Classification Search
CPC . G02B 5/23; G02B 5/208; G02B 5/20; G02B 5/285; G02B 1/16; G02B 26/02;
(Continued)

(56) References Cited

U.S. PATENT DOCUMENTS

| 3,806,471 A | 4/1974 | Mitchell et al. |
| 4,569,874 A | 2/1986 | Kuznetz |

(Continued)

FOREIGN PATENT DOCUMENTS

| EP | 3765870 A1 | 1/2021 |
| JP | 6257299 A  | 3/1987 |

(Continued)

OTHER PUBLICATIONS

Kautz et al., "Cephalopod-Derived Biopolymers for Ionic and Protonic Transistors", Advanced Materials, May 2018, vol. 30, No. 19, e1704917, 15 pgs., doi: 10.1002/adma.201704917.
(Continued)

*Primary Examiner* — Brandi N Thomas

(57) ABSTRACT

Fully artificial, adaptive composite materials and systems, having variable transmittance, reflectance, and/or absorptance to radiation in visible, infrared, or other desired region of the electromagnetic spectrum, and methods of the manufacture and use thereof are provided. The adaptive composite materials and systems possess an unprecedented combination of properties and are, therefore, poised to enable a broad range of practical applications. The adaptive composite material incorporates at least one size-variable active area having a variable transmittance, reflectance, and/or absorptance in at least a portion of the electromagnetic spectrum and comprises at least: an elastomer substrate, a texturizing layer disposed on top of the substrate, and an optional reflective coating disposed on top of the texturizing layer. In operation, the stretching and relaxation of the elastomer
(Continued)

substrate causes changes in the surface morphology of the texturized layers (e.g., the change in the size and depth of surface features in the texturizing layer), this in turn results in the increased or decreased transmittivity, reflectivity, and/or absorptivity of the active area.

13 Claims, 34 Drawing Sheets

(51) Int. Cl.
    *G02B 5/08*     (2006.01)
    *G02B 26/02*     (2006.01)
    *G02B 26/08*     (2006.01)

(58) Field of Classification Search
    CPC .......................... G02B 5/0841; G02B 26/001; G02B 26/0825; G02B 5/18; G02B 5/1861; G02B 5/201; G02B 5/32; G02B 27/281; G02B 5/204; G02B 5/223; G02B 5/3058; E06B 9/24; E06B 2009/2417; E06B 2009/2464; E06B 7/00; E06B 2009/247; G02F 1/157; G02F 1/0102; G02F 2203/05; G02F 2203/48; G02F 1/153; G02F 1/163; G02F 1/0126; G02F 1/155; G02F 1/17; G02F 1/03; G02F 1/1506; G02F 1/1516; G02F 2001/15145; G02F 2001/1552; G02F 2001/1557; G02F 2201/124; G02F 1/0018; G02F 1/0063; G02F 1/13439; G02F 1/136204; G02F 1/15; G02F 1/15165; G02F 1/1533; G02F 1/161; G02F 2201/086; G02F 2201/48; G02F 2203/02; G02F 1/133305; G02F 1/133502; G02F 2001/1536; B32B 17/10761; B32B 17/10486; B32B 17/10513; B32B 17/10633; B32B 2307/402; B32B 2307/42; B32B 2315/08; B32B 2419/00; B32B 2551/00; B32B 2605/006; B32B 2605/08; B32B 37/12; B32B 17/00; B32B 33/00; B32B 5/02; B32B 5/04; B32B 7/04; B32B 7/10; B32B 17/10036; B32B 17/10174; B32B 17/10201; B32B 17/10495; B32B 17/1077; B32B 17/10788
See application file for complete search history.

(56) References Cited

U.S. PATENT DOCUMENTS

| | | | |
|---|---|---|---|
| 5,840,803 | A | 11/1998 | Chang et al. |
| 5,866,204 | A | 2/1999 | Robbie et al. |
| 6,004,494 | A | 12/1999 | Debe |
| 6,284,425 | B1 | 9/2001 | Hoffend et al. |
| 6,801,430 | B1 | 10/2004 | Pokharna et al. |
| 8,921,789 | B2 | 12/2014 | Pryce et al. |
| 10,018,831 | B2 | 7/2018 | Corbelli et al. |
| 10,035,175 | B2 | 7/2018 | Gorodetsky et al. |
| 10,954,367 | B2 | 3/2021 | Zhou et al. |
| 11,565,970 | B1 | 1/2023 | Shiao |
| 11,566,115 | B2 | 1/2023 | Deravi et al. |
| 11,650,098 | B2 | 5/2023 | Cong et al. |
| 2005/0249917 | A1 | 11/2005 | Trentacosta et al. |
| 2006/0197953 | A1 | 9/2006 | Perez et al. |
| 2009/0324976 | A1 | 12/2009 | Abu-Salih et al. |
| 2010/0264353 | A1 | 10/2010 | Hartmann et al. |
| 2011/0164308 | A1 | 7/2011 | Arsenault et al. |
| 2011/0214221 | A1 | 9/2011 | Munda |
| 2012/0135448 | A1 | 5/2012 | Parker et al. |
| 2013/0222881 | A1 | 8/2013 | Aizenberg et al. |
| 2015/0329604 | A1 | 11/2015 | Parker et al. |
| 2015/0346398 | A1* | 12/2015 | Gorodetsky ............ G02B 5/26 359/359 |
| 2016/0374411 | A1 | 12/2016 | Brooks et al. |
| 2017/0239930 | A1 | 8/2017 | Chandrasekaran et al. |

FOREIGN PATENT DOCUMENTS

| | | |
|---|---|---|
| JP | 2013003014 A | 1/2013 |
| JP | 2013524009 A | 6/2013 |
| JP | 2013540277 A | 10/2013 |
| JP | 2016102906 A | 6/2016 |
| JP | 2018027293 A | 2/2018 |
| JP | 2019521699 A | 8/2019 |
| WO | 2018016524 A1 | 1/2018 |
| WO | 2018031847 A1 | 2/2018 |
| WO | 2019178553 A1 | 9/2019 |
| WO | 2020113118 | 6/2020 |
| WO | 2023168460 A3 | 11/2023 |

OTHER PUBLICATIONS

Kikuchi et al., "Distributed cogeneration of power and heat within an energy management strategy for mitigating fossil fuel consumption", Journal of Industrial Ecology, Dec. 16, 2015, vol. 20, No. 2, pp. 289-303, doi: 10.1111/jiec.12374.

Kim et al., "Patternable PEDOT nanofilms with grid electrodes for transparent electrochromic devices targeting thermal camouflage", Nano Convergence, 2015, vol. 2, No. 19, 7 pgs., published online Oct. 1, 2015, DOI 10.1186/s40580-015-0051-9.

Kirkwood et al., "Mechanics of the cephalopod chromatophore layer: Structural characterization of cephalopod chromatophores", Proceedings of the ASME 2011 Summer Bioengineering Conference, Jun. 22-25, 2011, Farmington, Pennsylvania, USA, 2 pgs.

Kolle et al., "Progress and Opportunities in Soft Photonics and Biologically Inspired Optics", Advanced Materials, Jan. 11, 2018, First Published Oct. 23, 2017, vol. 30, No. 2, 1702669, 40 pgs., doi: 10.1002/adma.201702669.

Kramer et al., "The self-organizing properties of squid reflectin protein", Nature Materials, Jul. 2007, vol. 6, No. 7, pp. 533-538, published online Jun. 3, 2007, doi: 10.1038/nmat1930.

Kreit et al., "Biological versus electronic adaptive coloration: how can one inform the other?", Journal of the Royal Society Interface, 2013, 20120601, pp. 1-13, http://dx.doi.org10.1098/rsif.2012.0601.

Larson et al., "Highly stretchable electroluminescent skin for optical signaling and tactile sensing", Science, Mar. 4, 2016, vol. 351, Issue 6277, pp. 1071-1074.

Lee et al., "Proton Conduction in a Tyrosine-Rich Peptide/Manganese Oxide Hybrid Nanofilm", Advanced Functional Materials, Sep. 20, 2017, vol. 27, No. 35, 1702185, 9 pgs., doi: 10.1002/adfm.201702185.

Leung et al., "A dynamic thermoregulatory material inspired by squid skin", Nature Communications, 2019, vol. 10, No. 1947, pp. 1-10, https://doi.org/10.1038/s41467-019-09589-w.

Levenson et al., "Cyclable Condensation and Hierarchical Assembly of Metastable Reflectin Proteins, the Drivers of Tunable Biophotonics", Journal of Biological Chemistry, Feb. 19, 2016, vol. 291, No. 8, pp. 4058-4068, doi: 10.1074/jbc.M115.686014.

Li et al., "Colloquium: Phononics: Manipulating heat flow with electronic analogs and beyond", Review of Modern Physics, Jul.-Sep. 2012, vol. 84, pp. 1045-1066, DOI: 10.1103/RevModPhys.84.1045.

Liu et al., "Thermochromic properties of W-doped VO2 thin films deposited by aqueous sol-gel method for adaptive infrared stealth application", Infrared Physics & Technology, Jun. 17, 2016, vol. 77, pp. 339-343.

Mao et al., "Infrared stealth property based on semiconductor (M)-to-metallic (R) phase transition characteristics of W-doped VO2 thin films coated on cotton fabrics", Thin Solid Films, Feb. 20, 2014, vol. 558, pp. 208-214.

Mark et al., "Polymer Data Handbook", Oxford University Press, ed. 2, 2009, 1102 pgs. (presented in two parts).

(56) References Cited

OTHER PUBLICATIONS

Mathger et al., "Bright White Scattering from Protein Spheres in Color Changing, Flexible Cuttlefish Skin", Advanced Functional Materials, Aug. 26, 2013, vol. 23, No. 32, pp. 3980-3989, doi: 10.1002/adfm.201203705.
Mathger et al., "Malleable skin coloration in cephalopods: selective reflectance, transmission and absorbance of light by chromatophores and iridophores", Cell Tissue Res, Apr. 5, 2007, vol. 329, pp. 179-186.
Mathger et al., "Mechanisms and behavioural functions of structural coloration in cephalopods", J. R. Soc. Interfac, 2009, vol. 6, pp. S149-S163, published online Dec. 15, 2008, doi:10.1098/rsif.2008.0366.focus.
McCoul et al., "Recent Advances in Stretchable and Transparent Electronic Materials", Advanced Electronic Materials, Mar. 16, 2016, vol. 2, 1500407, 51 pgs.
McCFall-Ngai et al., "Divining the Essence of Symbiosis: Insights from the Squid-Vibrio Model", PLoS Biology, Feb. 4, 2014, vol. 12, No. 2, e1001783, doi: 10.1371/journal.pbio.1001783.
Messenger, "Cephalopod chromatophores: neurobiology and natural history", Biol. Rev., 2001, vol. 76, pp. 473-528, DOI: 10.1017/S1464793101005772.
Meyer, "Elements of Space Technology", Elsevier, 1999, 346 pgs.
Moore et al., "Emerging challenges and materials for thermal management of electronics", Materials Today, May 2014, vol. 17, No. 4, pp. 163-174, doi: 10.1016/j.mattod.2014.04.003.
Morin et al., "Camouflage and Display for Soft Machines", Science, Aug. 17, 2012, vol. 337, pp. 828-832.
Munteanu et al., "Spectral and thermal characterization of styrene-butadiene copolymers with different architectures", Journal of Optoelectronics and Advanced Materials, Dec. 2005, vol. 7, No. 6, pp. 3135-3148.
NASA, "Reflecting on Space Benefits: A Shining Example", NASA Spinoff, 2006, pp. 56-61.
Naughton et al., "Self-Assembly of the Cephalopod Protein Reflectin", Advanced Materials, Oct. 12, 2016, vol. 28, No. 38, pp. 8405-8412, doi: 10.1002/adma.201601666.
Nieuwenhuizen et al., "Microfractography of Thin Films", Philips Tech. Rev. 1966, vol. 27, No. 3-4, pp. 87-91.
O'Dor et al., "Nutrient absorption, storage and remobilization in octopus vulgaris", Marine & Freshwater Behaviour & Physiol., 1984, vol. 11, pp. 239-258, published online Jan. 22, 2009.
Ordinario et al., "Bulk protonic conductivity in a cephalopod structural protein", Nature Chemistry, Jul. 2014, vol. 6, pp. 596-602, published online Jun. 1, 2014, doi: 10.1038/nchem.1960.
Ordinario et al., "Photochemical Doping of Protonic Transistors from a Cephalopod Protein", Chemistry of Materials, May 23, 2016, vol. 28, pp. 3703-3710, doi: 10.1021/acs.chemmater.6b00336.
Ordinario et al., "Production and electrical characterization of the reflectin A2 isoform from Doryteuthis (Loligo) pealeii", RSC Advances, 2016, vol. 6, pp. 57103-57107, doi: 10.1039/c6ra05405f.
Ordinario et al., "Protochromic Devices from a Cephalopod Structural Protein", Advanced Optical Materials, Oct. 16, 2017, vol. 5, No. 20, 1600751, pp. 1-6, doi: 10.1002/adom.201600751.
Ordinario et al., "Protonic transistors from thin reflectin films", Apl. Materials, 2015, vol. 3, Issue 1, pp. 014907-1-014907-6, published online Nov. 18, 2014, doi: 10.1063/1.4901296.
Phan et al., "Dynamic Materials Inspired by Cephalopods", Chemistry of Materials, Sep. 21, 2016, vol. 28, pp. 6804-6816, doi: 10.1021/acs.chemmater.6b01532.
Phan et al., "Infrared invisibility stickers inspired by cephalopods", Journal of Materials Chemistry C, 2015, vol. 3, Issue 25, pp. 6493-6498, first published Feb. 19, 2015, doi: 10.1039/c5tc00125k.
Phan et al., "Reconfigurable infrared camouflage coatings from a cephalopod protein", Advanced Materials, Jul. 30, 2013, vol. 25, pp. 5621-5625, doi: 10.1002/adma201301472.
Phan et al., "Reflectin as a Material for Neural Stem Cell Growth", Applied Materials and Interfaces, Dec. 24, 2015, vol. 8, pp. 278-284, DOI: 10.1021/acsami.5b08717.

Qin et al., "Bioinspired structural color sensors based on responsive soft materials", Current Opinion in Solid State Materials Science, Oct. 2018, 16 pgs., doi:10.1016/jcossms.2018.10.001.
Rahmani et al., "Reversible Thermal Tuning of All-Dielectric Metasurfaces", Advanced Functional Materials, Aug. 18, 2017, vol. 27, No. 31, 7 pgs., first published Jul. 3, 2017, doi: 10.1002/adfm.201700580.
Ramirez et al., "Eye-independent, light-activated chromatophore expansion (LACE) and expression of phototransduction genes in the skin of Octopus bimaculoides", The Journal of Experimental Biology, 2015, vol. 218, pp. 1513-1520.
Robbie et al., "First Thin Film Realization of a Helicoidal Bianisotropic Medium", Journal of Vacuum Science and Technology A, Nov./Dec. 1995, vol. 13, No. 6, pp. 2991-2993, http://dx.doi.org/10.1116/1.579626.
Rosset et al., "Flexible and stretchable electrodes for dielectric elastomer actuators", Applied Physics A., 2013, vol. 110, pp. 281-307, published online Nov. 7, 2012.
Rossiter et al., "Biomimetic chromatophores for camouflage and soft active surfaces", Bioinspiration & Biomimetics, May 1, 2012, vol. 7, 36009, pp. 1-10, doi:10.1088/1748-3182/7/3/036009.
International Preliminary Report on Patentability for International Application PCT/US2019/022600, Report issued Sep. 15, 2020, dated Sep. 24, 2020, 12 pgs.
International Search Report and Written Opinion for International Application No. PCT/US2019/022600, Search completed May 3, 2019, dated May 23, 2019, 18 pgs.
International Search Report and Written Opinion for International Application PCT/US2019/063772, Report Completed on Feb. 28, 2020, dated Mar. 12, 2020, 12 pgs.
U.S. Department of Energy, Energy-Efficient Windows, https://energy.gov/energysaver/energy-efficient-windows, 8 pgs.
"Delta Kickoff Meeting", arpa-e, May 21-22, 2015, Retrieved from the internet http://arpa-e.energy.gov/?q=site-page/delta-kickoff-meeting, 2 pgs.
"Energy Efficient, Year-round Comfort in Any Climate", Mitsubishi Electric, Sep. 29, 2016, Retrieved from the internet http://www.mitsubishicomfort.com/sites/default/files/manual/fh-series_highrise_brochure.pdf?fid=1156, 4 pgs.
"Energy Technology Perspectives 2017", International Energy Agency, doi: 10.1787/energy_tech-2017-en, ISBN: 9789264275973, 443 pgs. (presented in two parts).
"Giant Australian cuttlefish (Sepia apama)", Wildscreen Arkive, 2018, Retrieved from the Internet https://www.arkive.org/giant-australian-cuttlefish/sepia-apama/image-G68546.html on Nov. 6, 2018, 4 pgs.
"Office of the Assistant Secretary of Defense for Energy, Installations, and Environment", Department of Defense Annual Energy Management and Resilience (AEMR) Report Fiscal Year 2016, Jul. 2017, https://www.acq.osd.mil/eie/Downloads/IE/FY%202016%20AEMR.pdf, 94 pgs.
"Standard Test Method for Tensile Properties of Thin Plastic Sheeting", ASTM Standard D882, ASTM International, 2012, pp. 1-12.
"Structural coloration", Wikipedia, Wikimedia Foundation, Nov. 23, 2018, Retrieved from https://en.wikipedia.org/wiki/Structural_coloration, 11 pgs.
"Thermocomfort Cloth", arpa-e, Dec. 16, 2014, Retrieved from the internet https://arpa-e.energy.gov/?q=slick-sheet-project/thermocomfort-cloth, 1 pg.
Ahlers, "Aircraft Thermal Management", Encyclopedia of Aerospace Engineering, John Wiley & Sons, 2011, pp. 1-13, doi: 10.1002/9780470686652.
Akbari et al., "Microfabrication and characterization of an array of dielectric elastomer actuators generating uniaxial strain to stretch individual cells", Journal of Micromechanics and Microengineering, Mar. 19, 2012, vol. 22, pp. 1-12, doi:10.1088/0960-1317/22/4/045020.
Albertin et al., "Advances in Marine Biology", Elsevier, vol. 67, 2014, 479 pgs. (presented in two parts).
Allen et al., "Degradation and stabilisation of styrene ethylene-butadiene-styrene (SEBS) block copolymer", Polymer Degradation and Stability, 2000, vol. 71, pp. 113-122, doi: 10.1016/S0141-3910(00)00162-2.

(56) References Cited

OTHER PUBLICATIONS

ARPA, "Delta Program Overview", U.S. Department of Energy Advanced Research Projects Agency, 2014, 16 pgs.
ASTM International, "Standard Test Method for Thermal and Evaporative Resistance of Clothing Materials Using a Sweating Hot Plate", ASTM Standard F1868, ASTM International, 2017, pp. 1-9.
Bao et al, "Flexible and Stretchable Devices", Advanced Materials, Jun. 8, 2016, vol. 28, No. 22, pp. 4177-4179, doi: 10.1002/adma.201601422.
Barranco et al., "Perspectives on oblique angle deposition of thin films: from fundamentals to devices", Progress in Materials Science, Mar. 2016, vol. 76, pp. 59-153, available online Aug. 28, 2015, doi: 10.1016/j.pmatsci.2015.06.003.
Bell et al., "Chromatophore radial muscle fibers anchor in flexible squid skin", Invertebrate Biology, Jun. 2013, vol. 132, No. 2, pp. 120-132, doi: 10.1111/ivb.12016.
Benslimane et al., "Dielectric Elastomers as Electromechanical Transducers", Jan. 22, 2008, Elsevier Science, 334 pgs. (presented in two parts).
Biggs et al., "Electroactive Polymers: Developments of and Perspectives for Dielectric Elastomers", Angew. Chemie Int. Ed., Jul. 22, 2013, vol. 52, pp. 9409-9421.
Boen, "A Shining Example of Space Benefits", NASA, Nov. 30, 2007, Retrieved from https://www.nasa.gov/vision/earth/technologies/silver_insulation.html, 2 pgs.
Cai et al., "Warming up human body by nanoporous metallized polyethylene textile", Nature Communications, Sep. 19, 2017, vol. 8, No. 496, pp. 1-8, doi: 10.1038/341467-017-00614-4.
Carpi, "Electromechanically Active Polymers", Springer, 2016, 795 pgs. (presented in four parts).
Casini, "Active dynamic windows for buildings: A review", Renewable Energy, Apr. 2018, vol. 119, pp. 923-934, doi: 10.1016/j.renene.2017.12.049.
Chandrasekhar et al., "Conducting Polymer (CP) infrared electrochromics in spacecraft thermal control and military applications", Synthetic Metals, 2003, vol. 135-136, pp. 23-24, DOI: 10.1016/80379-6779(02)00682-3.
Chandrasekhar et al., "Large, Switchable Electrochromism in the Visible Through Far-Infrared in Conducting Polymer Devices", Advanced Functional Materials, Feb. 2002, vol. 12, pp. 95-103, DOI: 10.1002/1616-3028(20020201)12:2<95::AID-ADFM95>3.0.CO;2-N.
Chen et al., "Electronic Muscles and Skins: A Review of Soft Sensors and Actuators", Chemical Reviews, Aug. 17, 2017, vol. 117, No. 17, pp. 11239-11268, doi: 10.1021/acs.chemrev.7b00019.
Choi et al., "Structure-property relationship in sulfonated pentablock copolymers", Journal of Membrane Science, Mar. 15, 2012, vol. 394-395, pp. 169-174, doi:10.1016/j.memsci.201.120.36.
Cloney et al., "Chromatophore Organs, Reflector Cells, Iridocytes and Leucophores in Cephalopods", American Zoologist, 1983, vol. 23, No. 3, pp. 581-592.
Coppens et al., "Spatial and Temporal Modulation of Thermal Emission", Advanced Materials, Aug. 21, 2017, vol. 29, 1701275, 6 pgs., doi: 10.1002/ADMA.201701275.
Crookes et al., "Reflectins: the unusual proteins of squid reflective tissues", Science, Jan. 9, 2004, vol. 303, pp. 235-238.
Rossiter et al., "Colour gamuts in polychromatic dielectric elastomer artificial chromatophores", Proc. SPIE., 2014, vol. 9056, pp. 905620-1-905620-8.
Sacadura, "Radiative heat transfer in fire safety science", Journal of Quantitative Spectroscopy & Radiative Transfer, 2005, vol. 93, pp. 5-24, doi: 1016/j.jqsrt.2004.0/.0111.
Sanborn, "Corps tests new camo the enemy won't be able to spot", Marine Corps Times, Apr. 12, 2015, Retrieved from the internet https://www.marinecorpstimes.com/news/your-marine-corps/2015/04/12/corps-tests-new-camo-the-enemy-won-t-be-able-to-spot/, 7 pgs.
Schittny et al., "Experiments on Transformation Thermodynamics: Molding the Flow of Heat", Physical Review Letters, May 10, 2013, vol. 110, pp. 195901-1-195901-5.
Schwalm et al., "Infrared reflectance in leaf-sitting neotropical frogs", Science, Jun. 10, 1977, vol. 196, No. 4295, pp. 1225-1226.
Schwartzman et al., "The chemistry of negotiation: rhythmic, glycan-driven acidification in a symbiotic conversation", Proc Natl Acad Sci USA, Jan. 13, 2015, vol. 112, No. 2, pp. 566-571, doi: 10.1073/pnas.1418580112.
Shaddock et al., "Development of a Compliant Nanothermal Interface Material", Proceedings of the ASME 2011 Pacific Rim Technical Conference & Exposition on Packaging and Integration of Electronic and Photonic Systems, Inter Pack 2011, Jul. 6-8, 2011, IPACK2011-52015, pp. 1-5.
Singh et al., "Performance Comparison of Thermal Insulated Packaging Boxes, Bags and Refrigerants for Single-Parcel Shipments", Packaging Technology Science, 2008, vol. 21, pp. 25-35, published online Mar. 13, 2007, DOI: 10.1002/pts.773.
Skrabec, "Aluminum in America: A History", McFarland & Company, Inc., 2017, 16 pgs.
Stevens et al., "Temperature sensitivity of the body surface over the life span", Somatosensory & Motor Research, 1998, vol. 15, No. 1, pp. 13-28, published online Jul. 10, 2009, DOI: 10.1080/08990229870925.
Stoppa et al., "Wearable Electronics and Smart Textiles: A Critical Review", Sensors, Jul. 7, 2014, vol. 14, No.7, pp. 11957-11992, doi: 10.3390/s140711957.
Suzuki et al., "Chromatophore activity during natural pattern expression by the squid *Sepioteuthis lessoniana*: contributions of miniature oscillation", PLoS One, Apr. 1, 2011, vol. 6, No. 4, e18244, pp. 1-8, doi: 10.1371/journal.pone.0018244.
Tao et al., "The role of protein assembly in dynamically tunable bio-optical tissues", Biomaterials, Feb. 2010, vol. 31, No. 5, pp. 793-801, available online Nov. 10, 2009, doi: 10.1016/j.biomaterials.2009.10.038.
Taschuk et al., "Glancing Angle Deposition", In Handbook of Deposition Technologies for Films and Coatings: Science, Applications and Technology; Martin, P., Ed.; William Andrew (Elsevier): Oxford, United Kingdom, 2010; pp. 621-678.
Tian et al., "A comprehensive study of electrochromic device with variable infrared emissivity based on polyaniline conducting polymer", Solar Energy Materials and Solar Cells, May 21, 2017, vol. 170, pp. 120-126.
Tiwari et al., "Concise Encyclopedia of High Performance Silicones", John Wiley & Sons, Inc.: Hoboken, NJ, USA, 2014, 406 pgs., (presented in five parts).
Tong et al., "Advanced Materials for Thermal Management of Electronic Packaging", Springer, New York, 2011, 633 pgs., (presented in two parts).
Tong et al., "Infrared-transparent visible-opaque fabrics for wearable personal thermal management", ACS Photonics, May 29, 2015, vol. 2, pp. 769-778, doi: 10.1021/acsphotonics.5b00140.
Tsui et al., "Polymer Thin Films", 1st ed., Series in Soft Condensed Matter; World Scientific Publishing Co. Pte. Ltd .: Singapore, 2008; vol. 1, 312 pgs., (presented in three parts).
Urge-Vorsatz et al., "Heating and cooling energy trends and drivers in buildings", Renewable and Sustainable Energy Reviews, Jan. 2015, vol. 41, pp. 85-98, available online Sep. 6, 2014, doi: 10.1016/j.rser.2014.08.039.
Vignolini et al., "Pointillist structural color in Pollia fruit", Proceedings of the National Academy of Sciences of USA, Sep. 25, 2012, vol. 109, No. 39, pp. 15712-15715, doi: 10.1073/pnas.1210105109.
Wake et al., "Formulating Infrared Coatings for Defence Applications", U.S. Defense Technical Information Center, 1993, 37 pgs.
Wang et al., "A state of art review on methodologies for heat transfer and energy flow characteristics of the active building envelopes", Renewable and Sustainable Energy Reviews, Oct. 2017, vol. 78, pp. 1102-1116, available online May 15, 2017doi: 10.1016/j.rser.2017.05.015.
Wang et al., "Cephalopod-inspired design of electro-mechano-chemically responsive elastomers for on-demand fluorescent patterning", Nature Communications, Sep. 16, 2014, vol. 5, No. 4899, pp. 1-9, DOI: 10.1038/ncomms5899.
Wang et al., "Switchable Materials for Smart Windows", Annual Review of Chemical and Biomolecular Engineering, Jun. 2016, vol.

(56) References Cited

OTHER PUBLICATIONS 7, pp. 283-304, Published Online Mar. 23, 2016, doi: 10.1146/annurev-chembioeng-080615-034647.

Wardill et al., "Neural control of tuneable skin iridescence in squid", Proceedings of the Royal Society B, Jul. 25, 2012, vol. 279, pp. 4243-4252.

Watkins et al., "Functional Clothing Design: From Sportswear to Spacesuits", Fairchild Books, New York, 2015, 9 pgs.

Wehmeyer et al., "Thermal diodes, regulators, and switches: physical mechanisms and potential applications", Applied Physics Reviews, Nov. 21, 2017, vol. 4, pp. 041304-1-041304-32, doi: 10.1063/1.5001072.

Wier et al., "Transcriptional patterns in both host and bacterium underlie a daily rhythm of anatomical and metabolic change in a beneficial symbiosis", Proc Natl Acad Sci USA, Feb. 2, 2010, vol. 107, No. 5, pp. 2259-2264, doi: 10.1073/pnas.0909712107.

Winterhalter, "Military Update", US Army Natick Soldier Research, Development and Engineering Center, Jun. 2015, Retrieved from the internet https://www.ifai.com/wp-content/uploads/2015/06/Winterhalter-Carole_Outlook-2015.pdf, 72 pgs.

Wood et al., "Do larger cephalopods live longer? Effects of temperature and phylogeny on interspecific comparisons of age and size at maturity", Marine Biology, 2000, vol. 136, pp. 91-99.

Xiao et al., "Fast Adaptive Thermal Camouflage Based on Flexible VO2/Graphene/CNT Thin Films", Nano Letters, Nov. 24, 2015, vol. 15, pp. 8365-8370.

Xu et al., "Adaptive infrared-reflecting systems inspired by cephalopods", Science, Mar. 30, 2018, vol. 359, No. 6383, pp. 1495-1500, doi: 10.1126/science.aar5191.

Xu et al., "Stretchable Cephalopod-Inspired Multimodal Camouflage Systems", Advanced Materials, Mar. 4, 2020, vol. 32, 1905717, doi: 10.1002/adma.201905717, 39 pgs.

Yu et al., "Adaptive optoelectronic camouflage systems with designs inspired by cephalopod skins", PNAS, Sep. 9, 2014, vol. 111, No. 36, pp. 12998-13003, www.pnas.org/cgi/doi/10/1073/pnas.1410494111.

Zhao et al., "Recent developments of truly stretchable thin film electronic and optoelectronic devices", Nanoscale, Feb. 19, 2018, vol. 10, No. 13, pp. 5764-5792, DOI: 10.1039/c7nr09472h.

Decher et al., "Multilayer Thin Films", Wiley-VCH Verlag GmbH & Co. KGaA: Weinheim, Germany, 2012, 1100 pgs. (presented in twelve parts).

Demartini et al., "Membrane invaginations facilitate reversible water flux driving tunable iridescence in a dynamic biophotonic system", PNAS, Feb. 12, 2013, vol. 110, No. 7, pp. 2552-2556, https://doi.org/10.1073/pnas.1217260110.

Demartini et al., "Structures, Organization, and Function of Reflectin Proteins in Dynamically Tunable Reflective Cells", Journal of Biological Chemistry, Jun. 12, 2015, vol. 290, No. 24, pp. 15238-15249, first published Apr. 26, 2015, DOI: 10.1074/JBC.m115.638254.

Deravi et al., "The structure-function relationships of a natural nanoscale photonic device in cuttlefish chromatophores", Journal of the Royal Society Interface, Jan. 7, 2014, vol. 11, 20130942, 9 pgs., http://dx.doi.org/10.1098/rsif.2013.0942.

Dipirro et al., "Heat switches for ADRs", Cryogenics, Jul.-Aug. 2014, vol. 62, pp. 172-176, available online Apr. 5, 2014, doi: 10.1016/j.cryogenics.2014.03.017.

Drobny, "Handbook of Thermoplastic Elastomers", Elsevier Oxford, ed. 2, 2014, 425 pgs. (presented in two parts).

Fan et al., "Structure, physical properties, and molecule transport of gas, liquid, and ions within a pentablock copolymer", Journal of Membrane Science, 2014, vol. 464, pp. 179-187, available online Apr. 14, 2014.

Geetha et al., "EMI shielding: Methods and materials—A review", Journal of Applied Polymer Science, Feb. 13, 2009, vol. 112, pp. 2073-2086, DOI: 10.1002/app.29812.

Gonzalez, "Watch what happens when you play Cypress Hill through a squid's fin", Aug. 23, 2012, Retrieved from the internet https://io9.gizmodo.com/5937406/watch-what-happens-when-you-play-cypress-hill-through-a-squids-fin, 3 pgs.

Gupta et al., "Review of passive heating/cooling systems of buildings", Energy Science & Engineering, Oct. 6, 2016, vol. 4, No. 5, pp. 305-333, doi: 10.1002/ese3.129.

Hammock et al., "25th Anniversary Article: The Evolution of Electronic Skin (E-Skin): A Brief History, Design Considerations, and Recent Progress", Advanced Materials, Nov. 13, 2013, vol. 25, No. 42, pp. 5997-6038, DOI: 10.1002/adma.201302240.

Han et al., "Full Control and Manipulation of Heat Signatures: Cloaking, Camouflage and Thermal Metamaterials", Advanced Materials, Feb. 5, 2014, vol. 26, pp. 1731-1734.

Hanlon, "Cephalopod dynamic camouflage", Current Biology, 2007, vol. 17, No. 11, pp. R400-R404.

Hanssen et al., "Infrared Optical Properties of Materials", NIST Special Publication 250-94, Feb. 2015, 171 pgs., http://dx.doi.org/10.6028NIST.SP.250-94.

Hawkeye et al., "Glancing Angle Deposition of Thin Films", John Wiley & Sons, Ltd: Chichester, UK, 2014, 307 pgs. (presented in two parts).

Hawkeye et al., "Glancing Angle Deposition: Fabrication, Properties, and Applications of Micro- and Nanostructured Thin Films", Journal of Vacuum Science & Technology A, Sep./Oct. 2007, vol. 25, No. 5, pp. 1317-1335, first published Jul. 30, 2007, https://doi.org/10.1116/1.2764082.

Haynes, "Digital Infrared Capture & Workflow", Dec. 21, 2008, Retrieved from the internet http://www.crhfoto.co.uk/crh/digital%20infra-red/digital-ir.htm, 5 pgs.

Hernandez-Perez et al., "Thermal performance of reflective materials applied to exterior building components—A review", Energy and Buildings, Sep. 2014, vol. 80, pp. 81-105, available online May 15, 2014, doi: 10.1016/j.enbuild.2014.05.008.

Hsu et al., "Radiative human body cooling by nanoporous polyethylene textile", Science, Sep. 2, 2016, vol. 353, Issue 6303, pp. 1019-1023, doi: 10.1126/science.aaf5471.

Iglesias, "Cephalopod culture", Springer, 2014, 493 pgs., http://wwwspringer.com/us/book/9789401786478, (presented in four parts).

Ji et al., "Infrared thermochromic properties of monoclinic VO2 nanopowders using a malic acid-assisted hydrothermal method for adaptive camouflage", RSC Advances, Jan. 4, 2017, vol. 7, pp. 5189-5194.

John et al., "Peri-operative warming devices: performance and clinical application", Anaesthesia, Jun. 2014, vol. 69, pp. 623-638, doi: 10.1111/anae.12626.

Jones, "Sci-fi and Jurassic Park have driven research, scientists say", The Conversation, Jun. 10, 2015, Retrieved from the internet https://theconversation.com/sci-fi-and-jurassic-park-have-driven-research-scientists-say-42864.

Kakaç et al., "Microscale Heat Transfer—Fundamentals and Applications", NATO Science Series, II Mathematics, Physics and Chemistry, vol. 103, Springer, 2005, 517 pgs. (presented in three parts).

Kanai et al., "Film Processing", Hanser Publications: Munich, 2011, 474 pgs. (presented in two parts).

Kats et al., "Vanadium Dioxide as a Natural Disordered Metamaterial: Perfect Thermal Emission and Large Broadband Negative Differential Thermal Emittance", Physical Review X., Oct. 21, 2013, vol. 3, 41004, 7 pgs.

International Search Report and Written Opinion for International Application No. PCT/US2023/063803, Search completed Sep. 2, 2023, Mailed Oct. 6, 2023, 14 Pgs.

Pozzobon et al., "Household aluminum foil matte and bright side reflectivity measurements: Application to a photobioreactor light concentrator design", NIH. Publication [online]. Mar. 2020; [Retrieved on Sep. 2, 2023] Retrieved from the Internet: <URL: https://www.ncbi.nlm.nih.gov/pmc/articles/PMC6906702>; DOI:10.1016/j.btre.2019.e00399.

* cited by examiner

ADAPTIVE MATERIALS AND SYSTEMS FOR MANIPULATION OF ELECTROMAGNETIC RADIATION

REFERENCE TO RELATED APPLICATIONS

The current application is a national stage application of PCT Application No. PCT/US2019/022822, filed Mar. 15, 2019, which application claims priority to U.S. Provisional Patent Application No. 62/643,403, filed Mar. 15, 2018, the disclosures of which is incorporated herein by reference in their entireties.

STATEMENT REGARDING FEDERALLY SPONSORED RESEARCH

This invention was made with Government support under contract numbers W911NF-16-2-0077 and D16AP00034 to the Defense Advanced Research Projects Agency, contract number DEAR0000534 to the Advanced Research Projects Agency—Energy, and contract number FA2386-14-1-3026 to the Air Force Office of Scientific Research. The government has certain rights in the invention.

FIELD OF THE INVENTION

The current disclosure is directed to materials and systems capable of adaptively transmitting and/or reflecting, electromagnetic radiation and methods of manufacture and use thereof.

BACKGROUND OF THE INVENTION

Materials and systems that reflect radiation in the short- to long-wavelength infrared (IR) region of the electromagnetic spectrum have been studied for decades and critically underpin the performance of many entrenched technologies, including building insulation (I. Hernández-Pérez et al., Thermal performance of reflective materials applied to exterior building components—A review. *Energy Build.* 80, 81-105 (2014), the disclosure of which is incorporated herein by reference), energy-conserving windows (U.S. Department of Energy, Energy-Efficient Windows, https://energy.gov/energysaver/energy-efficient-windows, the disclosure of which is incorporated herein by reference), spacecraft components (NASA, A Shining Example of Space Benefits (2007), https://www.nasa.gov/vision/earth/technologies/silver insulation.html, the disclosure of which is incorporated herein by reference), electronics shielding (S. Geetha, et al., EMI shielding: Methods and materials-A review. *J. Appl. Polym. Sci.* 112, 2073-2086 (2009), the disclosure of which is incorporated herein by reference), container packaging (S. P. Singh, et al., Performance comparison of thermal insulated packaging boxes, bags and refrigerants for single-parcel shipments (*Packag. Technol. Sci.* 21, 25-35 (2008), the disclosure of which is incorporated herein by reference), protective clothing (J. F. Sacadura, Radiative heat transfer in fire safety science. *J. Quant. Spectrosc. Radiat. Transf.* 93, 5-24 (2005), the disclosure of which is incorporated herein by reference), and camouflage platforms (L. V. Wake, R. F. Brady, Formulating Infrared Coatings for Defense Applications, 1993, U.S. Defense Technical Information Center, the disclosure of which is incorporated herein by reference). In addition, various soft, mechanically-deformable materials that change their appearance (e.g. coloration, opacity, or luminescence) via transmission and reflection of the visible light are also being explored for applications in smart windows (Y. Wang, et al., Switchable Materials for Smart Windows. Annu. Rev. Chem. Biomol. Eng. 7, 283-304 (2016); M. Casini, Active dynamic windows for buildings: A review. Renew. Energy. 119, 923-934 (2018), the disclosures of which is incorporated herein by reference), colorimetric sensors (M. Qin, et al., Bioinspired structural color sensors based on responsive soft materials. Curr. Opin. Solid State Mater. Sci., 0-1 (2018); M. Kolle, S. Lee, Progress and Opportunities in Soft Photonics and Biologically Inspired Optics. Adv. Mater. 30, 1702669 (2018), the disclosures of which is incorporated herein by reference), optoelectronic displays (Z. Bao, X. Chen, Flexible and Stretchable Devices. Adv. Mater. 28, 4177-4179 (2016); J. Zhao et al., Recent developments of truly stretchable thin film electronic and optoelectronic devices. Nanoscale. 10, 5764-5792 (2018), the disclosures of which is incorporated herein by reference), and artificial skin (D. Chen, Q. Pei, Electronic Muscles and Skins: A Review of Soft Sensors and Actuators. Chem. Rev. 117, 11239-11268 (2017); M. L. Hammock, A. Chortos, B. C. K. Tee, J. B. H. Tok, Z. Bao, 25th Anniversary Article: The Evolution of Electronic Skin (E-Skin): A Brief History, Design Considerations, and Recent Progress. Adv. Mater. 25, 5997-6038 (2013), the disclosures of which is incorporated herein by reference). Accordingly, given the recognized importance and value of such technologies, new, useful, and transformative strategies for controlling and manipulating electromagnetic radiation, especially in the infrared and visible regions of the electromagnetic spectrum, continue to excite interest and remain highly sought after.

SUMMARY OF THE INVENTION

Various embodiments are directed to a spectrally adaptive composite material including:
  at least one size-variable active area having a variable transmittance, reflectance, and/or absorptance in at least a portion of the electromagnetic spectrum comprising:
    an elastically deformable substrate transparent in at least the portion of the electromagnetic spectrum and having an unrelaxed state wherein the elastically deformable substrate is elastically deformed beyond a relaxed state, and
    a texturizing layer disposed on a first side of the elastically deformable substrate, wherein the texturizing layer is transparent in at least the portion of the electromagnetic spectrum;
  wherein at least when the elastically deformable substrate is in the relaxed state the texturizing layer forms a plurality of geometrically reconfigurable microstructures with at least one size scale in the 10 nm to 100 μm range in at least one size-variable active area;
  wherein the at least one size-variable active area has a smaller surface area and a larger thickness than when the elastically deformable substrate is in the unrelaxed state; and
  wherein the transmittance, reflectance, and/or absorptance of the at least one size-variable active area within at least the portion of the electromagnetic spectrum are altered by the elastic deformation of the elastically deformable substrate into and out of the relaxed state.

In various such embodiments, the surface area of the at least one size-variable active area is altered via mechanical actuation.

In still various such embodiments, the elastically deformable substrate comprises an elastomer.

In yet various such embodiments, the portion of the electromagnetic spectrum is selected from the group of: visible, near-infrared, short-wavelength infrared, medium-wavelength infrared, long-wavelength infrared, and far infrared.

In still yet various such embodiments,
the elastically deformable substrate is dielectric;
the texturizing layer is proton or ion-conducting and acts as a top electrode; and
wherein the at least one size-variable active area further comprises a second texturizing layer disposed on a second side of the elastically deformable substrate, wherein the second texturizing layer acts as a bottom proton or ion-conducting electrode such that the composite material is electrically active.

In still yet various such embodiments, the variable transmittance, reflectance, and/or absorptance are altered via electrical actuation. In some such embodiments, the elastically deformable substrate comprises acrylate elastomer. In some such embodiments, the first and the second texturizing layers comprise a sulfonated pentablock co-polymer. In some such embodiments, the variable transmittance, reflectance, and/or absorptance are altered autonomously.

In still yet various such embodiments, the composite material comprises more than one size-variable active area. In some such embodiments, the variable transmittance, reflectance, and/or absorptance of each size-variable active area are altered via electrical actuation.

In still yet various such embodiments, each size-variable active area is independently addressable. In some such embodiments, the elastically deformable dielectric substrate comprises an acrylate elastomer. In some such embodiments, the first and the second texturizing layers comprise a sulfonated pentablock co-polymer. In some such embodiments, the portion of the electromagnetic spectrum is selected from the group consisting of: visible, near-infrared, short-wavelength infrared, medium-wavelength infrared, long-wavelength infrared, and far infrared. In some such embodiments, the variable transmittance, reflectance, and/or absorptance of each size-variable active area is altered autonomously without input from an external operator.

Many embodiments are directed to a composite adaptive reflective material including:
at least one size-variable active area having a variable reflectance in at least a portion of the electromagnetic spectrum comprising:
an elastically deformable substrate transparent in at least the portion of the electromagnetic spectrum and having an unrelaxed state wherein the elastically deformable substrate is elastically deformed beyond a relaxed state,
a texturizing layer disposed on a first side of the elastically deformable substrate, wherein the texturizing layer is transparent in at least the portion of the electromagnetic spectrum, and
a reflective coating disposed on an outer surface of the texturizing layer disposed on a first side of the elastically deformable substrate, wherein the reflective coating is reflective in at least the portion of the electromagnetic spectrum;
wherein at least when the elastically deformable substrate is in the relaxed state the texturizing layer forms a plurality of geometrically reconfigurable microstructures with at least one size scale in the 10 nm to 100 μm range in at least one size-variable active area;

wherein the at least one size-variable active area has a smaller surface area and a larger thickness than when the elastically deformable substrate is in the unrelaxed state; and
wherein the reflectance of the at least one size-variable active area within at least the portion of the electromagnetic spectrum is altered by the elastic deformation of the elastically deformable substrate into and out of the relaxed state.

In many such embodiments, the surface area of the at least one size-variable active area is altered via mechanical actuation. In some such embodiments, the elastically deformable substrate comprises an elastomer. In some such embodiments, the reflective coating is optimized for broadband infrared reflectance within at least the portion of the electromagnetic spectrum.

In still many such embodiments, the reflective coating is a thin film of a metal material. In some such embodiments, the metal is selected from the group consisting of: aluminum, copper or nickel, or any combination thereof.

In yet many such embodiments, the reflective coating is optimized for narrowband infrared reflectance within at least the portion of the electromagnetic spectrum.

In still yet many such embodiments, the reflective coating is comprised of alternating layers of materials so as to create a Bragg stack. In some such embodiments, the materials are selected from the group of $TiO_2$ and $SiO_2$, and combinations thereof.

In still yet many such embodiments, the portion of the electromagnetic spectrum is the Infrared portion.

In still yet many such embodiments, wherein:
the elastically deformable substrate is dielectric;
the texturizing layer is proton or ion-conducting and acts as a top electrode; and
wherein the at least one size-variable active area further comprises a second texturizing layer disposed on a second side of the elastically deformable substrate, wherein the second texturizing layer acts as a bottom proton or ion-conducting electrode such that the composite material is electrically active.

In still yet many such embodiments, the variable reflectance is altered via electrical actuation.

In still yet many such embodiments, the elastically deformable substrate comprises acrylate elastomer.

In still yet many such embodiments, the first and the second texturizing layers comprise a sulfonated pentablock co-polymer.

In still yet many such embodiments, the variable reflectance is altered autonomously.

In still yet many such embodiments, the composite material comprises more than one size-variable active area.

In still yet many such embodiments, the variable reflectance of each size-variable active area is altered via electrical actuation.

In still yet many such embodiments, each size-variable active area is independently addressable.

In still yet many such embodiments, the portion of the electromagnetic spectrum is in the infrared.

In still yet many such embodiments, the variable reflectance of each size-variable active area is altered autonomously without input from an external operator.

Various embodiments are directed to an adaptive system including:
a plurality of size-variable active areas, each size-variable active area having a variable transmittance, reflectance, and/or absorptance in at least a portion of the electromagnetic spectrum and comprising:

an elastically deformable dielectric substrate transparent in at least the portion of the electromagnetic spectrum and having an unrelaxed state wherein the elastically deformable dielectric substrate is elastically deformed beyond a relaxed state, and a first texturizing proton or ion-conducting layer disposed on a first side of the elastically deformable dielectric substrate as a top electrode and a second texturizing proton or ion-conducting layer disposed on a second side of the elastically deformable dielectric substrate as a bottom electrode, wherein both the first and the second texturizing proton or ion-conducting layers are transparent in at least the portion of the electromagnetic spectrum;

wherein at least when the elastically deformable dielectric substrate is in the relaxed state at least the first texturizing proton or ion-conducting layer forms a plurality of geometrically reconfigurable microstructures with at least one size scale in the 10 nm to 100 µm range in at least one size-variable active area, and the size-variable active area has a smaller surface area and a larger thickness than when the elastically deformable substrate is in the unrelaxed state; and wherein the transmittance, reflectance, and/or absorptance of the size-variable active area within at least the portion of the electromagnetic spectrum are altered by the elastic deformation of the elastically deformable dielectric substrate into and out of the relaxed state.

Many embodiments are directed to an adaptive system including:

a plurality of size-variable active areas, each size-variable active area having a variable reflectance in at least a portion of the electromagnetic spectrum and comprising:

an elastically deformable dielectric substrate transparent in at least the portion of the electromagnetic spectrum and having an unrelaxed state wherein the elastically deformable dielectric substrate is elastically deformed beyond a relaxed state, a first texturizing proton or ion-conducting layer disposed on a first side of the elastically deformable dielectric substrate as a top electrode and a second texturizing proton or ion-conducting layer disposed on a second side of the elastically deformable dielectric substrate as a bottom electrode, wherein both the first and the second texturizing proton or ion-conducting layers are transparent in at least the portion of the electromagnetic spectrum, and a reflective coating disposed on an outer surface of the first texturizing proton or ion-conducting layer, wherein the reflective coating is reflective in at least the portion of the electromagnetic spectrum;

wherein at least when the elastically deformable dielectric substrate is in the relaxed state at least the first texturizing proton or ion-conducting layer forms a plurality of geometrically reconfigurable microstructures with at least one size scale in the 10 nm to 100 µm range in at least one size-variable active area, and the size-variable active area has a smaller surface area and a larger thickness than when the elastically deformable substrate is in the unrelaxed state; and wherein the reflectance of the size-variable active area within at least the portion of the electromagnetic spectrum is altered by the elastic deformation of the elastically deformable dielectric substrate into and out of the relaxed state.

Various embodiments are directed to methods for altering the transmittance, reflectance, and/or absorptance within at least a portion of the electromagnetic spectrum using a composite material including:

at least one size-variable active area having a variable transmittance, reflectance, and/or absorptance in at least a portion of the electromagnetic spectrum comprising:

an elastically deformable substrate transparent in at least the portion of the electromagnetic spectrum and having an unrelaxed state wherein the elastically deformable substrate is elastically deformed beyond a relaxed state, and a texturizing layer disposed on a first side of the elastically deformable substrate, wherein the texturizing layer is transparent in at least the portion of the electromagnetic spectrum;

wherein at least when the elastically deformable substrate is in the relaxed state the texturizing layer forms a plurality of geometrically reconfigurable reflective microstructures with at least one size scale in the 10 nm to 100 µm range in at least one size-variable active area, and the at least one size-variable active area has a smaller surface area and a larger thickness than when the elastically deformable substrate is in the unrelaxed state; and wherein the transmittance, reflectance, and/or absorptance of the at least one size-variable active area within at least the portion of the electromagnetic spectrum are altered by the elastic deformation of the elastically deformable substrate into and out of the relaxed state.

In various such embodiments:

the elastically deformable substrate is dielectric;

the texturizing layer is proton or ion-conducting and acts as a top electrode; and wherein the at least one size-variable active area further comprises a second texturizing layer disposed on a second side of the elastically deformable substrate, wherein the second texturizing layer acts as a bottom proton or ion-conducting electrode such that the composite material is electrically active, and the transmittance, reflectance, and/or absorptance are altered via electrical actuation.

Many embodiments are directed to methods for altering the reflectance within at least a portion of the electromagnetic spectrum using a composite material including:

at least one size-variable active area having a variable reflectance in at least a portion of the electromagnetic spectrum comprising:

an elastically deformable substrate transparent in at least the portion of the electromagnetic spectrum and having an unrelaxed state wherein the elastically deformable substrate is elastically deformed beyond a relaxed state, a texturizing layer disposed on a first side of the elastically deformable substrate, wherein the texturizing layer is transparent in at least the portion of the electromagnetic spectrum, and a reflective coating disposed on an outer surface of the texturizing layer disposed on the first side of the elastically deformable substrate, wherein the reflective coating is reflective in at least the portion of the electromagnetic spectrum;

wherein at least when the elastically deformable substrate is in the relaxed state the texturizing layer forms a plurality of geometrically reconfigurable reflective microstructures with at least one size scale in the 10 nm to 100 μm range in at least one size-variable active area, and the at least one size-variable active area has a smaller surface area and a larger thickness than when the elastically deformable substrate is in the unrelaxed state; and wherein the reflectance of the at least one size-variable active area within at least the portion of the electromagnetic spectrum is altered by the elastic deformation of the elastically deformable substrate into and out of the relaxed state.

In many such embodiments:
the elastically deformable substrate is dielectric;
the texturizing layer is proton or ion-conducting and acts as a top electrode; and
wherein the at least one size-variable active area further comprises a second texturizing layer disposed on a second side of the elastically deformable substrate, wherein the second texturizing layer acts as a bottom proton or ion-conducting electrode such that the composite material is electrically active, and the reflectance is altered via electrical actuation.

Various embodiments are directed to methods for altering the transmittance, reflectance, and/or absorptance within at least a portion of the electromagnetic spectrum using an adaptive system including:

a plurality of size-variable active area, each size-variable active area having a variable transmittance, reflectance, and/or absorptance in at least a portion of the electromagnetic spectrum and comprising:
  an elastically deformable dielectric substrate transparent in at least the portion of the electromagnetic spectrum and having an unrelaxed state wherein the elastically deformable dielectric substrate is elastically deformed beyond a relaxed state, and
  a first texturizing proton or ion-conducting layer disposed on a first side of the elastically deformable dielectric substrate as a top electrode and a second texturizing proton or ion-conducting layer disposed on a second side of the elastically deformable dielectric substrate as a bottom electrode, wherein both the first and the second texturizing proton or ion-conducting layers are transparent in at least the portion of the electromagnetic spectrum;

wherein at least when the elastically deformable dielectric substrate is in the relaxed state at least the first texturizing proton or ion-conducting layer forms a plurality of geometrically reconfigurable reflective microstructures with at least one size scale in the 10 nm to 100 μm range in at least one size-variable active area, and the size-variable active area has a smaller surface area and a larger thickness than when the elastically deformable substrate is in the unrelaxed state; and wherein the transmittance, reflectance, and/or absorptance of the at least one size-variable active area within at least the portion of the electromagnetic spectrum are altered by the elastic deformation of the elastically deformable dielectric substrate into and out of the relaxed state.

Many embodiments are directed to methods for altering the reflectance within at least a portion of the electromagnetic spectrum using an adaptive system including:

a plurality of size-variable active area, each size-variable active area having a variable reflectance in at least a portion of the electromagnetic spectrum and comprising:
  an elastically deformable dielectric substrate transparent in at least the portion of the electromagnetic spectrum and having an unrelaxed state wherein the elastically deformable dielectric substrate is elastically deformed beyond a relaxed state,
  a first texturizing proton or ion-conducting layer disposed on a first side of the elastically deformable dielectric substrate as a top electrode and a second texturizing proton or ion-conducting layer disposed on a second side of the elastically deformable dielectric substrate as a bottom electrode, wherein both the first and the second texturizing proton or ion-conducting layers are transparent in at least the portion of the electromagnetic spectrum, and
  a reflective coating disposed on an outer surface of the first texturizing proton or ion-conducting layer, wherein the reflective coating is reflective in at least the portion of the electromagnetic spectrum;

wherein at least when the elastically deformable dielectric substrate is in the relaxed state at least the first texturizing proton or ion-conducting layer forms a plurality of geometrically reconfigurable reflective microstructures with at least one size scale in the 10 nm to 100 μm range in at least one size-variable active area, and the size-variable active area has a smaller surface area and a larger thickness than when the elastically deformable substrate is in the unrelaxed state; and wherein the reflectance of the at least one size-variable active area within at least the portion of the electromagnetic spectrum is altered by the elastic deformation of the elastically deformable dielectric substrate into and out of the relaxed state.

Additional embodiments and features are set forth in part in the description that follows, and in part will become apparent to those skilled in the art upon examination of the specification or may be learned by the practice of the disclosed subject matter. A further understanding of the nature and advantages of the present disclosure may be realized by reference to the remaining portions of the specification and the drawings, which forms a part of this disclosure.

BRIEF DESCRIPTION OF THE DRAWINGS

These and other features and advantages of the present invention will be better understood by reference to the following detailed description when considered in conjunction with the accompanying data and figures, wherein:

FIGS. 5J-5O illustrate the system's stability under repetitive modulation, specifically after 75 cycles (FIGS. 5J-5L) and after 750 cycles (FIGS. 5M-5O).

FIG. 7A illustrates fabrication of electrically actuated devices from adaptive multispectral composite materials in accordance with embodiments of the disclosure, while

FIG. 9C is a digital camera image; and FIGS. 9A (bottom), 9B (bottom), and 9E comprise infrared camera images, all in accordance with embodiments of the application.

DETAILED DISCLOSURE

Figure 1:
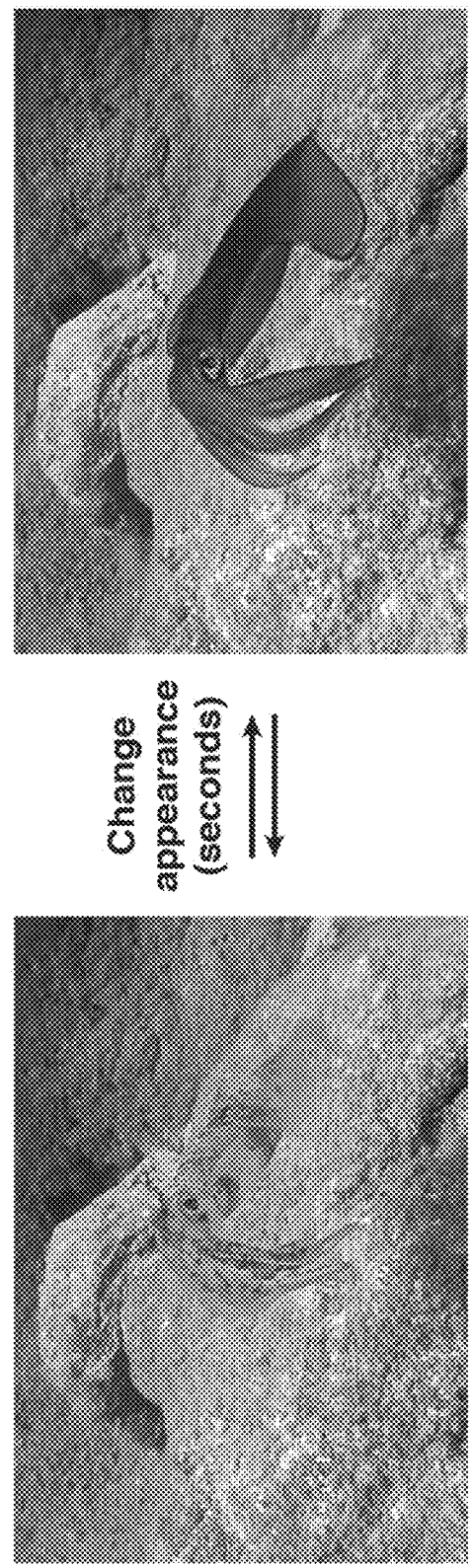
FIG. 1 shows camera images of a squid changing its appearance in front of a rocky background in accordance with prior art.

Turning to the drawings and data, descriptions of adaptively transmitting and/or reflective materials and systems, as well as methods of manufacture and use thereof, are provided. It will be understood that the embodiments of the invention described herein are not intended to be exhaustive or to limit the invention to precise forms disclosed. Rather, the embodiments selected for description have been chosen to enable one skilled in the art to practice the invention.

While various static systems for manipulation of electromagnetic radiation are well-established today, one highly desirable but not easily attainable property for such materials and related technologies is on-demand adaptability, i.e. precise and sensitive real-time dynamic responsiveness to changes in the surrounding environment. For example, only a limited number of adaptive systems that dynamically modulate propagation of infrared radiation (i.e., heat) have been reported to date, because such systems must satisfy a number of stringent and demanding technical performance criteria, making the development of these technologies extremely challenging. Furthermore, materials and systems that can simultaneously alter their interaction with light across both the visible (400 nm-750 nm) and infrared (750 nm-16.5 µm) regions of the electromagnetic spectrum remain relatively rare, with few examples of such technologies reported to date. Indeed, the engineering of platforms with tandem multispectral adaptive functionality has proven challenging, in part because the length scales associated with the propagation of visible and long-wavelength infrared light differ by an order of magnitude. For example, thermochromic phase-change materials, such as vanadium oxide, can display substantial infrared emissivity changes due to thermally-induced phase transitions, but they often produce relatively minor changes in their visible appearance, and feature high operating temperatures, substantial hysteresis during cycling, and difficult-to-control structural characteristics (H. Ji et al., Infrared thermochromic properties of monoclinic $VO_2$ nanopowders using a malic acid-assisted hydrothermal method for adaptive camouflage. *RSC Adv.* 7, 5189-5194 (2017); D. Liu, et al., Thermochromic properties of W-doped $VO_2$ thin films deposited by aqueous sol-gel method for adaptive infrared stealth application. *Infrared Phys. Technol.* 77, 339-343 (2016); L. Xiao et al., Fast Adaptive Thermal Camouflage Based on Flexible $VO_2$/Graphene/CNT Thin Films. *Nano Lett.* 15, 8365-8370 (2015); Z. Mao et al., Infrared stealth property based on semiconductor (M)-to-metallic (R) phase transition characteristics of W-doped $VO_2$ thin films coated on cotton fabrics. *Thin Solid Films.* 558, 208-214 (2014); M. A. Kats et al., Vanadium Dioxide as a Natural Disordered Metamaterial: Perfect Thermal Emission and Large Broadband Negative Differential Thermal Emittance. *Phys. Rev. X.* 3, 41004 (2013); the disclosure of which is incorporated herein by reference).

In another example, infrared electrochromic devices have optical properties that can be altered with electrochemical redox reactions, but they struggle with precise spectral tunability and necessitate the use of inert noble metals or intricate nanocomposites to achieve functionality and stability (Y. Tian et al., A comprehensive study of electrochromic device with variable infrared emissivity based on polyaniline conducting polymer. *Sol. Energy Mater. Sol. Cells.* 170, 120-126 (2017); B. Kim et al., Patternable PEDOT nanofilms with grid electrodes for transparent electrochromic devices targeting thermal camouflage. *Nano Converg.* 2, 19 (2015); P. Chandrasekhar et al., Large, Switchable Electrochromism in the Visible Through Far-Infrared in Conducting Polymer Devices. *Adv. Funct. Mater.* 12, 95-103 (2002); P. Chandrasekhar et al., Conducting Polymer (CP) infrared electrochromics in spacecraft thermal control and military applications. *Synth. Met.* 135-136, 23-24 (2003); the disclosure of which is incorporated herein by reference). In yet another example, certain metamaterial-based systems can spatiotemporally modulate their emissivity through photogenerated carrier doping, but they use ultraviolet light for actuation, need elevated working temperatures for adequate contrast, and display long recovery times (Z. J. Coppens, J. G. Valentine, Spatial and Temporal Modulation of Thermal Emission. *Adv. Mater.* 29, 1701275 (2017), the disclosure of which is incorporated herein by reference). Furthermore, thermal cloaking platforms modify the infrared signatures of other objects by manipulating the heat flow in the surroundings, but they require significant temperature gradients and demand complete object immersion, thereby restricting implementation (R. Schittny, et al., Experiments on Transformation Thermodynamics: Molding the Flow of Heat. *Phys. Rev. Lett.* 110, 195901 (2013); T. Han, et al., Full Control and Manipulation of Heat Signatures: Cloaking, Camouflage and Thermal Metamaterials. *Adv. Mater.* 26, 1731-1734 (2014); the disclosure of which is incorporated herein by reference). Finally, soft machines and robots with integrated microfluidics can alter both their optical appearance and thermal signature/infrared patterning via pneumatic injection of functional liquids, but they rely on the continuous flow of different specific liquids and have slow response times dictated by the injection rate and thermal conductivities of the liquids (S. A. Morin et al., Camouflage and Display for Soft Machines. *Science* 337, 828-832 (2012), the disclosure of which is incorporated herein by reference). Consequently, the engineering of materials and systems with adaptive functionality over a broad spectral window, which spans the visible, near-infrared, short-wavelength infrared, mid-wavelength infrared, long-wavelength infrared, and far infrared ranges of the electromagnetic spectrum represent an exciting challenge that could afford unique technological opportunities.

One notable example of a highly adaptive system is found in nature in cephalopod skin (FIG. 1). Indeed, the remarkable capabilities of cephalopod skin and its components have inspired the engineering of various adaptive artificial optoelectronic devices (C. Yu et al., Adaptive optoelectronic camouflage systems with designs inspired by cephalopod skins. *Proc. Natl. Acad. Sci.* 111, 12998-13003 (2014); C. Larson et al., Highly stretchable electroluminescent skin for optical signaling and tactile sensing. *Science* 351, 1071-1074 (2016); Q. Wang, et al., Cephalopod-inspired design of electro-mechano-chemically responsive elastomers for on-demand fluorescent patterning. *Nat. Commun.* 5, 4899 (2014); J. Rossiter, B. Yap, A. Conn, Biomimetic chromatophores for camouflage and soft active surfaces. *Bioinspir. Biomim.* 7, 36009 (2012); J. Rossiter et al., Colour gamuts in polychromatic dielectric elastomer artificial chromatophores. *Proc. SPIE.* 9056, 905620 (2014); the disclosure of which is incorporated herein by reference). For example, dielectric elastomer actuators have been leveraged for cephalopod-inspired color-changing systems that function within the visible region of the electromagnetic spectrum. In the most basic incarnation, such devices consist of an elastomer membrane sandwiched between two electrodes, wherein the application of a voltage between the electrodes induces electrostatic pressure, leading to a decrease in the membrane's thickness and an increase in the overall electrode's area. More generally, such actuators, which essentially translate electrical stimuli into mechanical outputs, have been explored for a variety of applications, including artificial muscles, pneumatic automation, energy generation, tactile displays, and adaptive optics. However, the technological viability of dielectric elastomer actuators has been limited by challenges associated with a requirement for both high operating voltages and electrodes with a demanding combination of properties (F. Carpi, et al., *Dielectric Elastomers as Electromechanical Transducers* (Elsevier, 2008); J. Biggs et al., Electroactive Polymers: Developments of and Perspectives for Dielectric Elastomers. *Angew. Chemie Int. Ed.* 52, 9409-9421 (2013); F. Carpi, *Electromechanically Active Polymers* (Springer, 2016); S. Rosset, H. R. Shea, Flexible and stretchable electrodes for dielectric elastomer actuators. *Appl. Phys. A.* 110, 281-307 (2013); D. McCoul, et al., Recent Advances in Stretchable and Transparent Electronic Materials. *Adv. Electron. Mater.* 2, 1500407 (2016); the disclosure of which is incorporated herein by reference).

For applications that are expected to function within multiple spectral windows, the latter requirement is particularly daunting because the required electrode materials (i.e., stretchable conductors) must meet a variety of demanding and often competing criteria, including: straightforward processability into thin freestanding membranes, excellent adhesion to surfaces and amenability to surface modification/patterning, excellent flexibility, stretchability, and compliance, high electrical conductivity under significant deformation, transparency over a broad spectral range, tolerance for a broad range of environmental conditions (e.g., variable humidity), stability to repeated electrical and mechanical cycling, and tandem tunability of optical properties within both the visible and the infrared spectral ranges.

This application is directed to embodiments of fully artificial, multispectral, adaptive composite materials and systems, inspired by squid skin's bio-optical capabilities and having variable transmittance, reflectance, and/or absorptance to radiation in the visible, infrared, or other desired region of the electromagnetic spectrum, and methods of the manufacture and use thereof. In many embodiments, the adaptive composite materials and systems possess an unprecedented combination of properties and are, therefore, poised to enable a broad range of practical applications. In many embodiments, the adaptive composite material comprises at least one size-variable active area having a variable transmittance, reflectance, and/or absorptance in at least a portion of the electromagnetic spectrum and comprising at least: an elastomer substrate and a texturizing layer disposed on top of the elastomer substrate. In some embodiments, the adaptive composite material comprises at least one size-variable active area having a variable reflectance, transmittance, and/or absorptance in at least a portion of the electromagnetic spectrum and comprising: an elastomer substrate, a texturizing layer disposed on top of the elastomer substrate, and a reflective coating disposed on top of the texturizing layer. In operation, the stretching and relaxation of the elastomer substrate (e.g., via mechanical means) causes changes in the surface morphology of the composite material due to the physical properties of the texturizing layer (e.g., the change in the size and depth of surface features of the composite material), which, in turn, results in the increased or decreased transmissivity, reflectivity, and/or absorptivity of the active area, as will be described in greater detail below in reference to embodiments incorporating electrically active materials and systems.

Figure 2A:
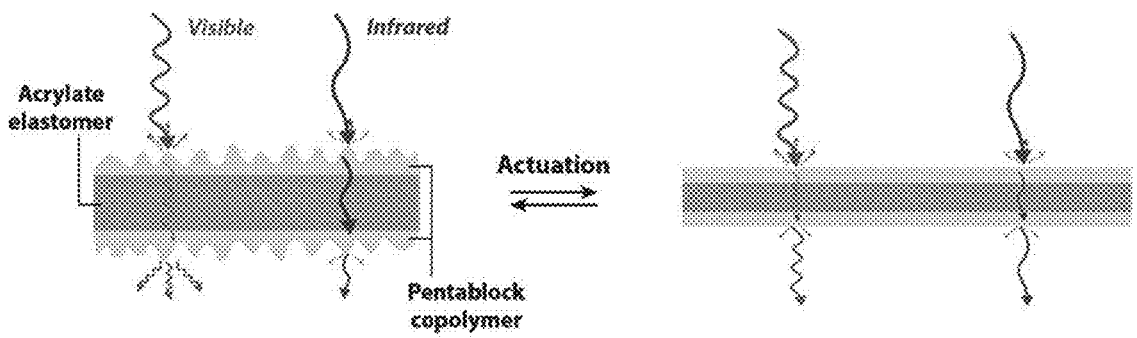
FIG. 2A is a schematic showing side view of the multispectral adaptive system before (left) and after (right) actuation, in accordance with embodiments of the application.
Figure 2B:
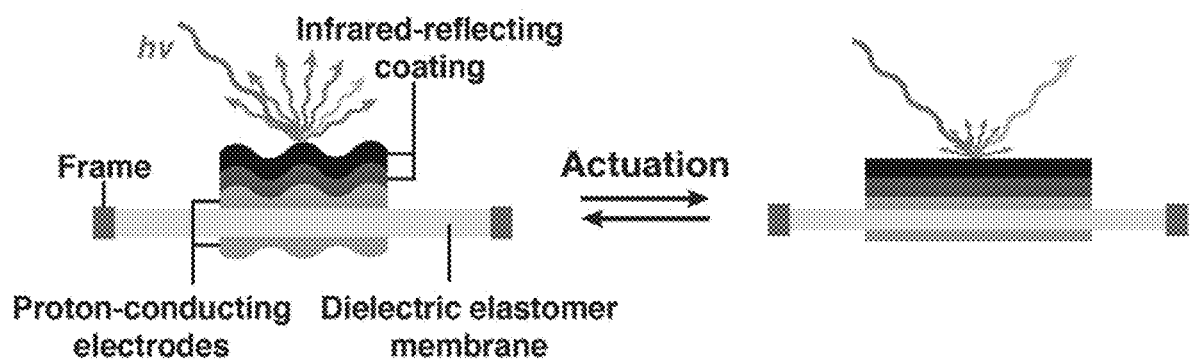
FIGS. 2B and 2C are schematics showing side (2B) and top (2C) views of the adaptive infrared-reflecting system before (corresponding left) and after (corresponding right) actuation, in accordance with embodiments of the application.
Figure 2C:
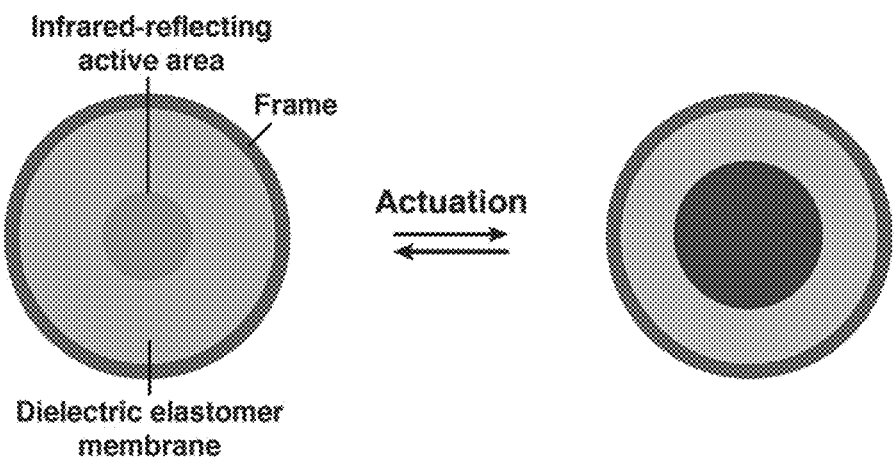

In many other embodiments, the adaptive composite materials and systems incorporate dielectric elastomer actuators and, therefore, in some such embodiments, the composite materials and systems comprise at least one "device" in a parallel plate capacitor-type configuration, for which the size variable active area consists of a proton or ion-conducting bottom electrode, a dielectric elastomer substrate, and a proton or ion-conducting top electrode (FIG. 2A). In some embodiments, the size variable active area consists of a proton or ion-conducting bottom electrode, a dielectric elastomer substrate, a proton or ion-conducting top electrode, and, in addition, a reflective coating on top of the top electrode (FIGS. 2B and 2C). In various embodiments, the layers constituting the active area may have certain desirable properties, such as transparency or reflectance over a desired spectral range, excellent flexibility and compliance, special dielectric or conductive properties (e.g., in the embodiments incorporating electrodes, the substrate disposed between the electrodes may be a dielectric to prevent shorting, while the electrodes may have high conductivity that does not drop upon deformation), high stability, and resilience to repeated cycling (e.g., to allow the active area to stretch and relax as necessary, without degradation, including under variable humidity). In many embodiments, prior to actuation, each composite material or system features one (or more) relatively small but size-variable active area (as depicted, for example, in FIG. 2C, left), with the active area's surface covered by a geometrically-reconfigurable arrangement of reflective microstructures (e.g., wrinkles) (FIGS. 2A, left, and 2B, left). In such embodiments, upon actuation, the active area of the material or system expands with thinning to modulate the amount of absorbed incident radiation (FIG. 2C, right), as well as to alter the geometry/morphology of its microstructured surface, which, in turn, modulates the relative intensity of the reflected incident radiation (FIGS. 2A, right, and 2B right). In addition, in many embodiments, a specially chosen or designed reflective top coating may be used to further enhance the reflective properties of the composite material of the disclosure in the desired range as described herein.

More specifically, FIG. 2A provides an example of an adaptive tri-layer device architecture assembled according to many embodiments. In some such embodiments, the active area's elastomeric substrate may, for example, comprise an acrylate elastomer, which is transparent in the visible range of the electromagnetic spectrum, but absorbs in the infrared range. Furthermore, in some embodiments, such substrate is sandwiched between two proton or ion-conducting electrodes, which may, for example, be highly-conductive sulfonated pentablock copolymer membranes transparent in both the visible and the infrared ranges of the electromagnetic spectrum. In many embodiments, before actuation, such devices feature a relatively small active area, with a greater effective thickness and a laterally-disordered wrinkled surface morphology (FIG. 1A, left). Accordingly, the devices' high thickness increases their absorptance and decreased their transmittance within the infrared range, while the wrinkled surface morphology leads to white opacity within the visible range, due to broadband diffuse scattering (FIG. 1F, left). In contrast, in many embodiments, after actuation, the devices feature a relatively large active area, with reduced effective thickness and a laterally-ordered flattened surface morphology (FIG. 1F, right). Accordingly, the devices' lower thickness decreases their absorptance and increases their transmittance within the infrared range, while the flattened surface morphology leads to enhanced transparency within the visible range, due to broadband specular transmission. As a result, the design strategy according to the embodiments described herein enables systems to simultaneously reconfigure their optical properties across the visible, infrared, or other desired regions of the electromagnetic spectrum.

Accordingly, in many embodiments, the adaptively transmissive/reflective/absorptive materials and systems of the instant disclosure simultaneously possess the following highly desirable properties and features: a simple actuation mechanism, low working temperature, tunable spectral range, weak angular dependence, fast response, stability to repeated cycling, amenability to patterning and multiplexing, autonomous operation, robust mechanical properties, and straightforward manufacturability. In many embodiments, the adaptive materials and systems of the application operate within the visible or other desirable range of the electromagnetic spectrum. In many embodiments, the adaptive composite materials and systems of the application operate within the infrared region of the electromagnetic spectrum. In many embodiments, both the broadband and narrowband reflectance of the adaptive materials and systems are controllably variable within the desired range of the electromagnetic spectrum. Overall, in many embodiments, the portion of the electromagnetic spectrum in which the adaptive materials described herein can be tuned to operate may be any one of: visible, near-infrared, short-wavelength infrared, medium-wavelength infrared, long-wavelength infrared, and far infrared.

Fabrication of Adaptive Multispectral Composite Materials and Systems

Figure 3A:
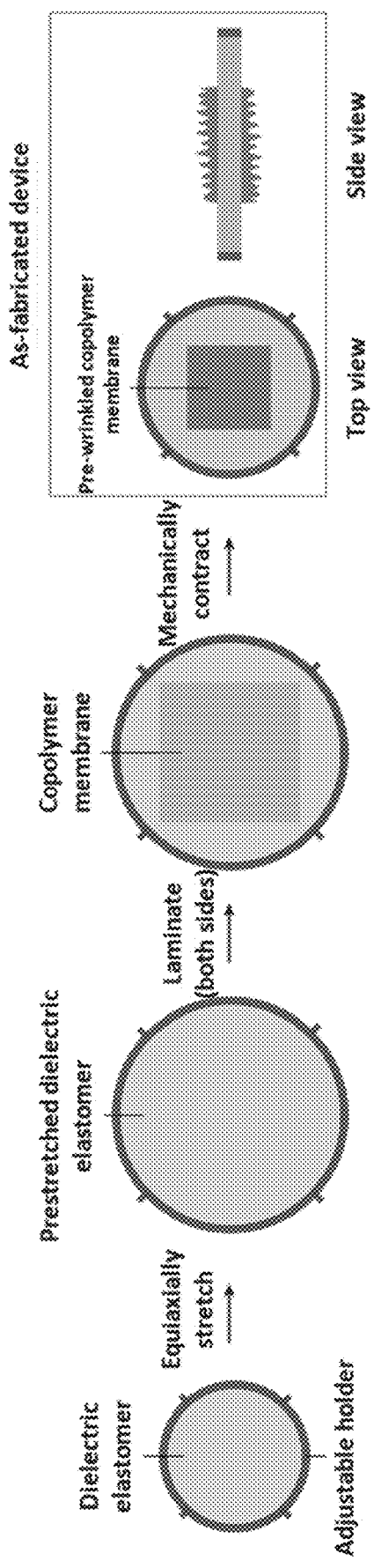
FIGS. 3A, 3B and 3C schematically illustrate fabrication steps for production of various adaptive composite materials, including a multispectral composite material without an infrared-reflecting coating (3A), as well as a broadband (metal-modified) (3B), and a narrowband (Bragg stack-modified) (3C) infrared-reflecting composite materials in accordance with embodiments of the application.
Figure 3B:
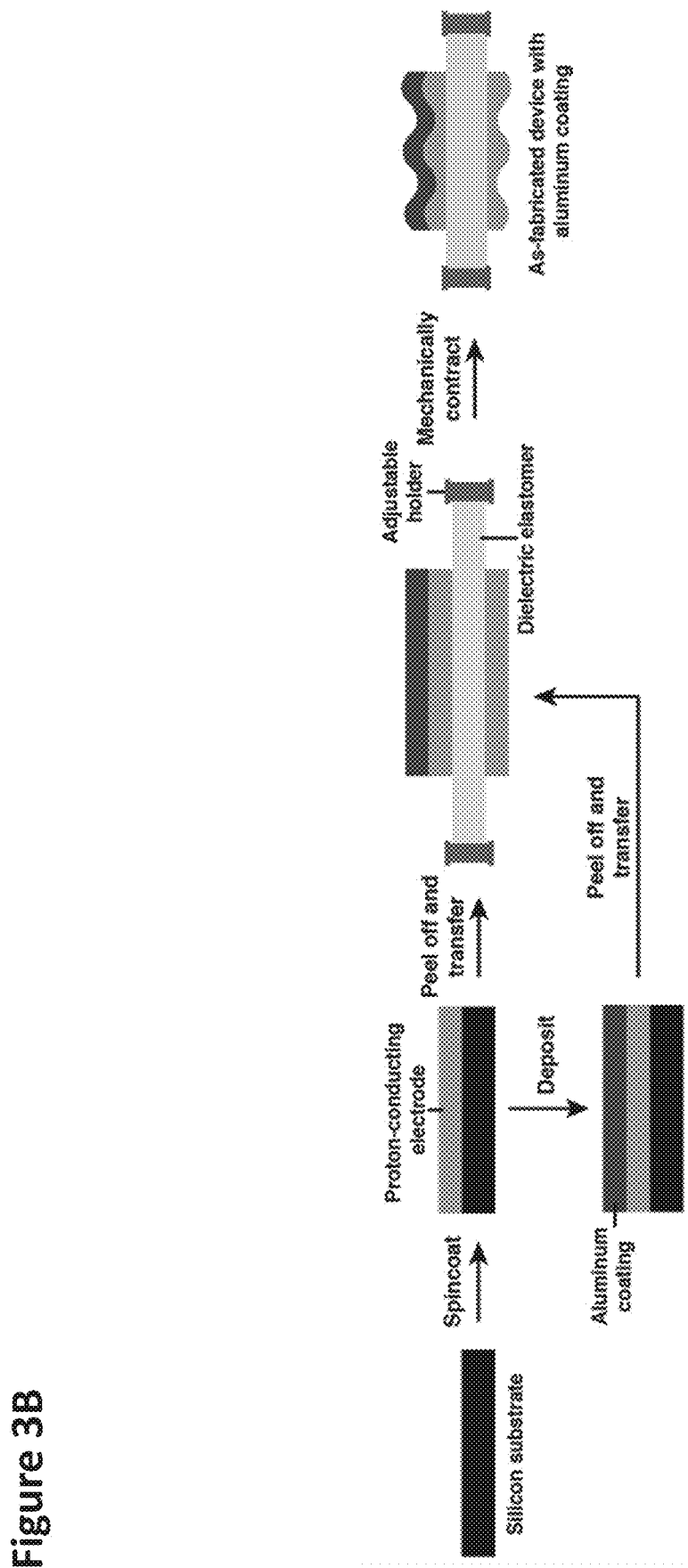
Figure 3C:
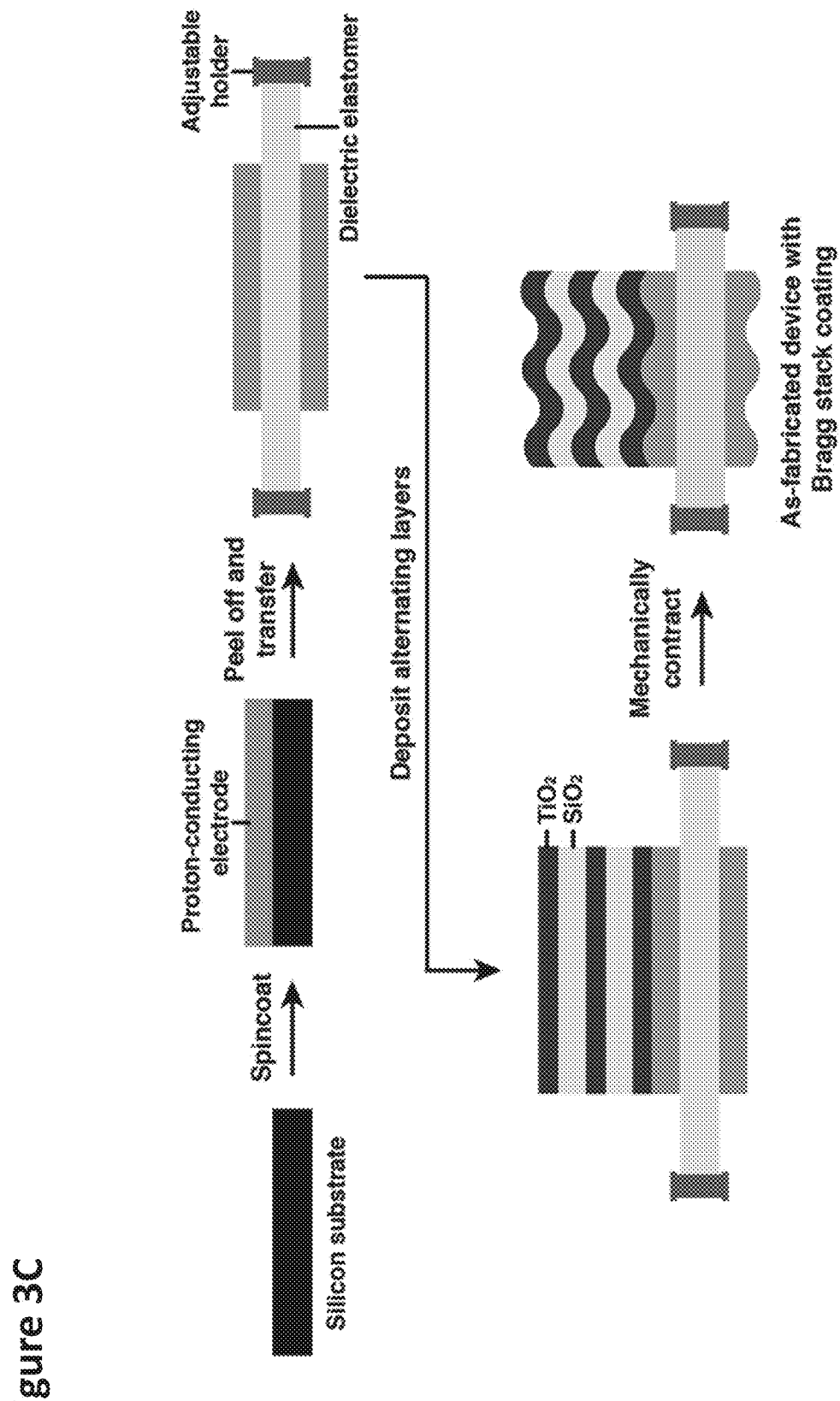

In many embodiments, the active areas of reflecting composite materials and systems are fabricated according to one of the schemes outlined in FIGS. 3A through 3C, depending on the desired operational range. In some such embodiments, the fabrication process employs lithographic techniques similar to those used in manufacturing of dielectric elastomer actuators. In some embodiments, the adaptive materials and systems are manufactured with centimeter-scale active areas to benefit from, among other factors: easier benchtop assembly and simpler spectroscopic characterization. In many embodiments, the compliant texturizing, yet transparent, electrodes are prepared from proton or ion-conducting polymers. In many embodiments, the compliant texturizing, yet transparent, electrodes are prepared from sulfonated pentablock co-polymer films with exceptional protonic conductivity (J. H. Choi, C. L. Willis, K. I. Winey, Structure-property relationship in sulfonated pentablock copolymers. *J. Memb. Sci.* 394-395, 169-174 (2012); Y. Fan, M. Zhang, R. B. Moore, C. J. Cornelius, Structure, physical properties, and molecule transport of gas, liquid, and ions within a pentablock copolymer. *J. Memb. Sci.* 464, 179-187 (2014); the disclosure of which is incorporated herein by reference). In many such and other embodiments, the shape of the compliant texturizing electrode film defines the active area or areas of the adaptive composite material and system of the disclosure. In some embodiments, the electroactive, elastically deformable substrate is prepared from an acrylate dielectric elastomer mounted within a size-adjustable holder capable of stretching the substrate into a variety of configurations. In some such embodiments the holder is capable of equiaxially stretching the substrate. In other embodiments, when electrical actuation of the composite material or system is desired, the elastically deformable substrate is transferred onto a support frame. In any case, in many embodiments, the preparation of the most basic adaptive material with an active area of embodiments comprises: first mounting an elastic substrate onto an adjustable support, stretching it, applying a texturizing transparent material on at least one side of the substrate under tension, and then releasing at least some of the tension to introduce microstructures to the laminate's surface (FIG. 3A). In many embodiments, the preparation of the adaptive material with an active area of embodiments comprises: first mounting an elastic substrate onto an adjustable support, stretching it, applying a texturizing transparent material to both sides of the substrate under tension, and then releasing at least some of the tension to introduce microstructures to the laminate's surface (FIG. 3A).

In many embodiments, the adaptive materials and systems of the application are optimized for performance within different wavelength regimes via introduction of chemically and structurally distinct reflective coatings on top of their active areas. For example, in some embodiments, the active areas with broadband infrared-reflecting capabilities may be fabricated according to the scheme illustrated in FIG. 3B. In such embodiments, electron-beam evaporation is used to deposit a thin film of aluminum (Al), copper (Cu), another metal, or any combination thereof onto a proton or ion-conducting top electrode, which is then laminated onto a stretched elastomeric substrate (e.g., a film of an acrylate polymer) optionally already outfitted with an unmodified bottom electrode. In other embodiments, the active areas with narrowband infrared-reflecting capabilities may be fabricated according to the scheme illustrated in FIG. 3C. In such embodiments, electron-beam evaporation is used to deposit alternating layers of, for example, titanium dioxide ($TiO_2$) and silicon dioxide ($SiO_2$), so as to create a Bragg stack directly onto the top electrode of a stretched elastomeric substrate, wherein the substrate is already outfitted with the top and, optionally, bottom electrodes (FIG. 3C).

In many embodiments, the fabrication of all types of active areas is completed by mechanically contracting the substrate to release some of the tension introduced during the initial mounting and stretching of the substrate and, thus, introducing microstructures (wrinkles) to the surfaces of the systems' active areas, wherein the resulting microstructures are reconfigurable features with at least one size scale in the 10 nm to 100 μm range amenable to changing their geometry and arrangement on a surface. In many embodiments, the overall scalable fabrication procedure furnishes adaptive multispectral or infrared-reflecting composite materials and systems comprising one or more active areas with the general architectures depicted in FIGS. 2A-2C.

Properties of Adaptive Multispectral Composite Materials and Systems

Figure 4A:
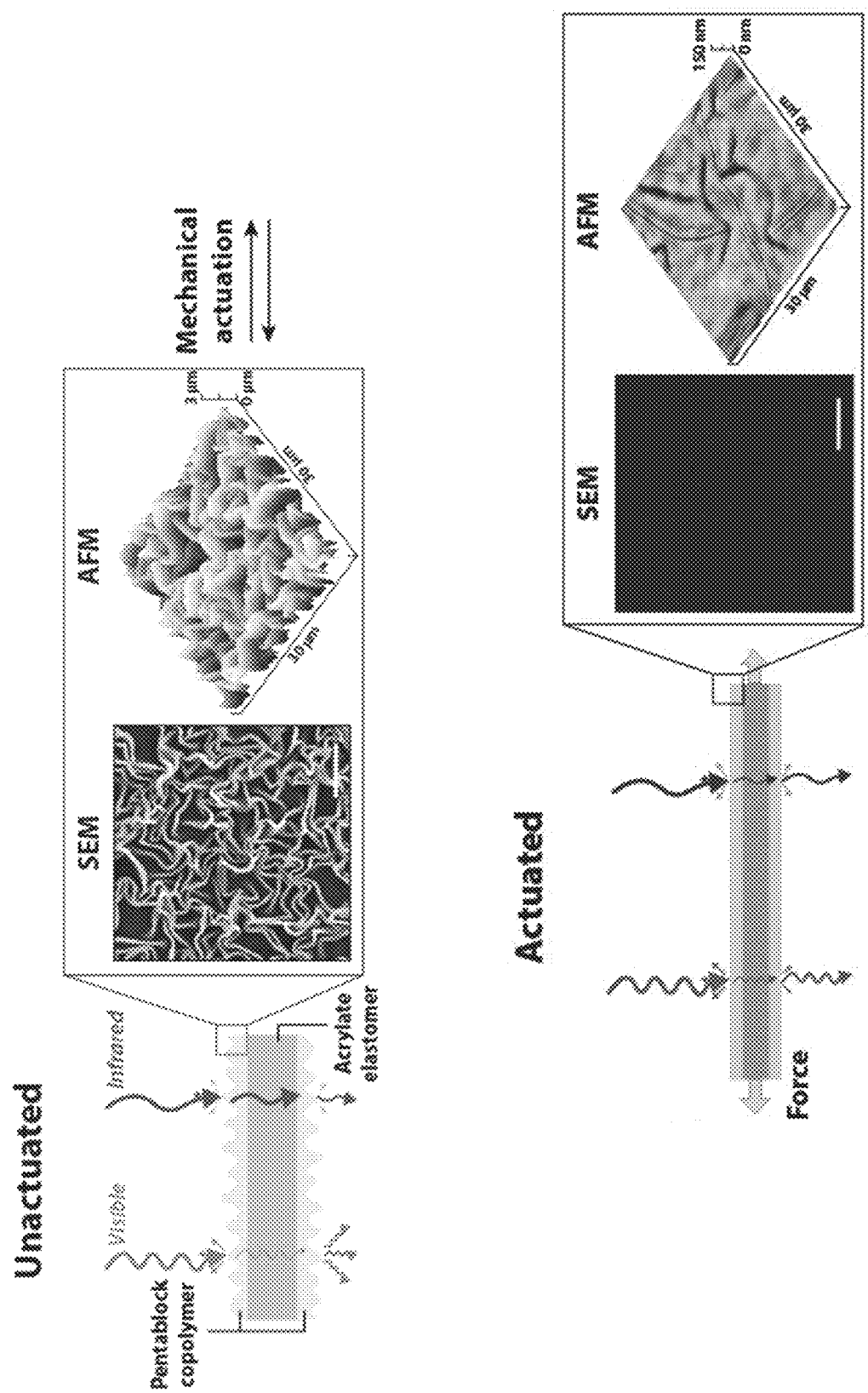
FIGS. 4A-4G illustrate various properties of unactuated and mechanically actuated adaptive multispectral composite materials within the visible and infrared ranges of the electromagnetic spectrum in accordance with embodiments of the application by providing: a schematic for mechanical actuation, along with corresponding images from a scanning electron microscopy (SEM) and atomic force microscopy (AFM) (4A); digital camera images, along with corresponding transmittance spectra within the visible to short-wavelength infrared regions (4B), top and bottom respectively); reflectance spectra within the visible to short-wavelength infrared regions (4C); absorptance spectra within the visible to short-wavelength infrared regions (4D); infrared camera images, along with corresponding transmittance spectra within the short-wavelength to far-wavelength infrared regions (4E, top and respectively); reflectance spectra within the short-wavelength to far-wavelength infrared regions (4F); and absorptance spectra within the short-wavelength to far-wavelength infrared regions (4G).

FIGS. 4A-4G illustrate the effects of mechanical actuation (e.g., mechanically induced equiaxial strain) on the properties of the adaptive composite material comprising one active area with a variable multispectral transmittance and reflectance, prepared according to the embodiments of the instant application (FIGS. 3A and 4A). In many embodiments, prior to mechanical actuation (i.e., application of strain), the active areas' surface has a relatively small area and relatively large thickness, and, as revealed by scanning electron microscopy (SEM) and atomic force microscopy (AFM), comprises a three-dimensional network of randomly-oriented microstructures/wrinkles with variable micron-scale lengths (FIG. 4A, left, inset). More specifically, the corresponding AFM image analysis indicates that, in many embodiments, the unactuated substrates possess a root-mean-square (RMS) roughness of 564±16 nm and wrinkles with heights in the range of 1.5 to 2.5 μm and widths in the range of 400 to 800 nm (FIG. 4A, left, inset).

Figure 4B:
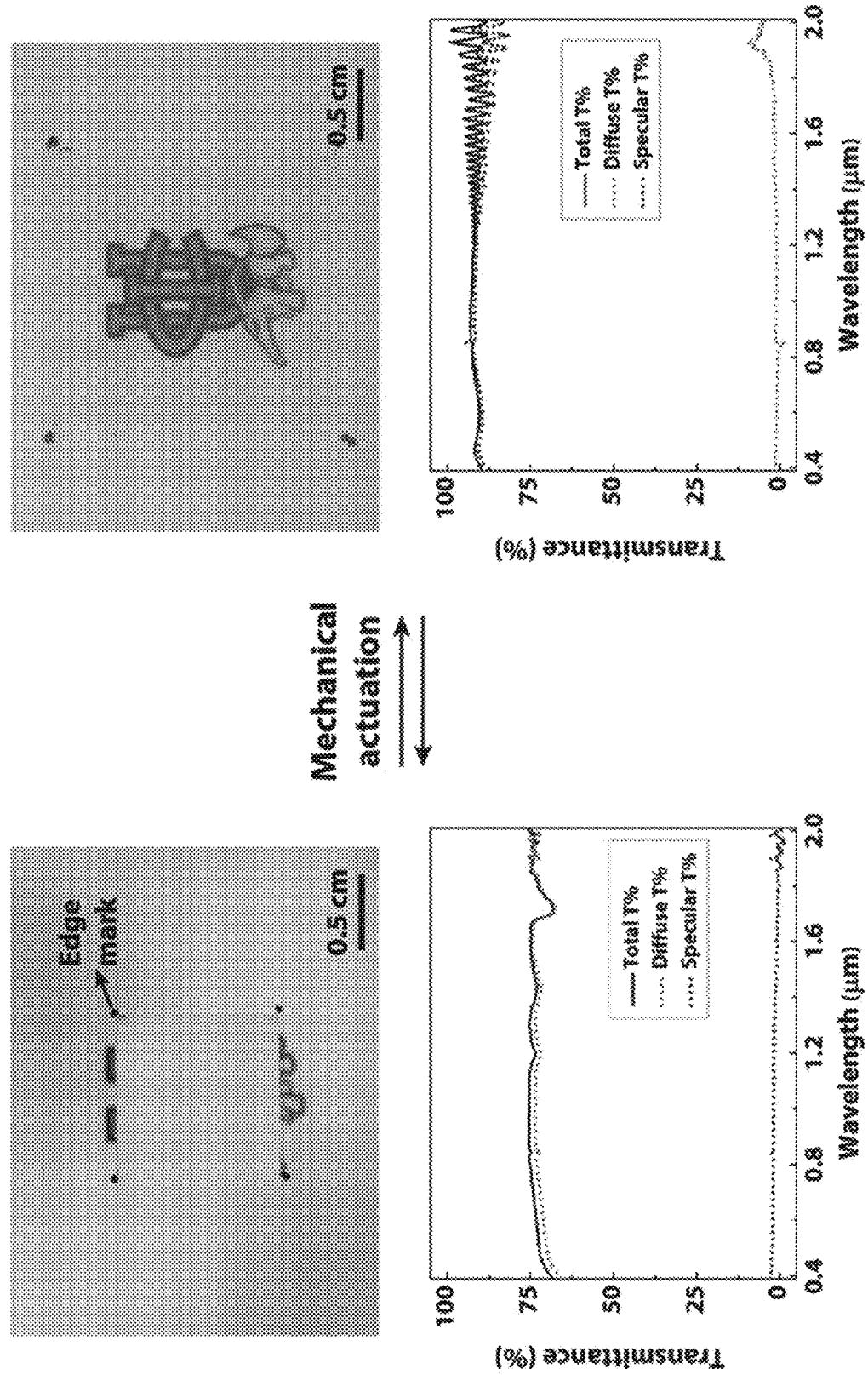
Figure 4C:
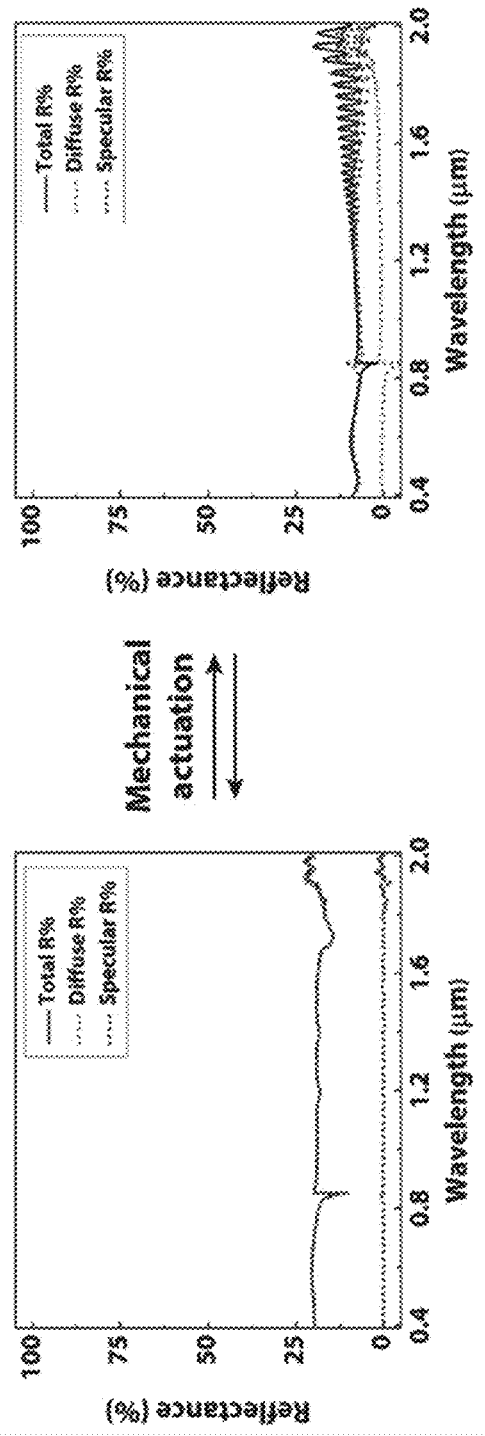
Figure 4D:
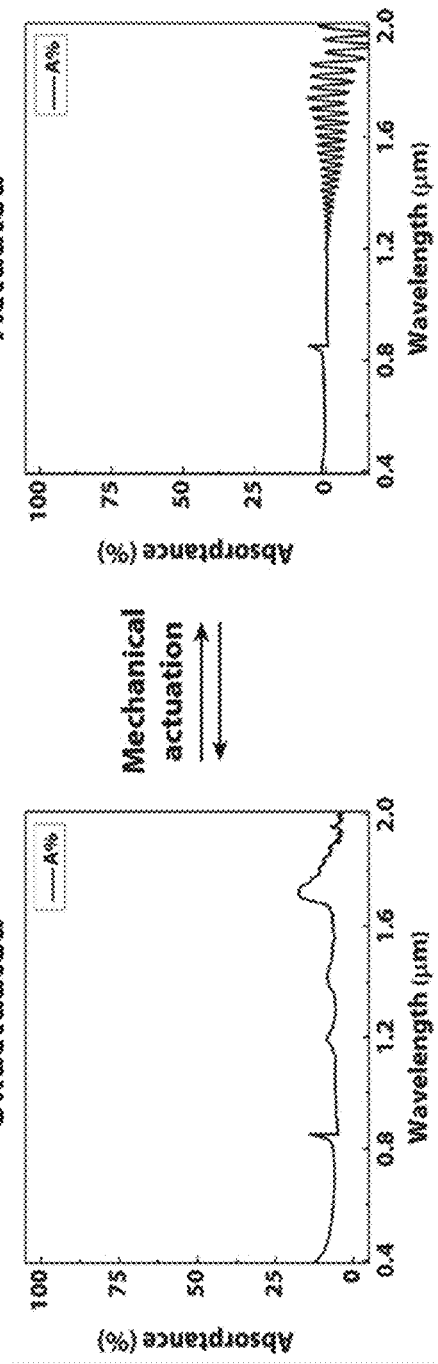
Figure 4E:
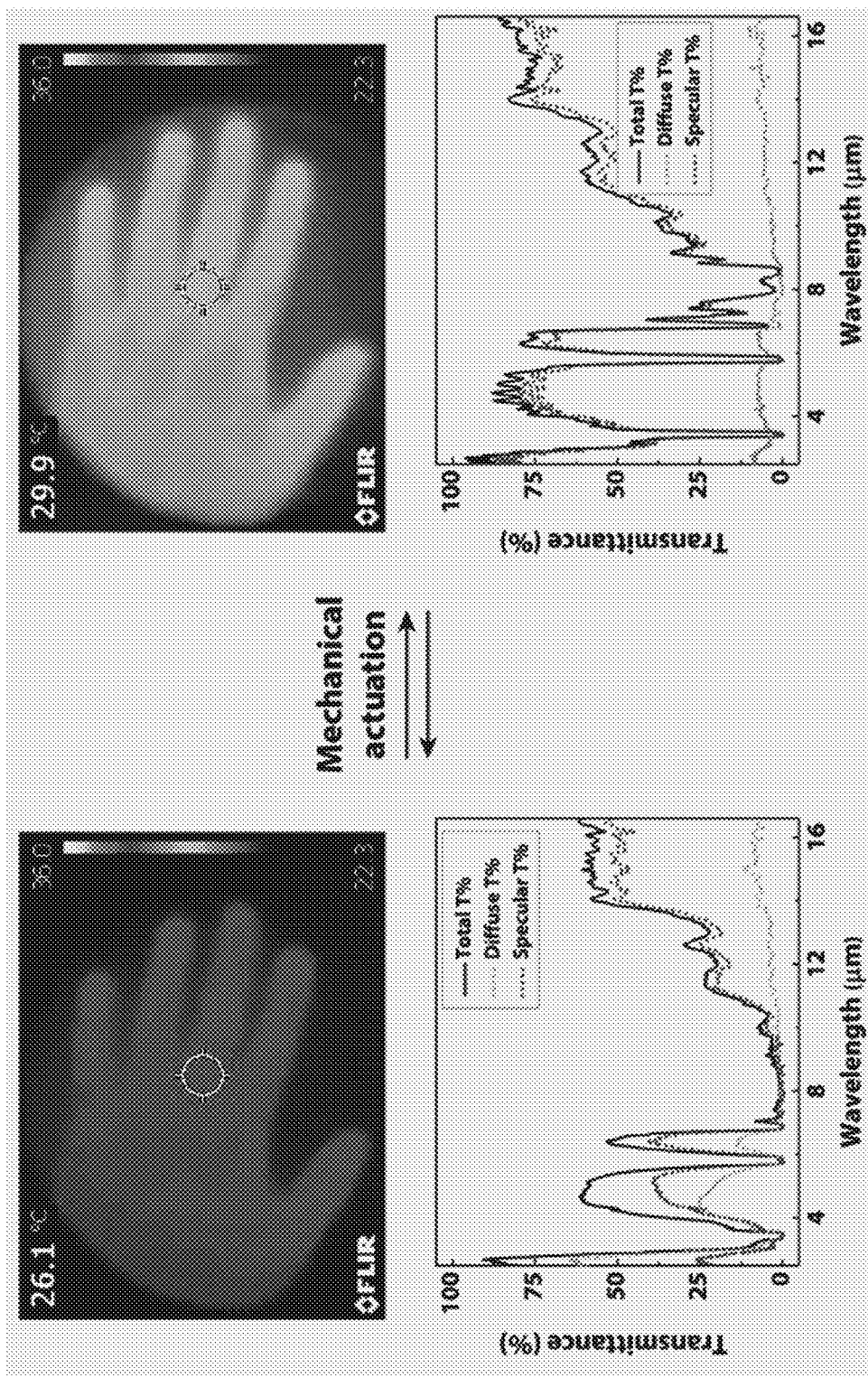
Figure 4F:
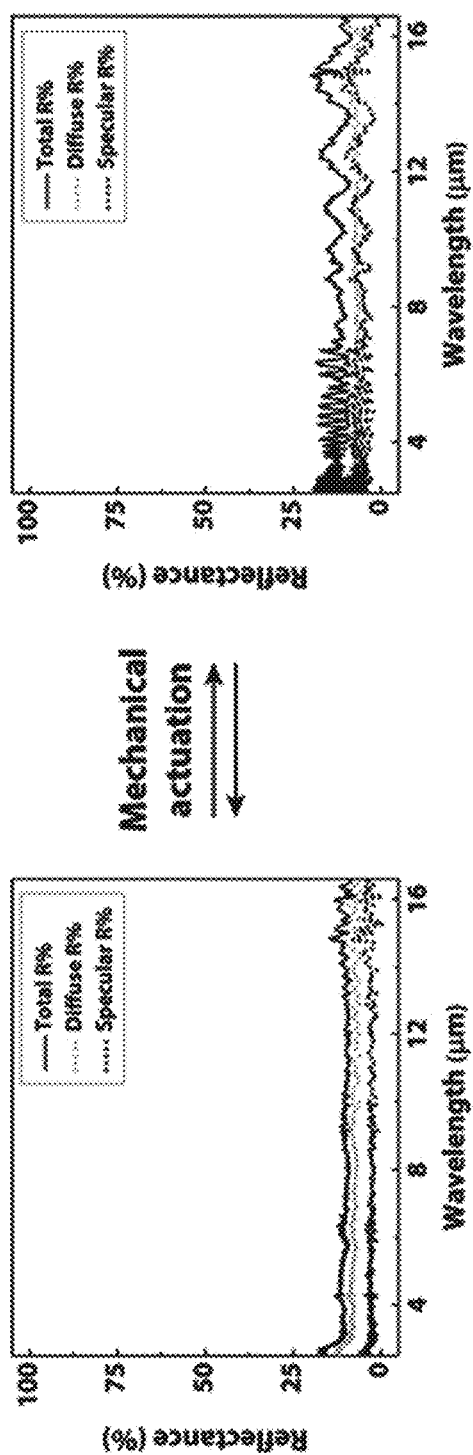
Figure 4G:
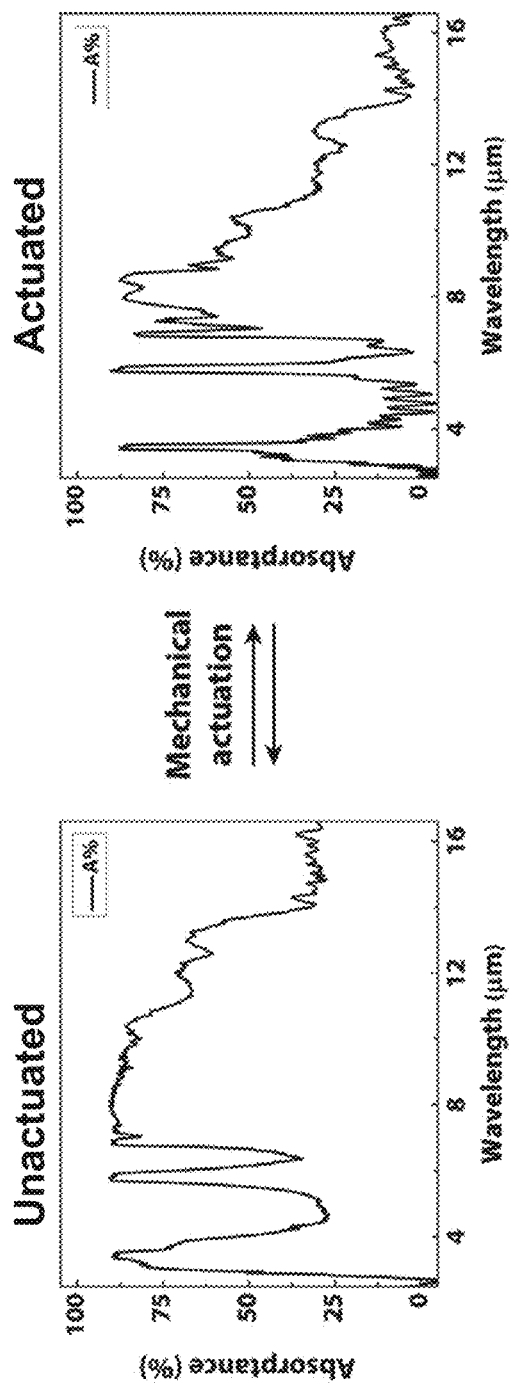

FIGS. 4B through 4D illustrate the optical properties of the composite materials of these embodiments within the visible to short-wavelength infrared regions of the electromagnetic spectrum, wherein FIG. 4B (top left) specifically illustrates that before actuation, the corresponding composite materials of the disclosure possess optically opaque small active areas, as can be gauged from visualization of an underlying logo with a digital camera. The corresponding transmittance spectra for the unactuated composites of these embodiments show a high average total transmittance of 73.9±0.1% (FIG. 4B, bottom left, solid line), a moderate average total reflectance of 19.3±0.3% (FIG. 4C, left, solid line), and a low average total absorptance of 6.8±0.4% (FIG. 4D, left, solid line). Furthermore, the total transmittance for the composite materials of theses embodiments consists of a small specular (direct transmission) component of 1.2±0.3% and a dominant average diffuse (indirect transmission) component of 72.7±0.4%, in a specular-to-diffuse transmittance ratio of ~0.02 (FIG. 4B, bottom left). Next, FIGS. 4E through 4G illustrate the spectroscopic properties of the composite materials of these embodiments within the short-wavelength and far infrared regions of the electromagnetic spectrum, wherein FIG. 4E (top left) specifically illustrates that before actuation, the corresponding (wrinkled) composite materials of the disclosure largely block the infrared radiation (i.e., heat) emitted by, for example, an underlying warm hand (with apparent temperature of ~26° C.), making it blend with its thermal surroundings, as confirmed by visualization with an infrared camera. The corresponding infrared spectra for the unactuated composites of the embodiments reveal a moderate average total transmittance of 27.6±1.1% (FIG. 4E, bottom left, solid line), a low average total reflectance of 10.4±0.1% (FIG. 4F, left, solid line), and a high average total absorptance of 61.9±1.2% (FIG. 4G, left, solid line). Furthermore, the total infrared transmittance for the composite materials of theses embodiments consisted of a large specular component of 19.9±1.0% and a smaller diffuse component of 7.7±0.1%, in a specular-to-diffuse transmittance ratio of ~2.5 (FIG. 4E, bottom left).

In contrast, in many embodiments, upon actuation (application of strain), the active surface area of the composite material increases, while the thicknesses decreases, and, as revealed by SEM and AFM images, the surface wrinkles are flattened into a quasi two-dimensional network of irregularly-shaped micron-scale domains (FIG. 4A, right, inset). More specifically, the corresponding AFM image analysis indicates that the substrates of these embodiments possess a RMS roughness of 15±1 nm and that the domains feature heights in the range of 20 to 60 nm and widths in the range of 300 nm to 1 μm (FIG. 4A, right, inset).

Regarding the optical properties within the visible to short-wavelength infrared regions of the electromagnetic spectrum, FIG. 4B further illustrates that after actuation, the corresponding "flattened" composite materials of the disclosure possess far more optically transparent larger active area, as can be gauged from visualization of the underlying logo with a digital camera (FIG. 4B, top right). The corresponding transmittance spectra (within the visible to short-wavelength infrared regions) for the actuated/strained composites of these embodiments reveal a higher average total transmittance of 91.7±0.2% (FIG. 4B, bottom right, solid line), a lower average total reflectance of 9.3±0.2% (FIG. 4C, right, solid line), and an almost negligible total absorptance (FIG. 4D, right). Accordingly, the total transmittance for the strained composite materials of theses embodiments consists of a dominant specular component of 90.2±0.2% and a small diffuse component of 1.5±0.1%, in a specular-to-diffuse transmittance ratio of ~60 (FIG. 4B, bottom right, solid line). Therefore, the mechanical actuation of the composite materials of the many embodiments reduces their total optical absorptance by over an order of magnitude and reversibly alters their specular-to-diffuse transmittance ratio by more than three orders of magnitude, although not to be bound by theory, possibly due to the dramatic change in surface morphology between the unactuated wrinkled and actuated flattened states (FIG. 4A).

Regarding the spectroscopic properties within the short-wavelength and far infrared regions of the electromagnetic spectrum, FIG. 4E further illustrates that after actuation, the corresponding "flattened" composite materials block less of the infrared radiation emitted by, for example, the underlying warm hand (with apparent temperature of ~30° C.), making it stand out from its thermal surroundings, as confirmed by visualization with an infrared camera (FIG. 4E, top right). The corresponding infrared spectra reveal a high average total transmittance of 53.5±0.6% (FIG. 4E, bottom right, solid line), a low average total reflectance of 13.4±0.2% (FIG. 4F, right, solid line), and a moderate average total absorptance of 33.1±0.4% (FIG. 4G, right). Furthermore, the total infrared transmittance consists of a large specular component of 48.8±0.5% and a smaller diffuse component of 4.7±0.5%, in a specular-to-diffuse transmittance ratio of ~10.4 (FIG. 4E, bottom right, solid line). Therefore, the mechanical actuation of the composite materials of the many embodiments simultaneously and reversibly decreases their total infrared absorptance by ~2-fold, although not to be bound by theory, possibly due to a reduction in the composite material's effective thickness, and reversibly increases the specular-to-diffuse transmittance ratio by ~4-fold, although not to be bound by theory, possibly due to the change in the composite material's surface morphology from wrinkled to flattened (FIG. 4A).

Overall, in many embodiments, the strain-induced morphological changes of the composite materials described herein are stable, rapid, and fully reversible, allowing for dynamic, yet robust control over the composite materials' microscale morphologies and, as a result, over their optical and spectroscopic properties in the visible to far infrared regions of the electromagnetic spectrum, with a mechanical stimulus. In some embodiments the composite materials of the disclosure are used as adaptive camouflage platforms across a broad spectral window.

Figure 5A:
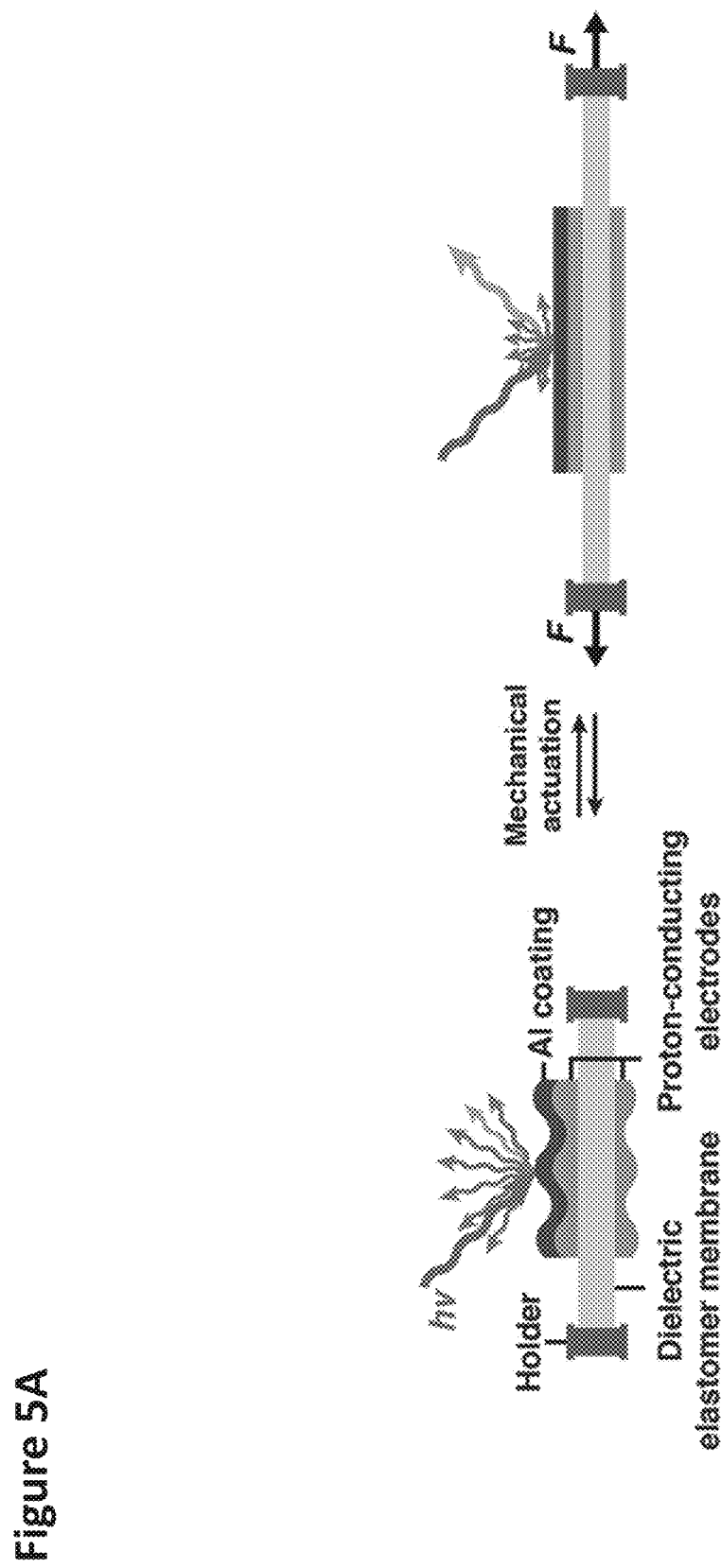
FIGS. 5A-5O illustrate various properties of unactuated and mechanically actuated adaptive composite materials with a broadband infrared-reflecting coating in accordance with embodiments of the application by providing: a schematic for mechanical actuation (5A), along with digital camera images (5B); optical microscopy images (5C); scanning electron microscopy images (5D); infrared reflectance (5E, 5H, 5I, 5J, 5M), transmittance (5F, 5K, 5N), and a bsorptance (5G, 5I, 5O) spectra, illustrating the effects of the mechanical modulation of the adaptive broadband infrared-reflecting systems in accordance with embodiments of the application; wherein FIGS. 5H and 5I further illustrate the angular dependence of modulation effects
Figure 5B:
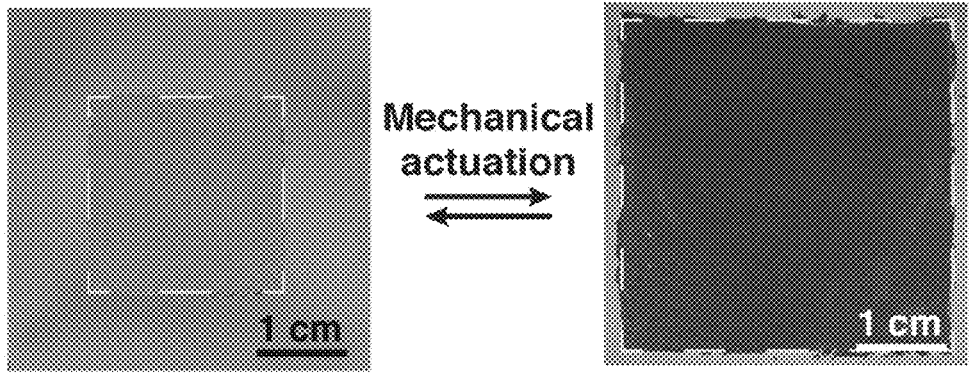
Figure 5C:
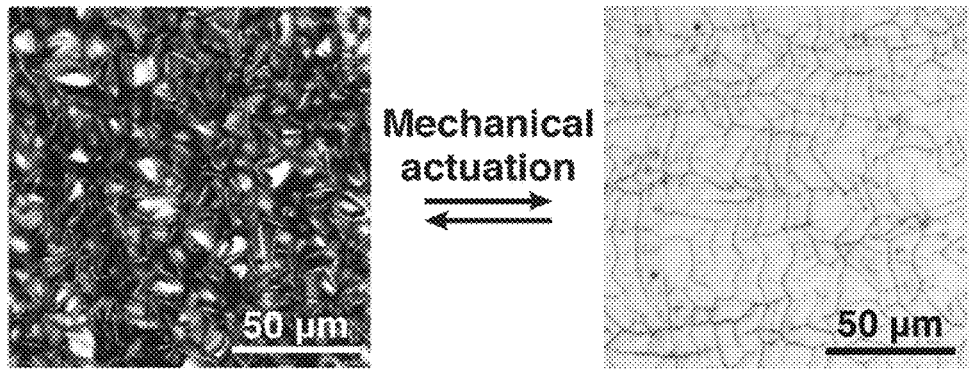
Figure 5D:
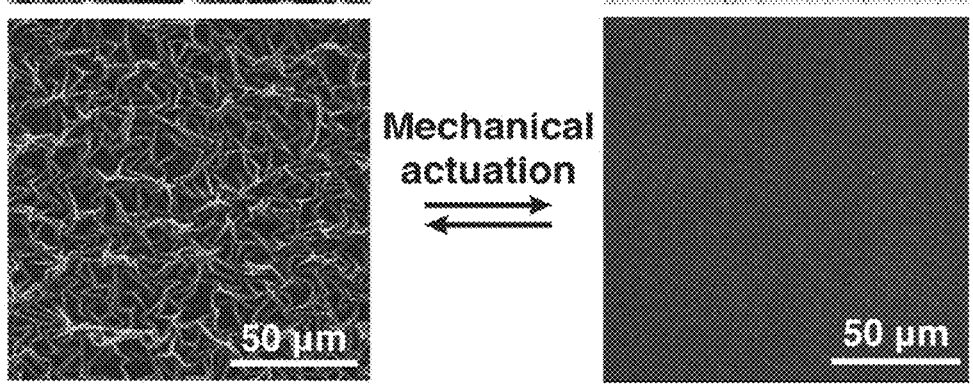
Figure 5E:
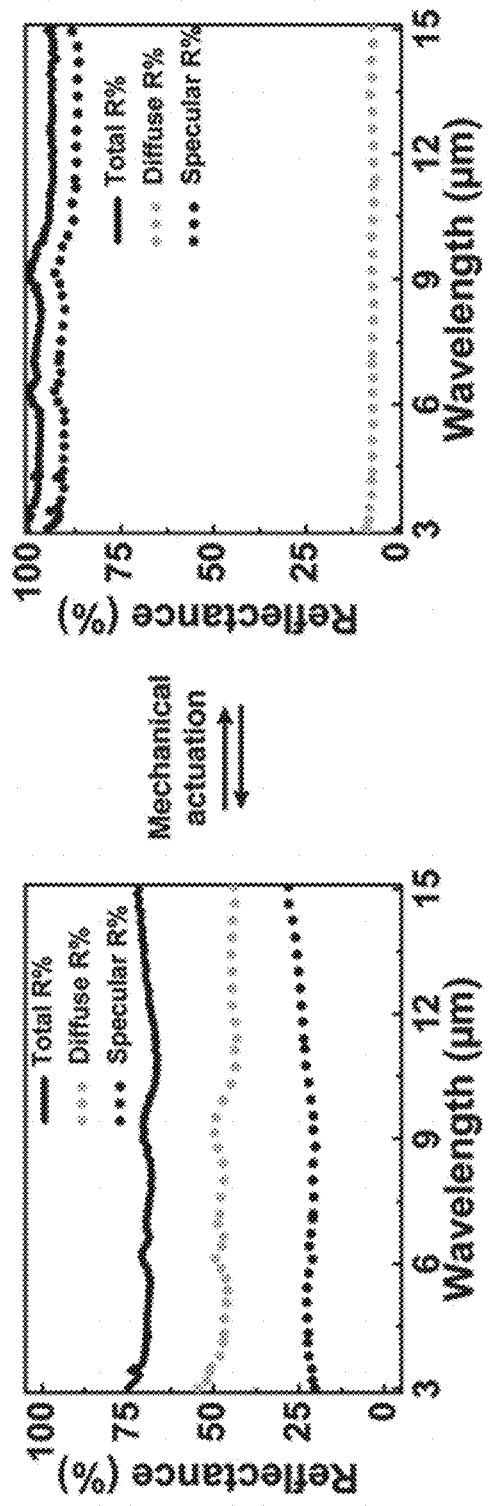
Figure 5F:
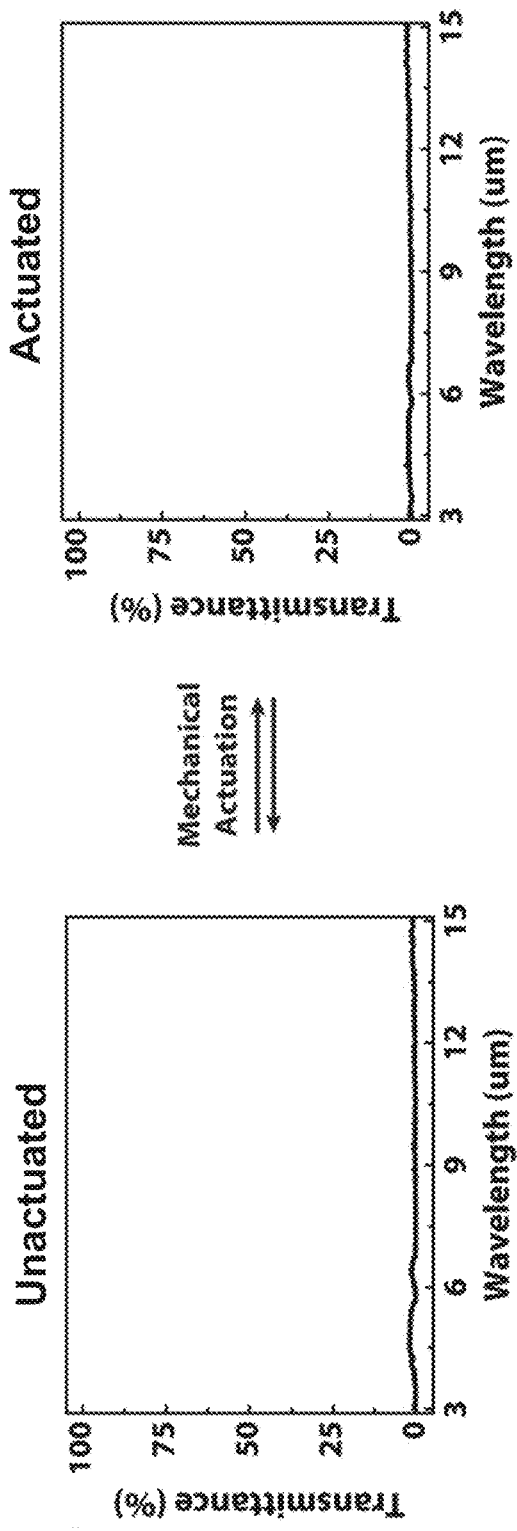
Figure 5G:
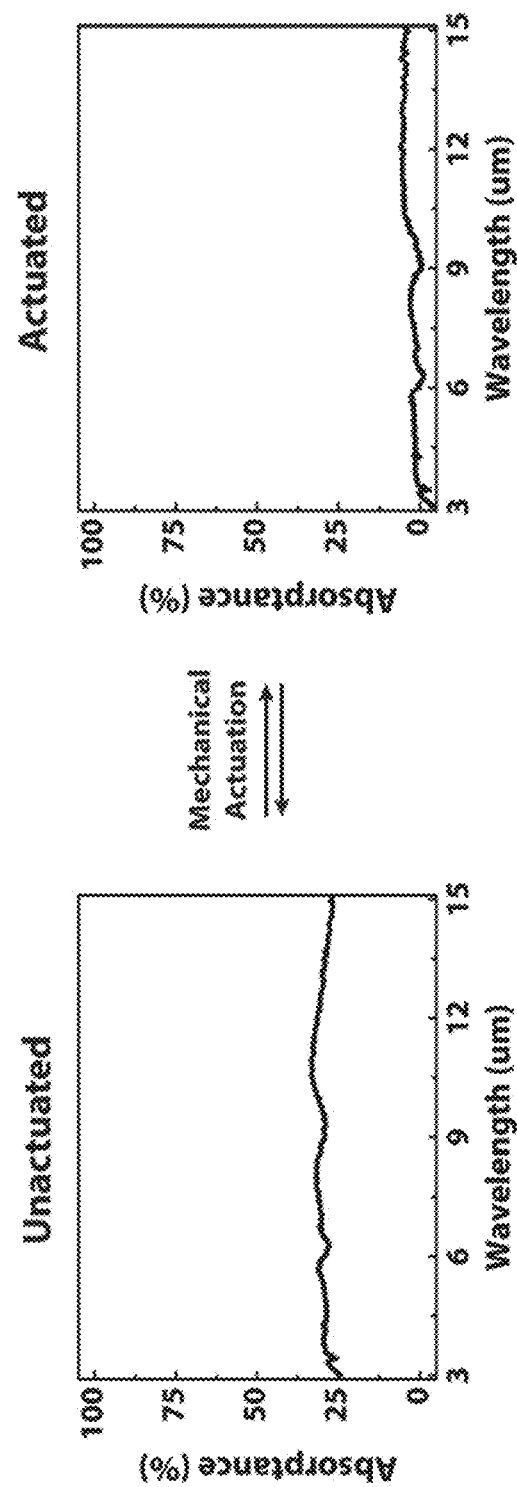
Figure 5H:
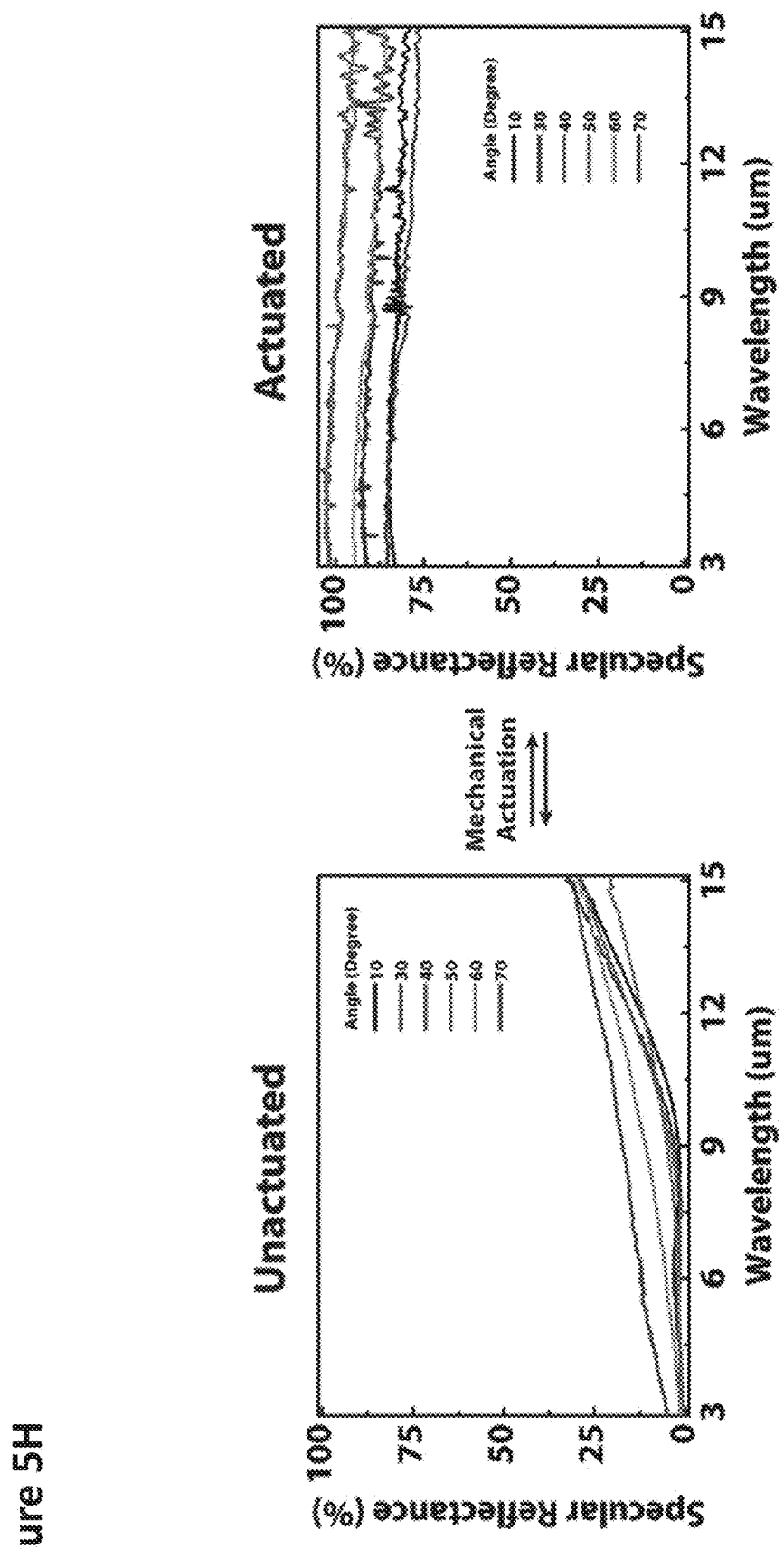
Figure 5I:
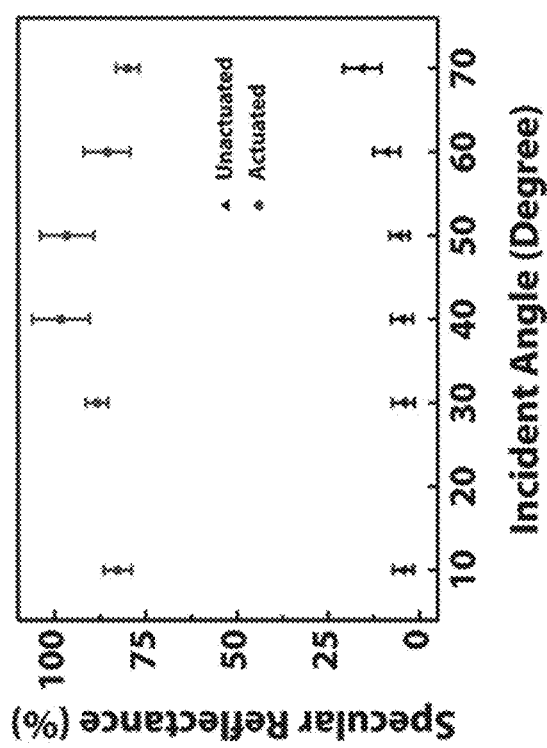
Figure 5J:
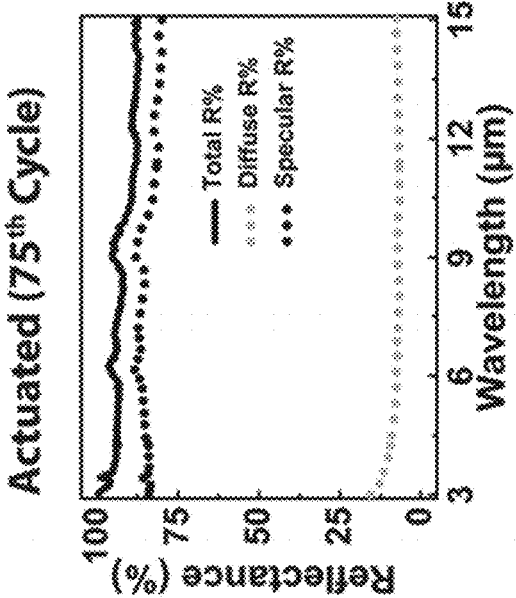
Figure 5J:
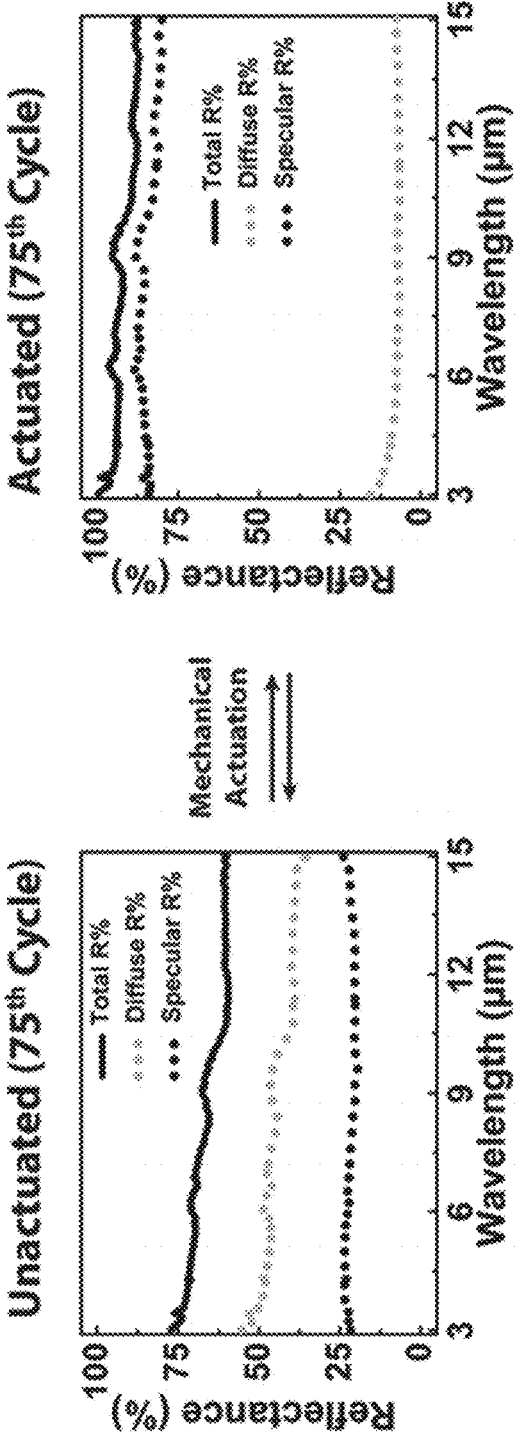
Figure 5K:
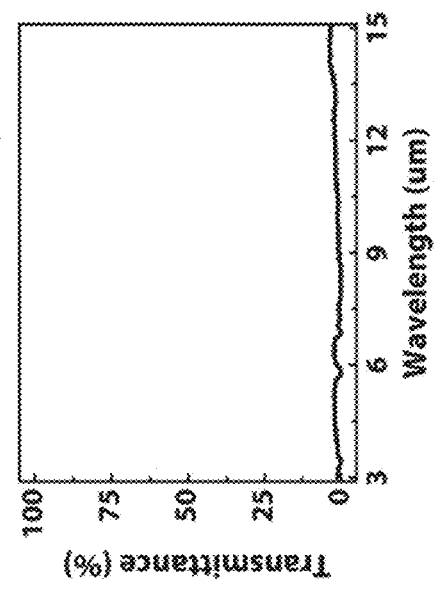
Figure 5K:
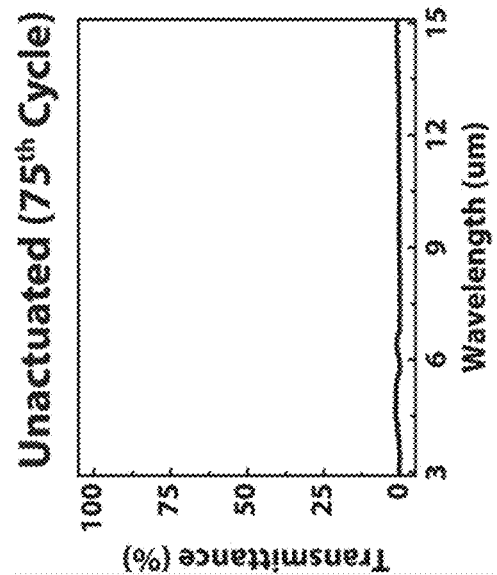
Figure 5L:
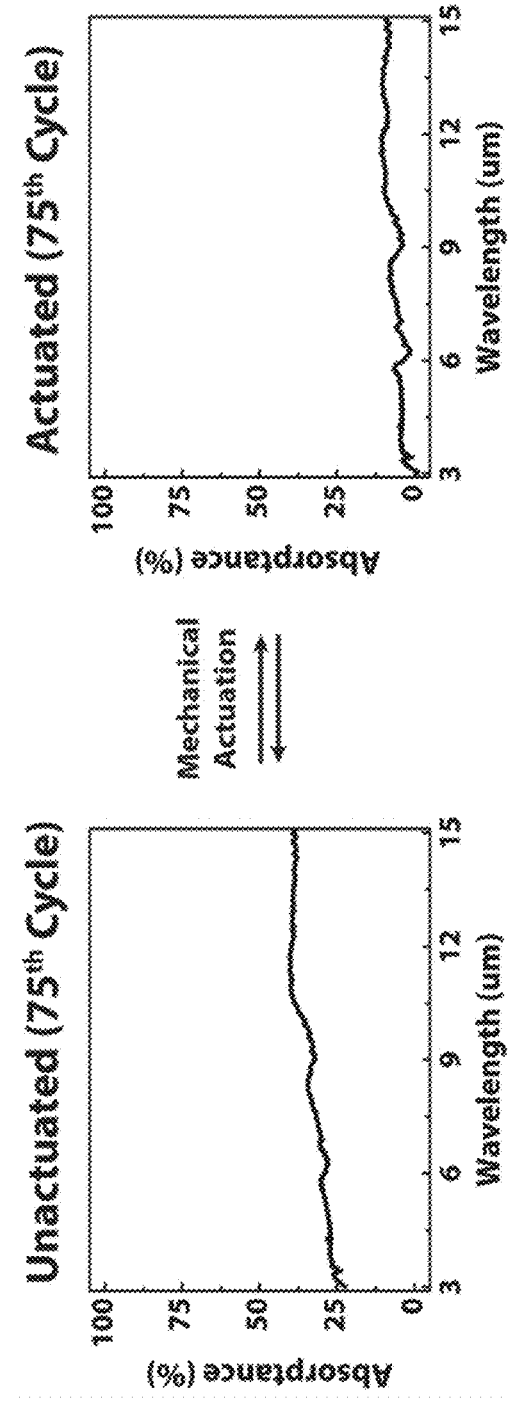
Figure 5M:
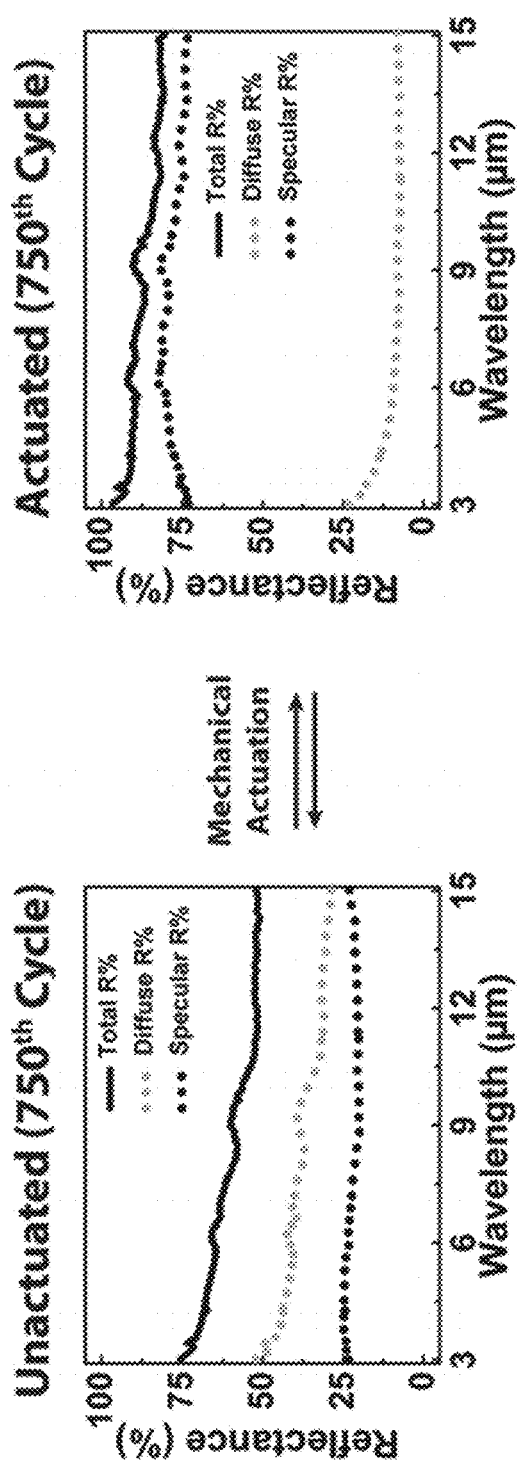
Figure 5N:
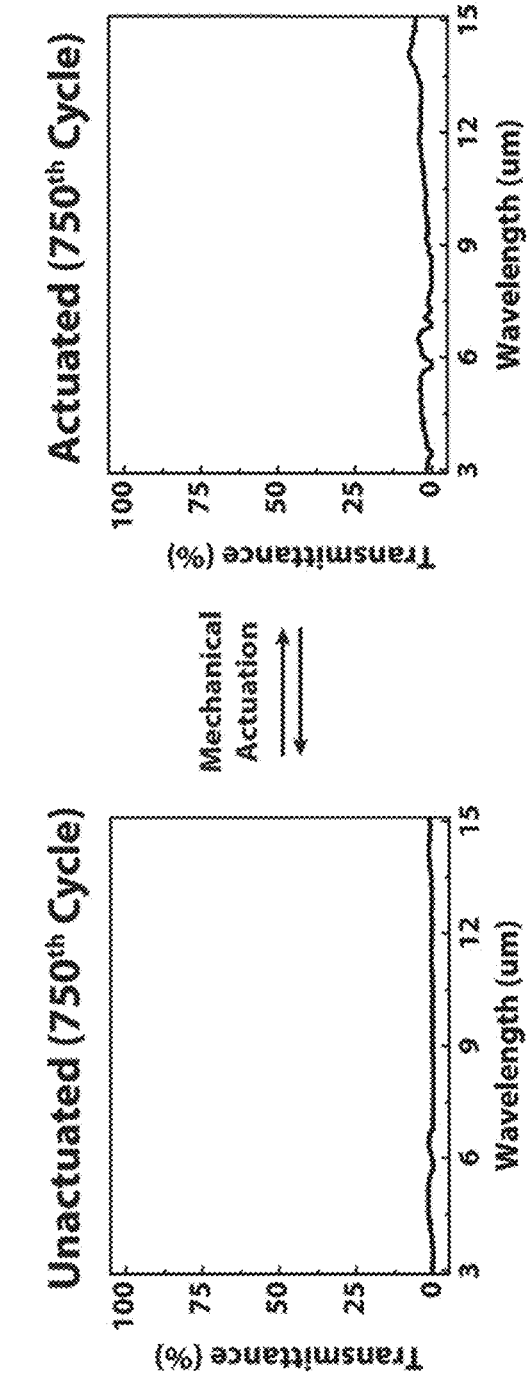
Figure 5O:
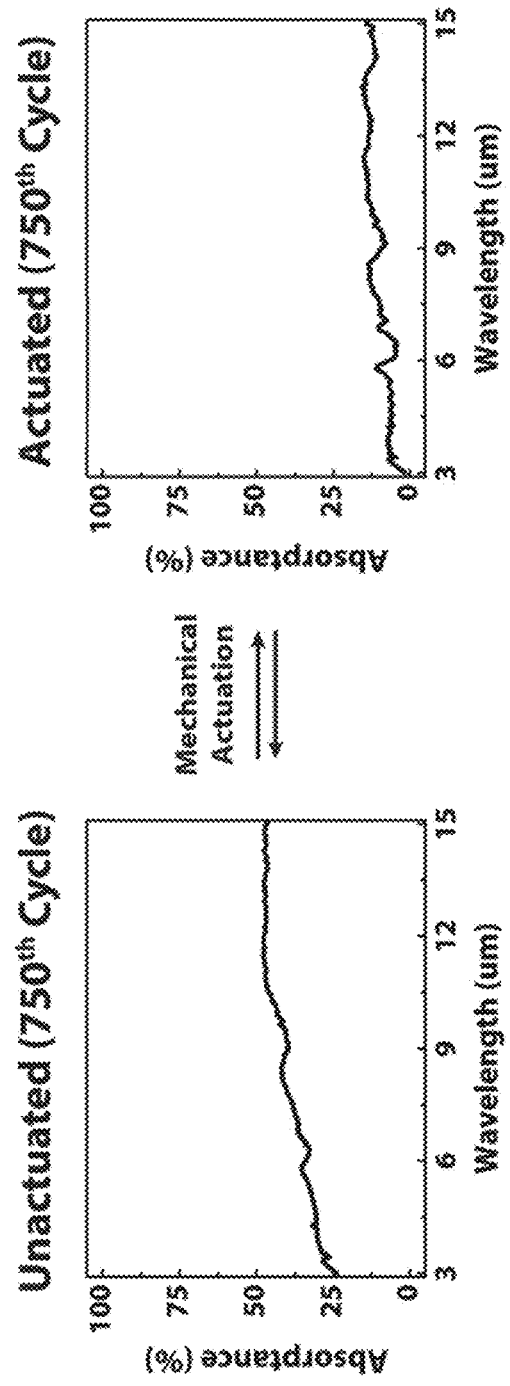

FIGS. 5A-5O illustrate the effects of mechanical actuation on the properties of the adaptive reflecting composite material comprising one active area featuring a broadband infrared-reflecting coating (i.e., aluminum, copper, or another metal, or a combination thereof) prepared according to the embodiments of the instant application (FIGS. 3B and 5A). In many embodiments, prior to mechanical actuation, the active area of these coated composite materials possesses a relatively small surface and relatively large thickness, as revealed by the digital camera image (FIG. 5B, left, wherein the dashed lines indicate the active area), with its surface covered by a dense three-dimensional network of micron-sized wrinkles, as revealed by optical microscopy (FIG. 5C, left) and scanning electron microscopy (FIG. 5D, left). The corresponding infrared spectra (FIGS. 5E-5G) show that the unactuated active area features a high average total reflectance of 71±(3) % (FIG. 5E, left), a low average total transmittance of <1% (FIG. 5F, left), and a moderate average total absorptance of 28±(2) % (FIG. 5G left). Furthermore, for the wrinkled (unactuated) active area, the total reflectance features a weak average specular component of 23±(1) % and a dominant average diffuse component of 48±(2) %, in a ratio of ~0.5 (FIG. 5E, left).

In contrast, upon mechanical actuation, the surface area of the adaptive coated composite material increases, while the thicknesses decreases as revealed by the digital camera image (FIG. 5B, right, wherein the dashed lines indicate the active area), with the wrinkles flattened into a quasi two-dimensional network of irregular domains, as revealed by optical microscopy (FIG. 5C, right) and scanning electron microscopy (FIG. 5D, right). The corresponding infrared spectra (FIGS. 5E-5G) show that the actuated active area features an increased average total reflectance of 96±(1) % (FIG. 5E, right), a low average total transmittance of <1% (FIG. 5F, right), and a low average total absorptance of 3±(1) % (FIG. 5G, right). Furthermore, for the flattened active area, the total reflectance features a much larger average specular component of 88±(3) % and a smaller average diffuse component of 8±(2) %, in a ratio of ~11 (FIG. 5E, right). Therefore, as shown for the composite materials of the application, mechanical actuation dynamically modulates both the specular to diffuse reflectance ratios (due to the change in the morphology) and the overall absorptance (due to the change in the thickness) of its active area by approximately an order of magnitude. In addition, the specular component of the reflectance exhibits a weak angular dependence in the active area's' unactuated and actuated states (FIGS. 5H-5I). Furthermore, the changes in the infrared-reflecting properties of the active area are consistent and fully reversible upon repeated actuation, with no physical delamination and only minor performance degradation observed after 75 and 750 cycles (FIGS. 5J-5L and FIGS. 5M-5O, respectively). Accordingly, in many embodiments, the strain actuation of the adaptive infrared-reflecting materials and systems of the application induces a change in the microstructures of their active area and enables concomitant reversible, angle-independent, and stable modulation of the broadband reflectance (and absorptance) within the short- to long-wavelength infrared region.

Figure 6A:
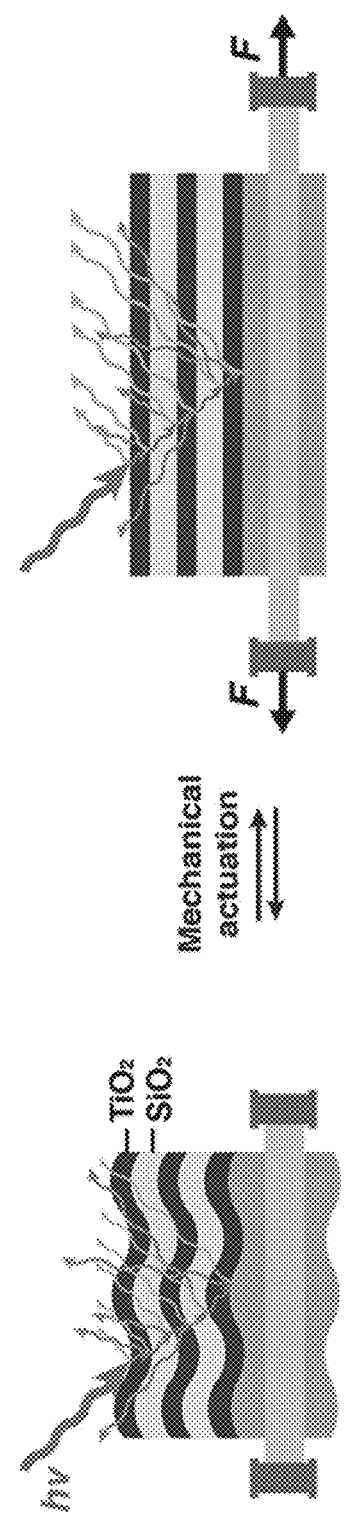
FIGS. 6A-6E illustrate various properties of unactuated and mechanically actuated adaptive composite materials with a narrowband infrared-reflecting coating in accordance with embodiments of the application by providing: a schematic for mechanical actuation (6A), along with data from infrared reflectance measurements (6B-6E) illustrating the effects of mechanical modulation of the adaptive narrowband infrared-reflecting systems in accordance with embodiments of the application; and wherein FIG. 6E further illustrates the system's stability under repetitive modulation, specifically after 100 cycles.
Figure 6B:
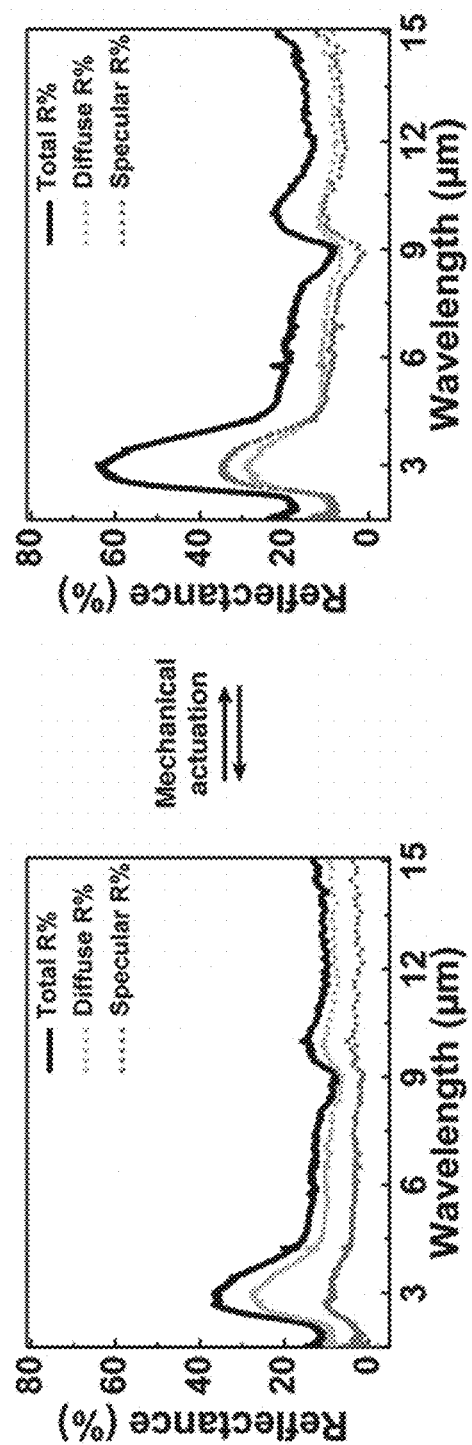
Figure 6C:
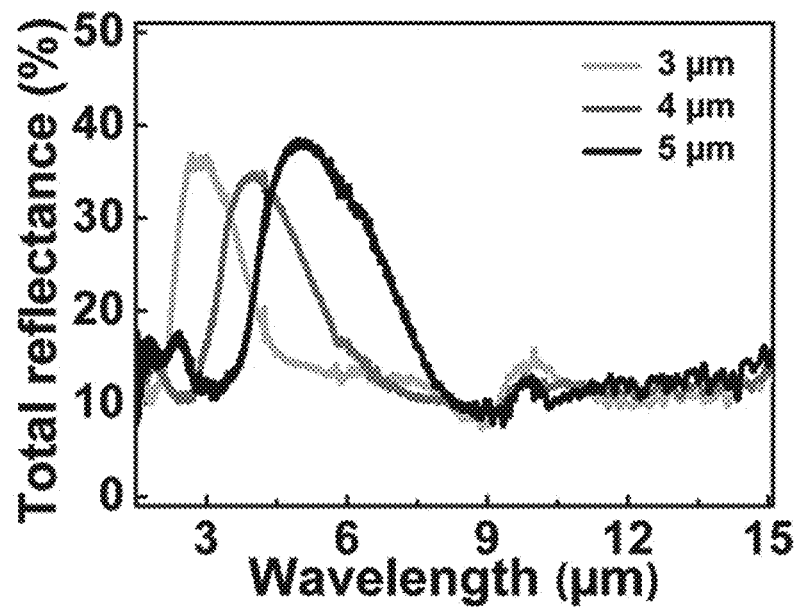
Figure 6D:
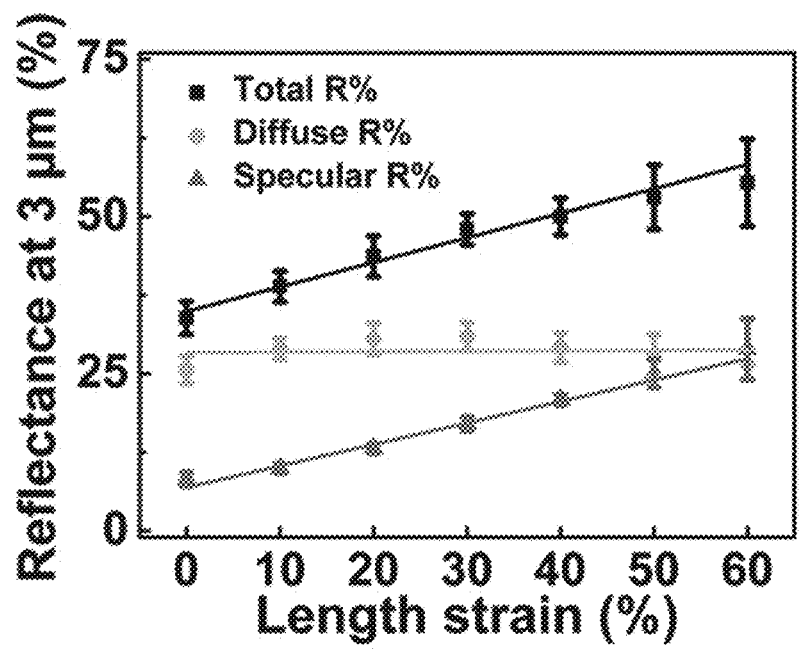
Figure 6E:
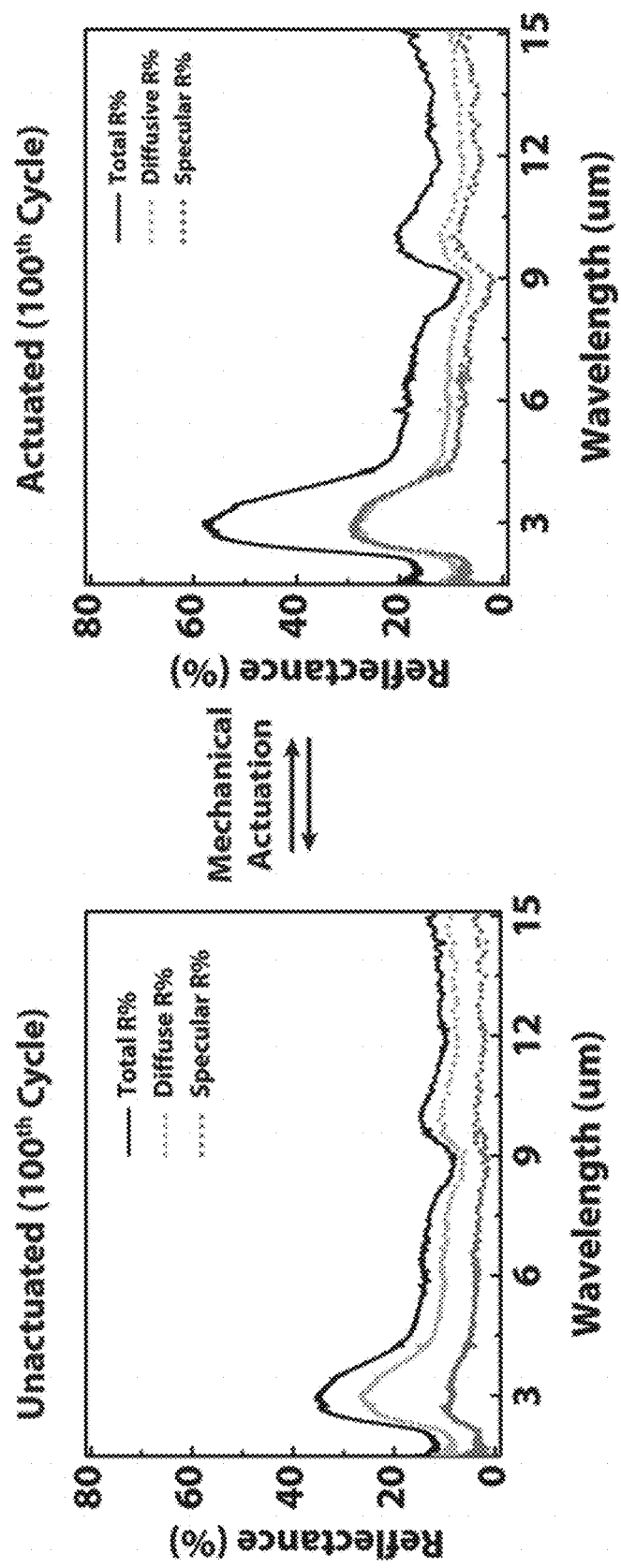

FIGS. 6A-6D illustrate the effects of actuation (e.g., induced equiaxial strain) on the properties of the adaptive composite material comprising one active area with a narrowband infrared-reflecting coating (i.e., Bragg stack) prepared according to the embodiments of the instant application (FIGS. 3C and 6A). In such embodiments, infrared-reflective coatings comprised of a Bragg stack (i.e. alternating $TiO_2$ and $SiO_2$ layers with thicknesses of $\lambda_{peak}/(4*n_{TiO2})$ and $\lambda_{peak}/(4*n_{SiO2})$, wherein $n_{TiO2}$ and $n_{SiO2}$ are the refractive indices), are used to obtain reflectances that feature peak wavelengths ($\lambda_{peak}$) in the mid-wavelength infrared region of the electromagnetic spectrum. In many embodiments, this approach furnishes adaptive IR-reflecting active areas with peak reflectance intensities at wavelengths of 3, 4, and 5 microns (FIG. 6C). In many embodiments, the optical properties of the adaptive narrowband infrared-reflecting active areas respond to the applied strain in a fashion similar to their adaptive broadband infrared-reflecting counterparts described herein. Accordingly, in many embodiments, prior to actuation, the adaptive narrowband infrared-reflecting active area possesses a microstructured (wrinkled) and relatively thick active area (FIG. 6A, left). The infrared spectra obtained for the active area prior to the actuation features peak total reflectance intensities of 34±(3) % at a wavelength of 3 microns, with a weak specular component of 8±(1) % and a dominant diffuse component of 26±(2) % in a ratio of ~0.3 (FIG. 6B, left). However, upon actuation, the infrared spectra of the now flattened and relatively thinner active area features increased peak total reflectance intensities of 55±(7) % at a wavelength of 3 microns, with a much larger specular component of 29±(5) % and a nearly unchanged diffuse component of 26±(2) % in a ratio of ~1.1 (FIG. 6B, right). In general, the total reflectance of the active area at specific wavelengths increases as a function of the strain (while the corresponding total absorptance decreases) (FIG. 6D). Interestingly, the reflectance's specular component likewise increases with the strain, but the diffuse component remains relatively unaffected (FIG. 6D). Moreover, the changes in active area's properties are fully reversible, with only minor performance degradation observed after over a hundred actuation cycles (FIG. 6E). Accordingly, in many embodiments, the strain inducing actuation of the active areas within adaptive reflecting materials and systems of the application directly induces dynamic modulation of their reflectance within a specific narrow wavelength range of a specific specular region (e.g., the infrared region).

Figure 7A:
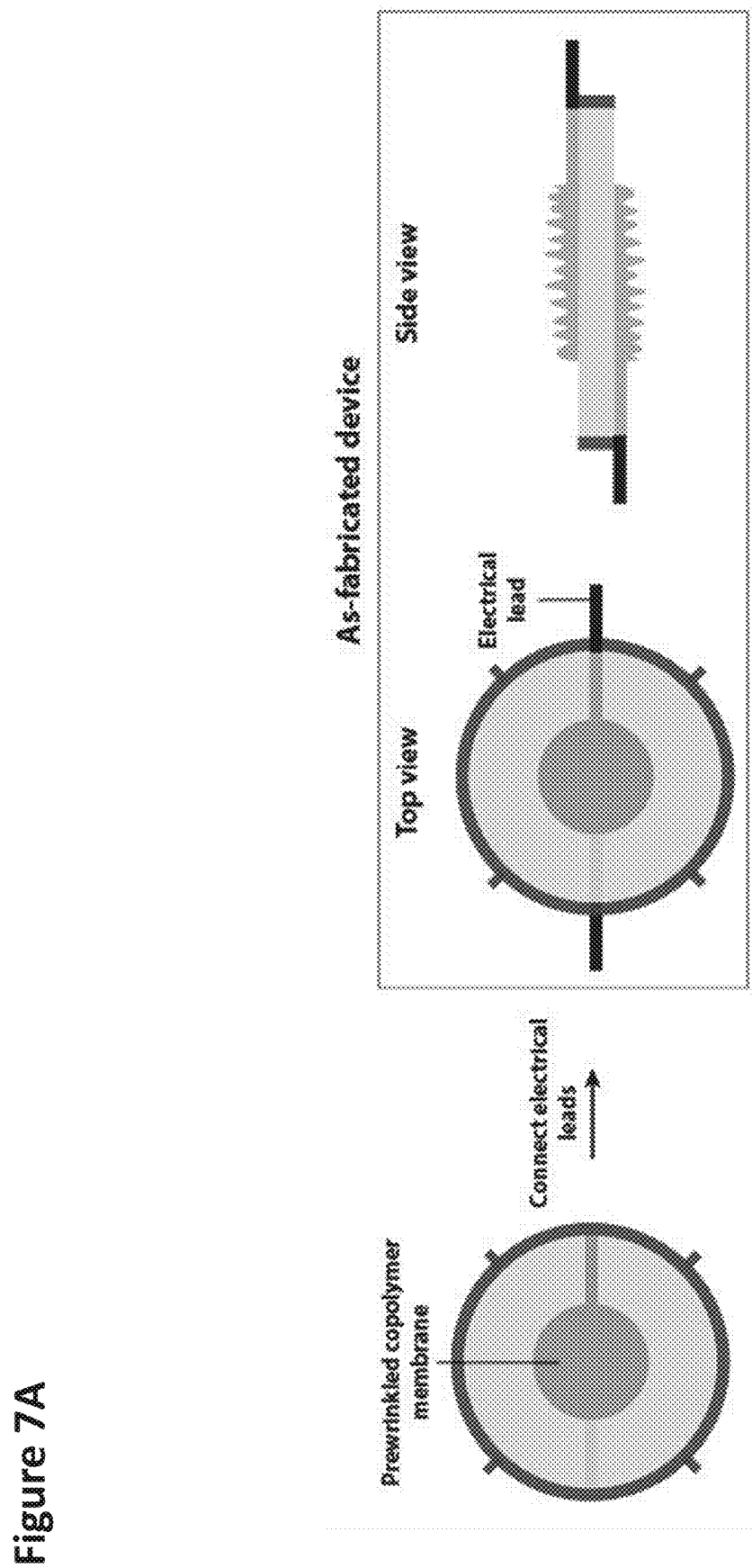
Figure 7B:
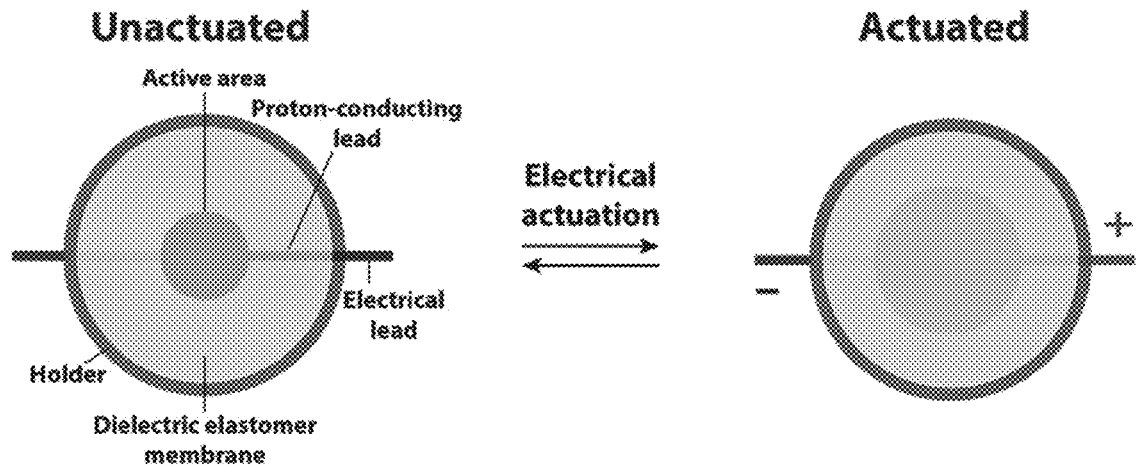
FIGS. 7B-7G illustrate electrical actuation and properties of unactuated and electrically actuated devices in the visible and infrared ranges of the electromagnetic spectrum in accordance with embodiments of the application by providing: a schematic for electrical actuation (7B); a plot of the areal strain as a function of the applied voltage for the fabricated devices (7C); a plot of the areal strain as a function of time (7D); a schematic and digital camera visualization of electrical actuation of a device (7E); a schematic and infrared camera visualization of electrical actuation of a device (7F); and a plot of the apparent temperature at the same spot under infrared camera as a function of actuation cycle number during electrical actuation (7G).
Figure 7C:
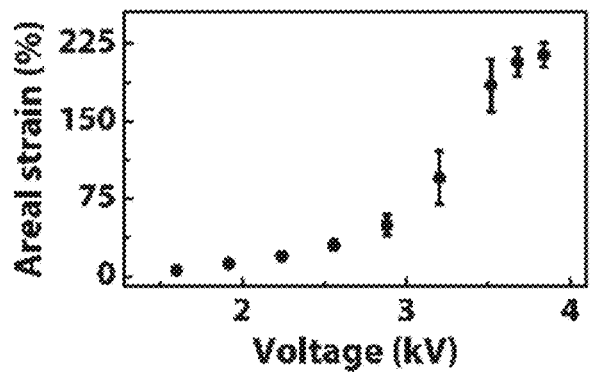
Figure 7D:
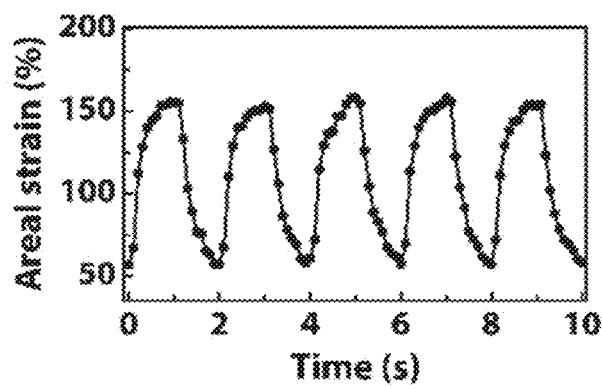

FIGS. 7A-7X illustrate manufacturing, electrical actuation, and electromechanical properties of adaptive composite material comprising one active area with a variable multispectral transmittance and reflectance assembled in a dielectric elastomer actuator configuration according to the embodiments of the invention. In many embodiments, the adaptive composite materials for electrical actuation are fabricated according to the schemes provided in FIG. 3A (initial pre-assembly steps) and 7A (final steps), wherein two proton or ion-conducting electrode/texturizing membranes sandwich an elastomer layer and are contacted with electrical leads within an adjustable support holder. In many such embodiments, the application of a voltage between the electrode membranes induces electrostatic pressure on the elastomer layer, thereby causing its active area to rapidly decrease in thickness and increase in size (FIG. 7B) (see: J. Biggs et al., Electroactive Polymers: Developments of and Perspectives for Dielectric Elastomers. Angew. Chemie Int. Ed. 52, 9409-9421 (2013); F. Carpi, Electromechanically Active Polymers (Springer, 2016), the disclosures of are incorporated herein by reference). In many embodiments, the resulting device's areal strain features an exponential dependence on the applied voltage, with a maximum value of 214±11% at a bias of ~3.8 kV (FIG. 7C). Furthermore, in many embodiments, the resulting device's response time (defined as the rise time from 10% to 90% of the areal strain change during a cycle) is relatively fast with a value of 570±80 ms and consistent across multiple actuation cycles under a 0.5 Hz-frequency square waveform (maxima at ~3.5 kV and minima at 0 kV) (FIG. 7D).

Figure 7E:
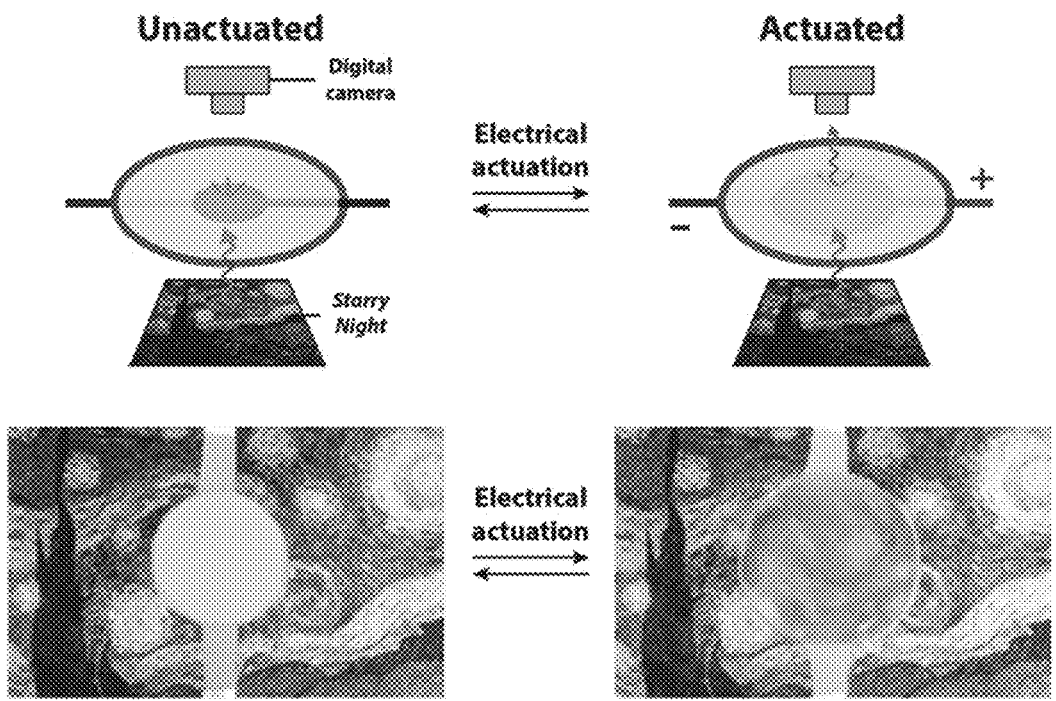

FIG. 7E demonstrates electrical actuation of the devices comprising adaptive composite materials of the instant disclosure and the change in their optical properties upon actuation. Accordingly, FIG. 7E (left) shows that before electrical actuation, the device of the embodiments has a relatively small active area that is visually opaque, as can be gauged from a standard digital camera image of the underlying picture, wherein the unactuated active area completely obscures the portion of the picture it overlays. Not to be bound by any theory, the visual opaqueness of the unactuated device of the embodiments is presumably due to its minimal visible specular transmittance in the wrinkled state. Upon electrical actuation, the active area of the same device of the embodiments becomes larger (expands) and more transparent, as confirmed by a standard digital camera image of the underlying picture, wherein the actuated (strained) active area mostly reveals the portion of the picture it overlays (FIG. 7E, right). Not to be bound by any theory, the visual transparency of the actuated device of the embodiments is presumably due to its substantially increased visible specular transmittance in the flattened state. In many embodiments, the changes in the visible appearance of the devices comprised of the composite materials of the instant disclosure are fully reversible and remain consistent over hundreds of actuation cycles.

Figure 7F:
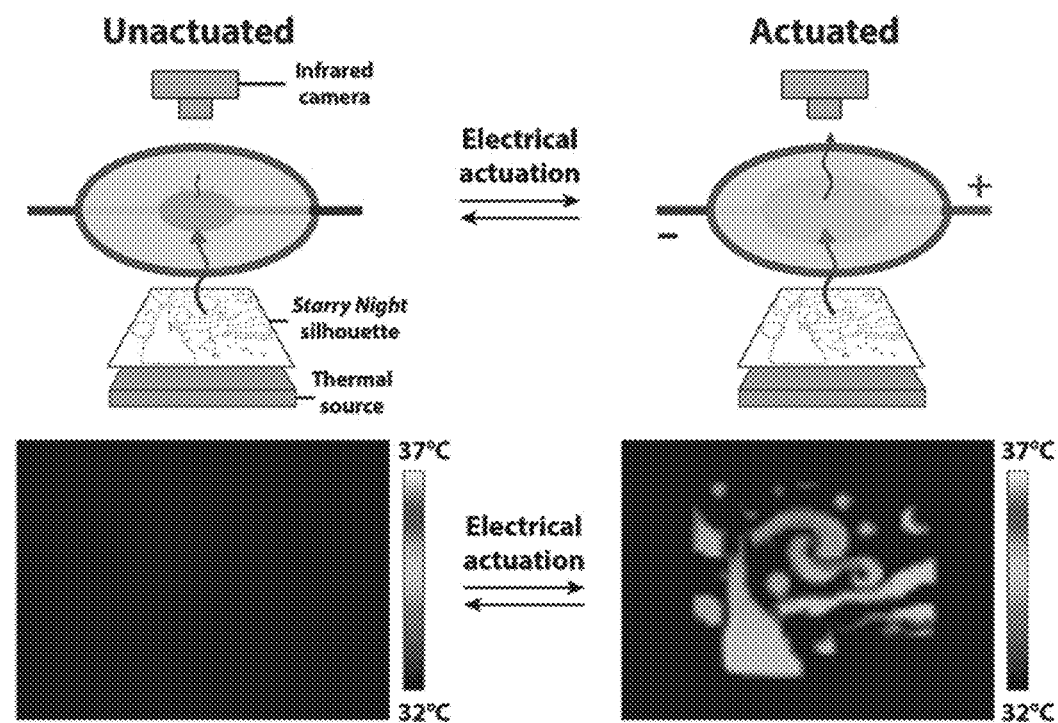
Figure 7G:
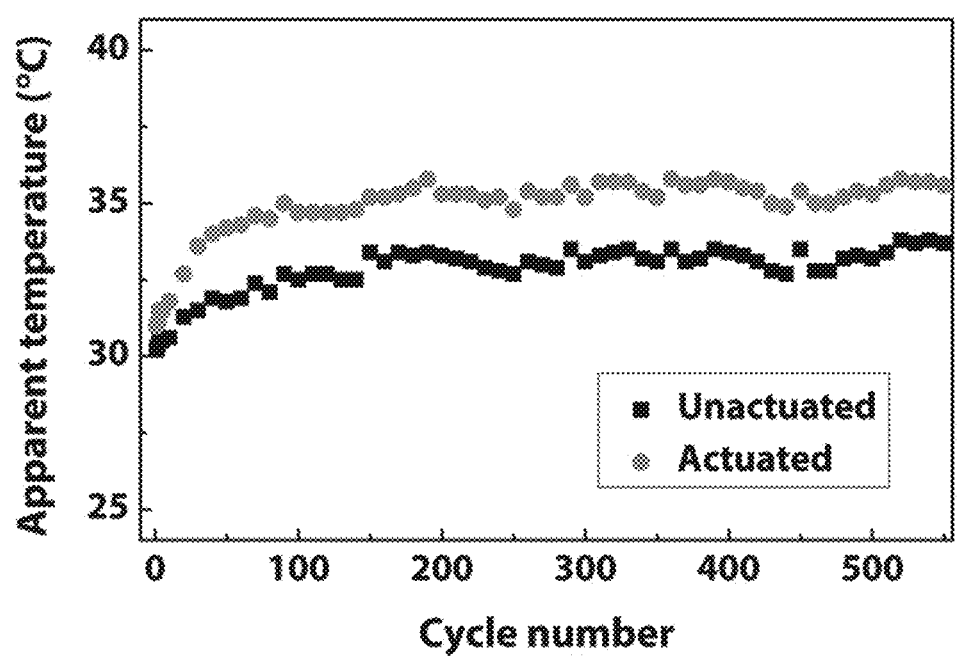

FIG. 7F demonstrates electrical actuation of the devices comprising adaptive composite materials of the instant disclosure and the change in their infrared-transmitting properties upon actuation. Accordingly, FIG. 7F (left) shows that prior to electrical actuation, the device of the embodiments has a relatively increased thickness, which blocks the infrared radiation (i.e., heat) emitted by the thermal source placed under a designer silhouette cut out from a material that blocks infrared radiation and overlaid by the device of the embodiments and makes the silhouette almost indistinguishable from the surrounding environment, as visualized by an infrared camera. Not to be bound by any theory, the infrared opaqueness of the unactuated device of the embodiments is presumably due to the device's relatively lower infrared transmittances and higher infrared absorptances in the wrinkled state. However, upon electrical actuation, the active area of the same device expands and thins out, transmitting some of the infrared radiation emitted by the thermal source through the intervening silhouette, and allowing for the silhouette to develop against its surrounding thermal environment, as evidenced by infrared imaging, (FIG. 7F, right). Not to be bound by any theory, the infrared transparency of the actuated device of the embodiments is presumably due to the device's increased infrared transmittances and decreased infrared absorptances in the flattened state. In many embodiments, the changes in the thermal appearance of the devices comprised of the composite materials of the instant disclosure are fully reversible and remained consistent over hundreds of actuation cycles (FIG. 7G). Therefore, in many embodiments, the devices comprising adaptive composite materials of the instant disclosure function as electrically-actuated camouflage platforms over a broad spectral range.

Figure 8A:
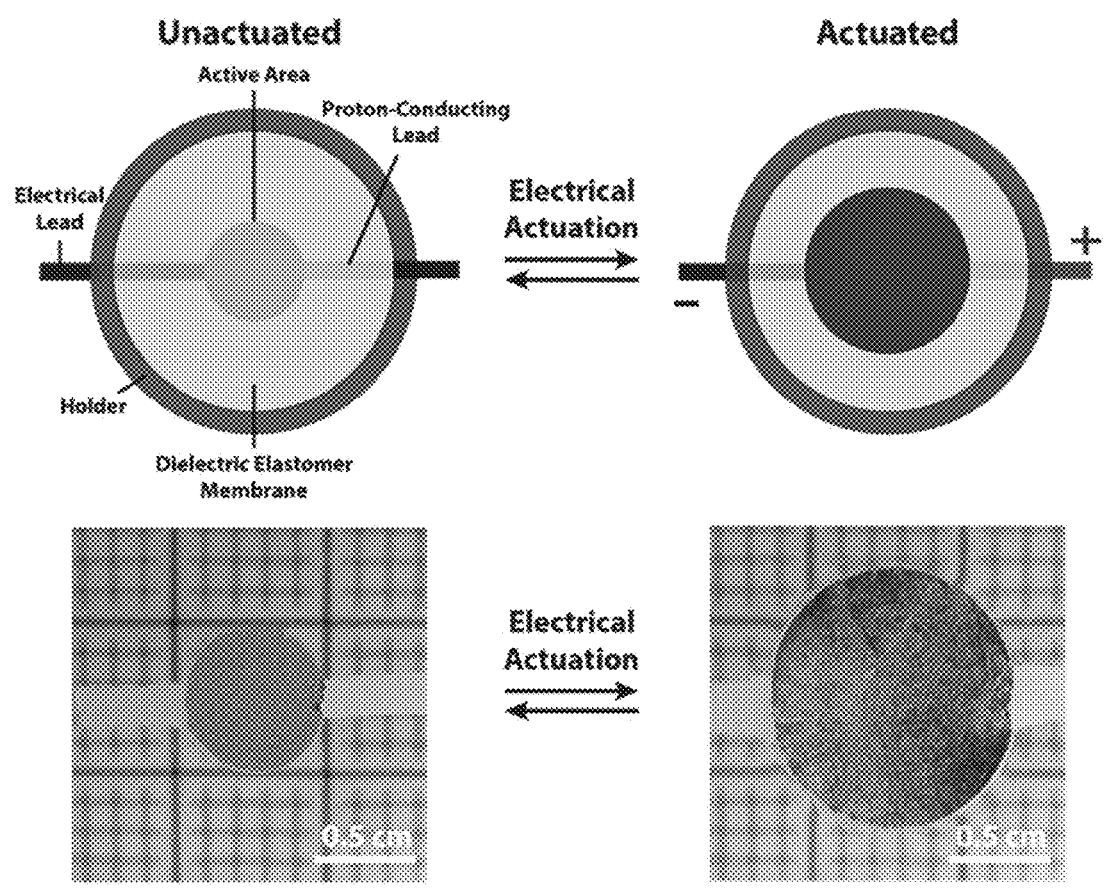
FIGS. 8A-8D provide a schematic (8A, top) and a digital camera image (8A, bottom), along with experimental data (8B-8D), illustrating the effects of electrical modulation of the adaptive broadband (metal-modified) infrared-reflecting systems in accordance with embodiments of the application.
Figure 8B:
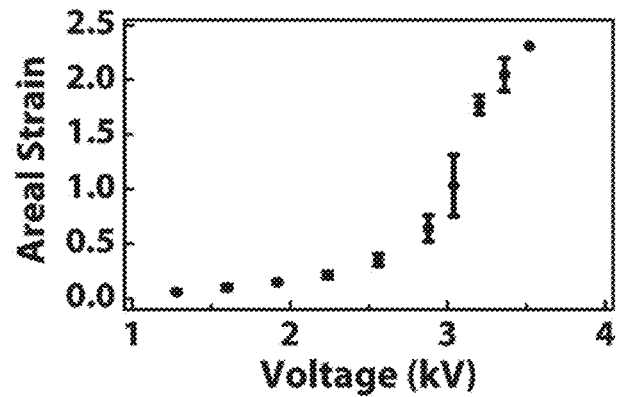
Figure 8C:
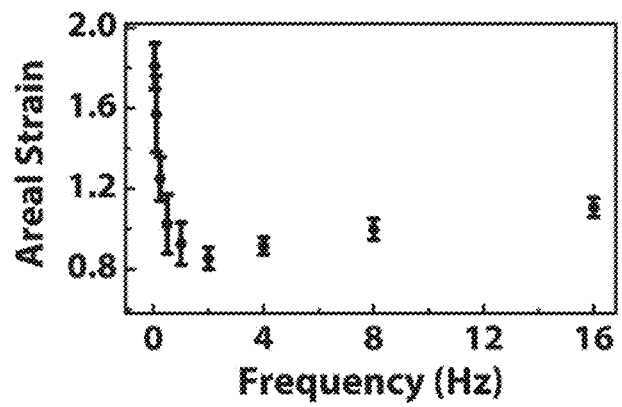
Figure 8D:
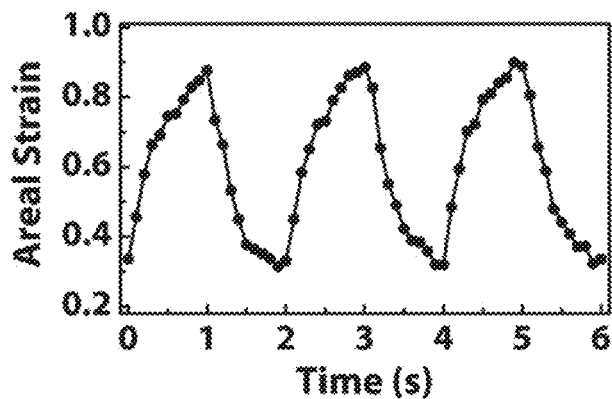

FIGS. 8A through 8D illustrate electrical actuation of an adaptive infrared-reflecting composite materials comprising one active area with a broadband infrared-reflecting coating assembled in a dielectric elastomer actuator configuration according to the embodiments of the invention. According to many embodiments, such active area possesses a relatively small wrinkled surface prior to electrical actuation (FIG. 8A, left), but a larger flattened surface after electrical actuation (FIG. 8A, right). In many such embodiments, the areal strain demonstrates an exponential dependence on the applied voltage, with an applied voltage of ~3.5 kV resulting in a maximum strain of ~230% (FIG. 8B). In addition, in many embodiments, the areal strain exhibits a distinct dependence on the frequency of the applied voltage, e.g. a variable-frequency square waveform (minimum of 0 kV and maximum of 3.2 kV) induced a drop in the strain from 181±(11) % to 85±(5) % between frequencies of 0.05 Hz and 2 Hz, followed by an increase in the strain to 110±(5) % (FIG. 8C). Moreover, in many embodiments, for the aforementioned square waveform at a frequency of 0.5 Hz, the active area's response time (defined as the rise time from 10% to 90% of the maximum strain) is 720±(50) ms, due to the quite rapid areal expansion and shrinkage rates of 55.8±(1.6) %/s and 56.8±(0.8) %/s, respectively (FIG. 8D), and the energy associated with the active area actuation during one typical cycle was estimated to be ~8 J/m². Accordingly, the figures of merit demonstrated by the adaptive broadband infrared-reflecting composite material of the application are identical to or exceeded those reported for acrylate dielectric elastomer-based devices with conventional ionic hydrogel, carbon grease, or conductive nanowire composite electrodes.

Figure 9A:
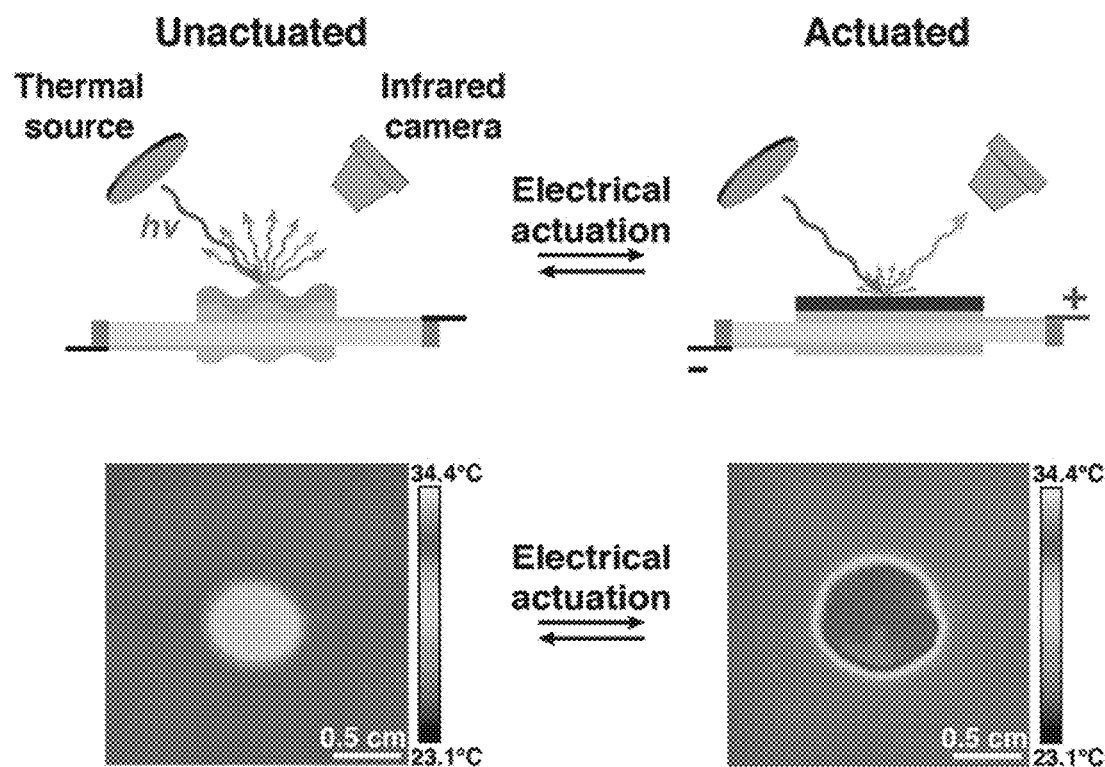
FIGS. 9A-9E provide schematics of the assembly and electrical modulation of single (9A) and multiplexed (9B-9E) adaptive broadband (metal-modified) infrared-reflecting systems, wherein FIGS. 9A (top), 9B (top), and 9D comprise schematic depictions of the systems.
Figure 9B:
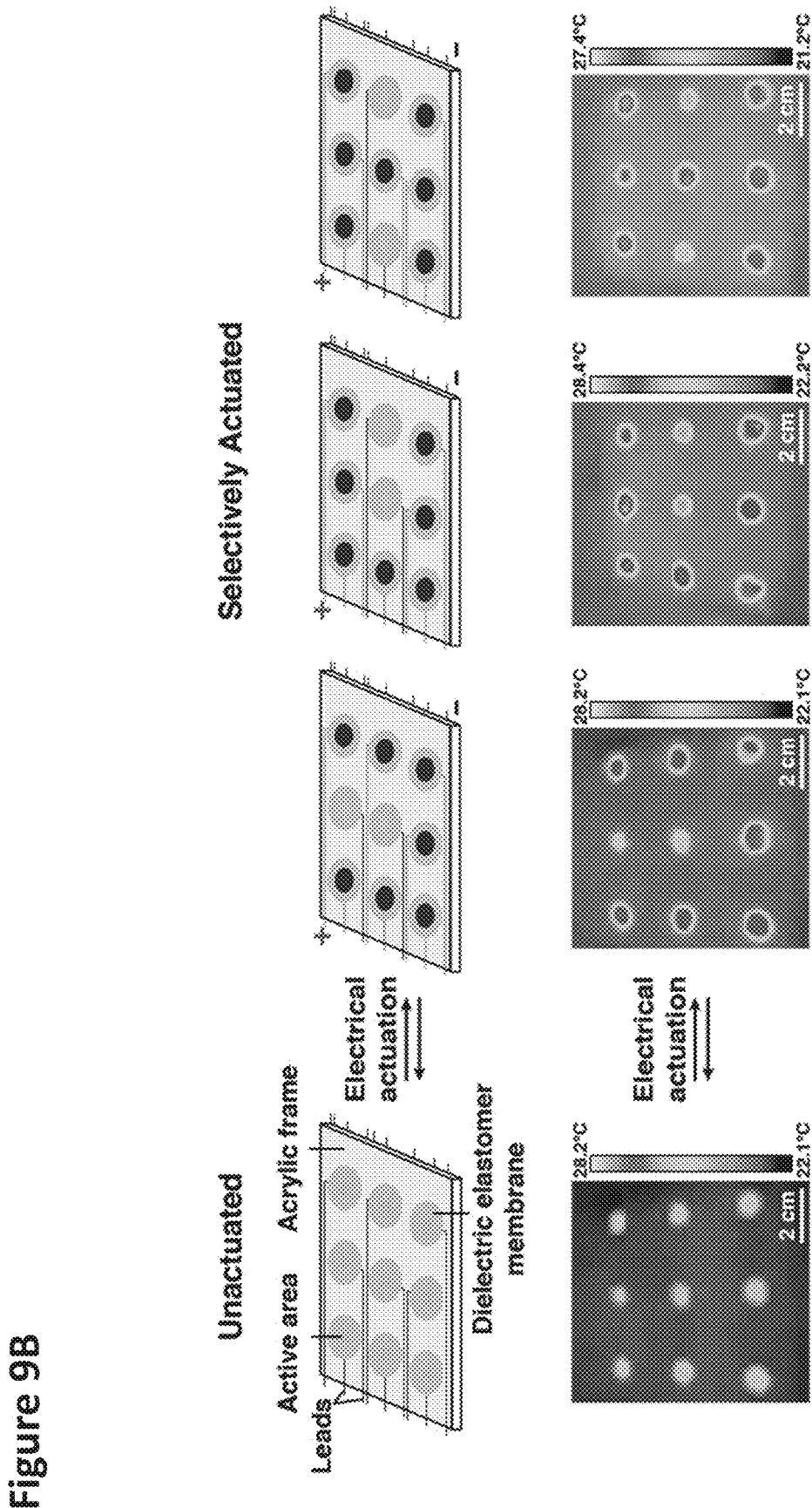
Figure 9C:
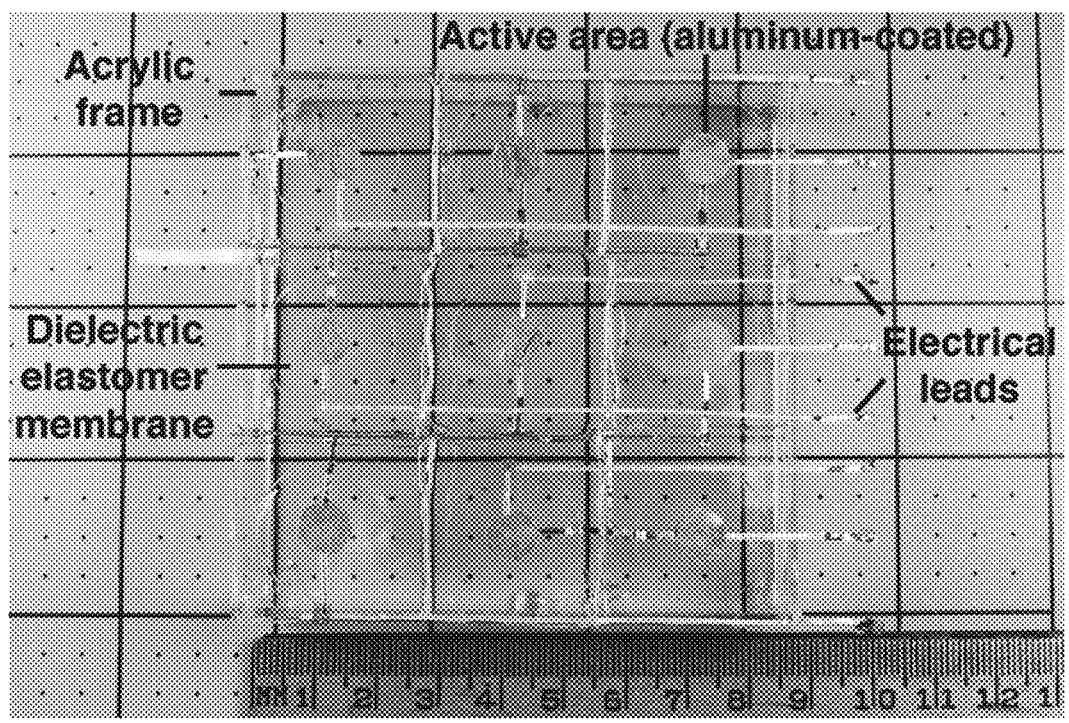
Figure 9D:
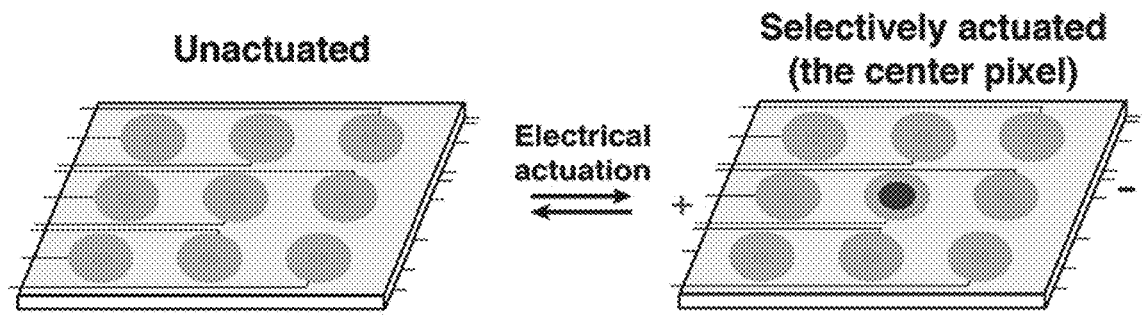

FIGS. 9A-9E illustrate the electrical modulation of the infrared-reflecting properties of multiplexed adaptive systems according to many embodiments of the invention. In many such embodiments, the adaptive infrared-reflecting system of the application is comprised of an array of multiple discrete active areas, wherein each active area serves as an independently-addressable "pixel." FIGS. 9A and 9B illustrate, both schematically and via images obtained with an infrared camera under an incident heat flux, two examples of such systems: a single (1×1) pixel array and a 3×3 nine-pixel array, wherein each pixel is an aluminum-modified adaptive infrared-reflecting composite material comprising one active area, which can be visualized with most commercial infrared cameras (i.e. having spectral range of 7.5 to 14 microns) and selectively actuated. Here, a representative single pixel system of the application presented in FIG. 9A (left) features an apparent temperature difference of ~3.6° C. between its aluminum-modified active area and the surrounding substrate prior to electrical actuation. Although not to be bound by theory, this is presumably due to the dominance of the reflectance's diffuse component in the unactuated state. In contrast, the same system features an increased apparent temperature difference of ~6.8° C. between its active area and the surrounding substrate after electrical actuation (FIG. 9A, right), again presumably due to the dominance of the reflectance's specular component in the actuated state. Notably, the observed change in apparent temperature is rapid, stable, and fully reversible over numerous on/off cycles for the adaptive systems of the application.

Figure 9E:
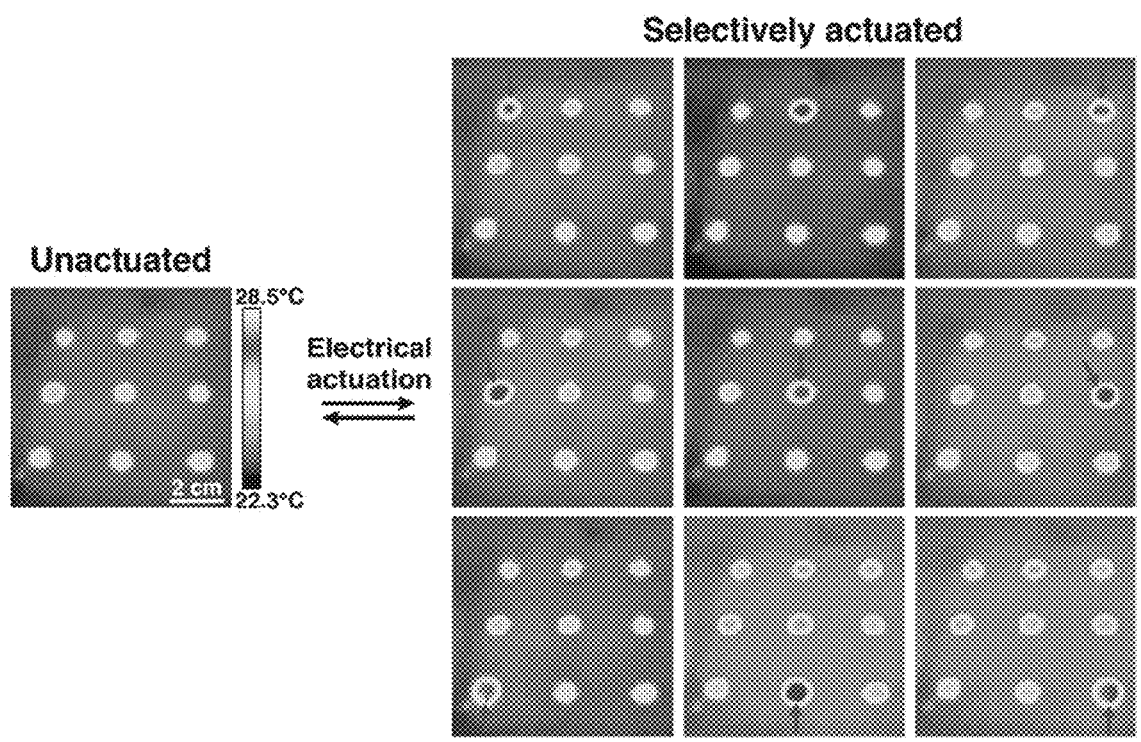

As another example, a representative 3×3 pixel array system, assembled according to the embodiments of the invention, is presented in FIGS. 9B-9E both schematically and via optical and infrared camera images. Similarly to the 1×1 single pixel analog described herein, the larger array demonstrated analogous modulation figures-of-merit for the apparent temperature differences between its active areas and the surrounding substrate upon pixel-specific, independent electrical actuation (FIGS. 9B and 9E). In addition, more complex, multiplexed array arrangements of adaptive infrared-reflecting systems of the application also readily exhibited tandem changes in the local apparent temperatures for every discrete pixel (FIGS. 9B and 9E). For example, electrical actuation of different combinations of seven multiplexed pixels in a 3×3 array according to the embodiments of the invention enabled the system to "spell out" the letters "U," "C," and "I" (FIG. 9B). Accordingly, in many embodiments, the general approach to fabrication of multiplexed adaptive infrared-reflecting systems described herein is amenable to the fabrication of advanced displays with high pixel densities and/or sub-millimeter pixel sizes (S. Akbari, H. R. Shea, Microfabrication and characterization of an array of dielectric elastomer actuators generating uniaxial strain to stretch individual cells. *J. Micromech. Microeng.* 22, 1-12 (2012), the disclosure of which is incorporated herein by reference).

Figure 10A:
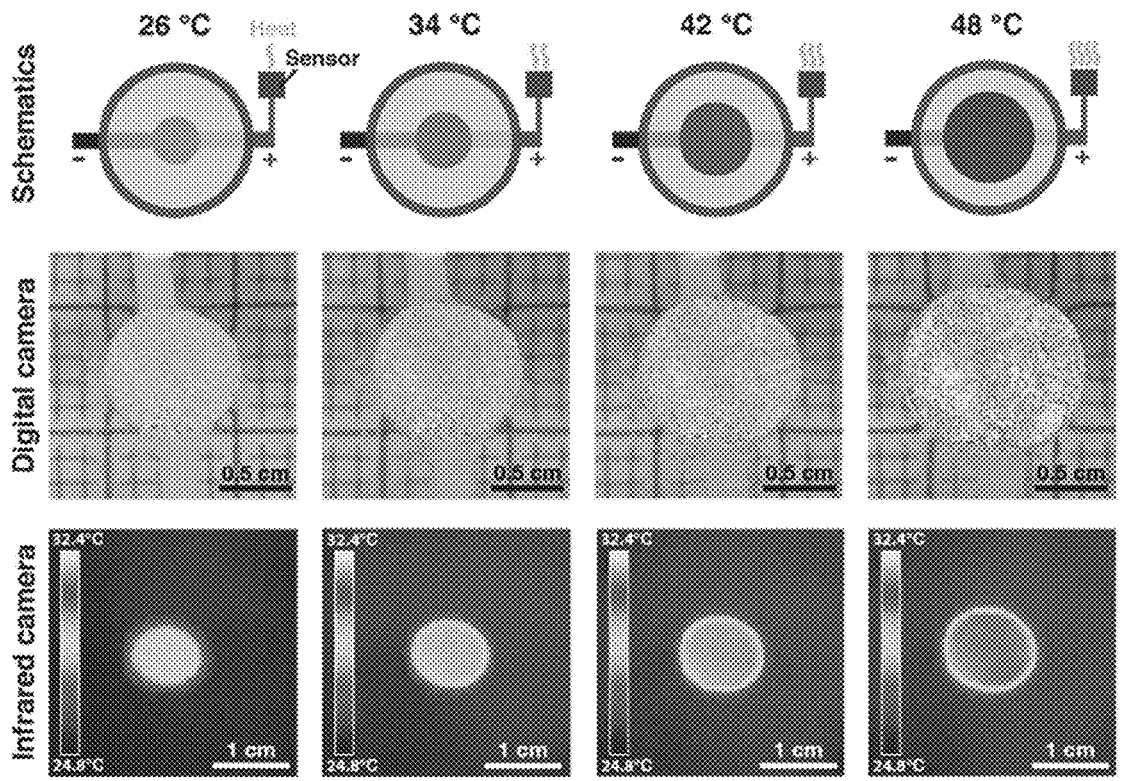
FIGS. 10A and 10B provide schematics and data demonstrating a temperature sensitive, autonomously operating, adaptive broadband (metal-modified) infrared-reflecting system in accordance with embodiments of the application.
Figure 10B:
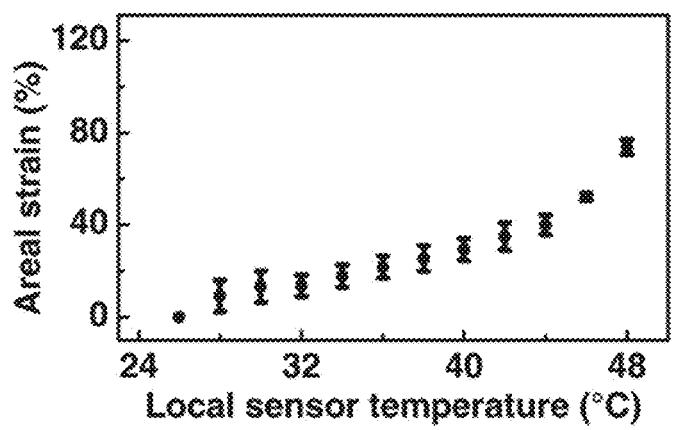

In many embodiments, the adaptive infrared-reflecting composite materials and systems of the application can operate without input from an external operator. FIGS. 10A-10B illustrate an example of an autonomous adaptive infrared-reflecting material and system according to many such embodiments. In this example, an electrically-actuated system with a single aluminum-modified active area is connected to a remote independently-heated temperature sensor, which transduced thermal information from a distal environment while avoiding undesired cross-talk. In this example, at a sensor temperature of ~26° C., the autonomous system possesses a microstructured (e.g., wrinkled) active area and an apparent temperature difference between the active area and surrounding unmodified substrate of ~3.4° C., as revealed by digital and infrared camera imaging, respectively (FIG. 10A). Upon a change in the temperature of the sensor to ~34° C., the system's active area flattens and expands by 18±(5) % (relative to the initial value) and its apparent temperature difference increases to ~3.8° C. with respect to the surrounding unmodified substrate (FIG. 10A). After a further rise in the sensor's temperature to ~42° C., the active area flattens and expands further by 35±(6) % (relative to the initial value) and its apparent temperature difference increases to ~4.0° C. with respect to the unmodified substrate (FIG. 10A). With an additional rise in the sensor's temperature to ~48° C., the active area flattens and expands even more by 74±(3) % (relative to the initial value) and its temperature difference increases to ~4.4° C. with respect to the unmodified substrate (FIG. 10A). Accordingly, in many embodiments, over the sensor's temperature window of >20° C., the autonomous adaptive infrared-reflecting system of the application exhibits reproducible and stable changes in the size of its active area (and apparent temperature), albeit in non-linear fashion (FIG. 10B).

Figure 11:
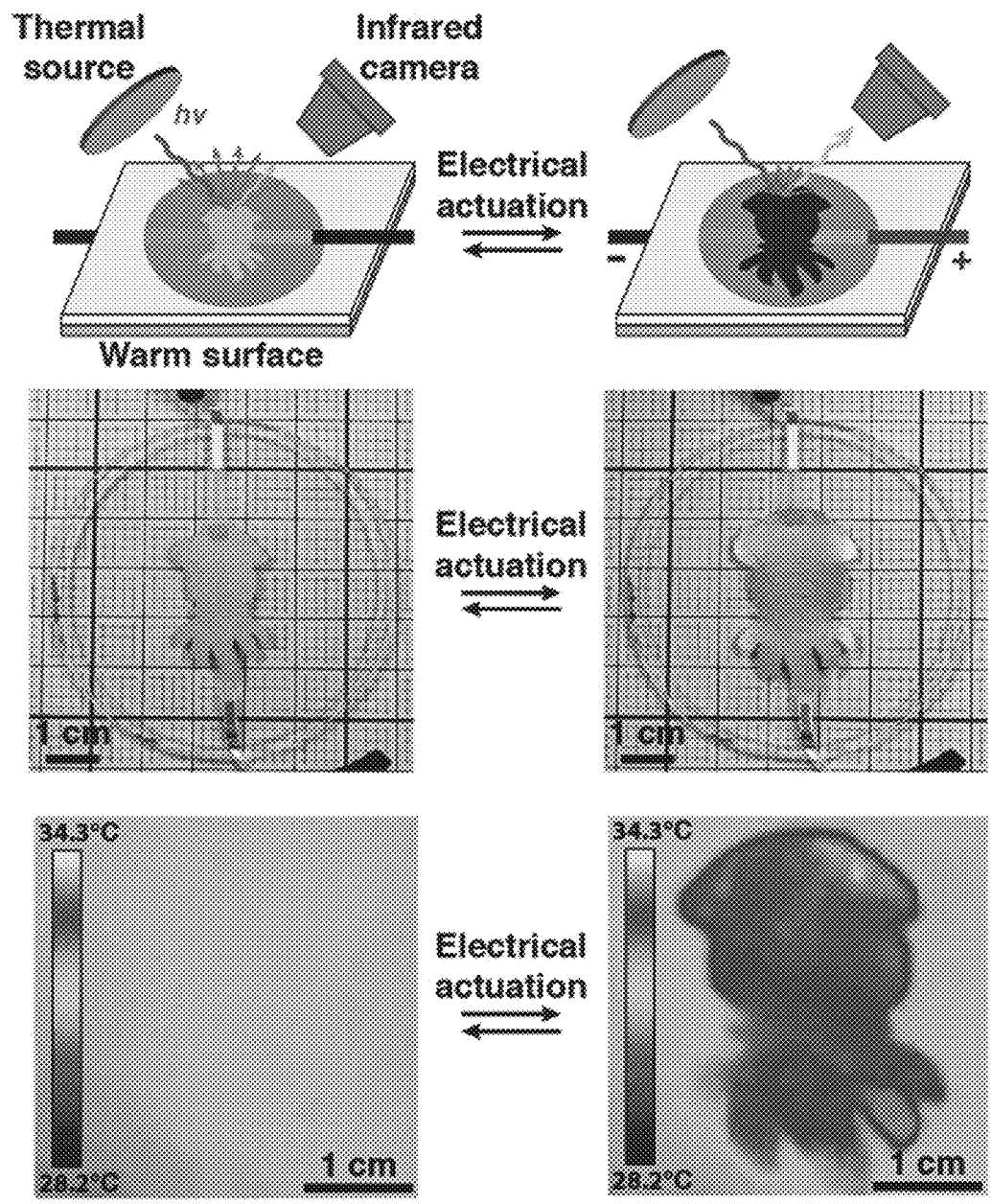
FIG. 11 provides schematics and data demonstrating the thermal camouflage capabilities of adaptive broadband (metal-modified) infrared-reflecting systems in accordance with embodiments of the application.

In many embodiments, the adaptive reflecting composite materials and systems of the application are able to conceal themselves from visualization (e.g., an infrared-reflecting system would be reversibly concealable from infrared visualization). FIG. 11 illustrates the infrared camouflage capabilities of an adaptive material and system assembled according to the embodiments of the application, wherein the system features a single aluminum-modified active area in the complex shape of a swimming squid's silhouette and is imaged with an infrared camera under an incident heat flux on a surface with a locally-elevated temperature. In the set-up presented in FIG. 11, prior to electrical actuation, the squid silhouette-shaped microstructured (wrinkled) active area is relatively small and demonstrates a negligible apparent temperature difference with the immediate surroundings, which effectively makes the squid silhouette invisible in the local thermal environment of ~35° C., as revealed by the infrared camera imaging. In contrast, after electrical actuation, the squid silhouette-shaped active area is enlarged and flattened (FIG. 11), and demonstrates a significant apparent temperature difference of ~2° C. with the immediate surroundings, which makes the squid silhouette stand out, as revealed by infrared camera imaging (FIG. 11). In many embodiments, the camouflage capabilities of the adaptive materials and systems produced according to the embodiments of the invention, as observed under active visualization, are rapid, stable, and fully reversible over numerous on/off cycles.

Accordingly, in many embodiments, the adaptive multispectral composite materials and systems of the instant disclosure possess an unprecedented combination of properties and capabilities. Furthermore, in many embodiments, the fully artificial adaptive composite materials and systems of the application translate many of the key natural capabilities of cephalopods from the visible to the infrared regions of the electromagnetic spectrum. Likewise, the composite materials and systems of the application can be adapted for functionality within any region of the electromagnetic spectrum. In many such embodiments, the composite materials and systems are adapted for functionality in the desired region of the electromagnetic spectrum via appropriate choice of the reflective coating disposed over the active area's surface or even via an absence thereof. In many embodiments, the adaptive composite materials and systems of the application are easy to manufacture and are amenable to straightforward integration with other systems. In many such embodiments, the adaptive composite materials and systems of the application may be useful in facilitating applications in dielectric elastomer-based artificial muscles, pneumatic automation, energy generation, and adaptive optics, among other areas. Furthermore, in many embodiments, the adaptive composite materials and systems of the application may enable autonomous portable/wearable thermoregulatory technologies.

EXEMPLARY EMBODIMENTS

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, temperature is in degrees Celsius, and pressure is at or near atmospheric.

Example 1. Fabrication of an Adaptive Multispectral Composite Material with a Single Active Area from the Sulfonated Pentablock Copolymer and Acrylate Elastomer The tri-layer composite materials and devices were fabricated according to procedures schematically depicted in FIG. 3A and FIG. 7A, respectively. First, as the central device layer, an acrylate elastomer (VHB 4905, 3M) was mounted and equiaxially stretched by 1,600% (relative to its initial area) on a home-built size-adjustable holder. Next, as the top and bottom layers/electrodes, either two square (dimensions of ~3.6 cm by ~3.6 cm for mechanical actuation) or two circular (radius of ~1 cm for electrical actuation) sections of the as-prepared sulfonated pentablock copolymer membrane were laminated onto both sides of the acrylate elastomer central layer. For mechanical actuation experiments, the partially-completed device was mechanically contracted by ~40% with respect to the initial length of the optically-active square region. For electrical actuation experiments, the partially-completed device was modified with additional stripe-shaped copolymer membranes as electrical leads, prior to mechanical contraction by ~40% with respect to the diameter of the optically active circular region. The resulting completed materials and devices were used for the relevant physical, mechanical, electrical, optical, and/or infrared characterization experiments as required.

Example 2. Fabrication of an Adaptive Infrared Reflecting Composite Material with a Single Aluminum Coated Active Area The composite materials were prepared according to standard lithographic protocols. First, to fabricate the texturizing electrodes, a commercially-available sulfonated pentablock co-polymer (NEXAR™, Kraton Polymers LLC) was spincast onto a 6-inch diameter silicon wafer (University Wafer) and cured via heating at 60° C. For the unmodified bottom electrode, the co-polymer film was directly delaminated from the support substrate, and for the aluminum-modified top electrode, 20 nm of aluminum was electron-beam evaporated onto the co-polymer film with an Angstrom Engineering EvoVac system prior to delamination from the support substrate. Next, to prepare the elastically deformable substrate, an acrylate elastomer (VHB 4905, 3M) was mounted and equiaxially stretched by 1,600% (relative to its initial area) on a home-built size-adjustable holder (with the exception of the sensor-integrated materials and systems, where the equiaxial stretching was 1100%). In turn, either a circular or a square section of the texturizing electrode was laminated onto the stretched acrylate elastomer as the bottom electrode, and either a circular or a square section of an aluminum-modified texturizing electrode was laminated onto the stretched acrylate elastomer as the top electrode. Subsequently, for the mechanical actuation experiments, the partially-completed composite material was contracted by ~40% with respect to the length of the square of the texturizing electrodes by adjustment of the holder. In turn, for electrical actuation experiments, the partially-completed composite material was modified with stripe-shaped texturizing electrodes as the electrical leads, prior to contraction by ~40% with respect to the diameter of the electrodes, and was then transferred to an appropriate support frame in accordance with a dielectric elastomer configuration. The resulting completed composite materials were used for the physical, mechanical, electrical, optical, and infrared characterization experiments as needed.

Example 3. Fabrication of an Adaptive Infrared Reflecting Composite Material with a Single Active Area Featuring a $TiO_2/SiO_2$ Bragg Stack The composite materials were prepared according to standard lithographic protocols. First, to fabricate the electrodes, a sulfonated pentablock co-polymer (NEXAR™, Kraton Polymers LLC) was spincast onto a 6-inch diameter silicon wafer (University Wafer) and cured via heating at 60° C. Next, to prepare the elastically deformable substrate, an acrylate elastomer (VHB 4905, 3M) was mounted and equiaxially stretched by 1,600% (relative to its initial area) on a home-built size-adjustable holder. In turn, square sections of the texturizing electrodes were laminated onto the acrylate elastomer as the top and bottom electrodes. Subsequently, alternating layers of titanium dioxide ($TiO_2$) and silicon dioxide ($SiO_2$) were electron-beam evaporated onto the top electrode in the sequence $TiO_2/SiO_2/TiO_2/SiO_2/TiO_2$ with an Angstrom Engineering EvoVac system. Here, to produce a 3 µm peak reflectance, the $SiO_2$ thickness was 0.560 µm and the $TiO_2$ thickness was 0.326 µm; to produce a 4 µm peak reflectance, the $SiO_2$ thickness was 0.747 µm and the $TiO_2$ thickness was 0.435 µm; and to produce a 5 µm peak reflectance, the $SiO_2$ thickness was 0.933 µm and the TiO$_2$ thickness was 0.543 μm. Finally, for actuation experiments, the partially-completed system was contracted by ~37.5% with respect to the length of the square electrodes. The resulting completed composite materials were used for the physical, mechanical, optical, and infrared characterization experiments as needed.

Example 4. Fabrication of a Multiplexed, Adaptive Infrared Reflecting Material and System with Multiple Aluminum-Coated Active Areas in an Array Configuration The multiplexed systems were prepared in a similar fashion to the single active area composite materials of Example 1. However, first, an array consisting of multiple active areas of Example 1 had to be designed. In one example, a three by three array consisting of nine active areas of Example 1 was designed, wherein the center-to-center distance between any two active areas was ~2.7 cm and edge-to-edge distance between any two active areas was ~2.0 cm. Here, the spacing between active areas was selected to facilitate benchtop fabrication and to minimize inter-device electrical cross-talk at kilovolt operating voltages. Next, according to the design, nine (i.e. 3×3) regularly-arranged circular openings were introduced into an acrylic support frame with an Epilog Fusion laser cutter. In turn, nine single active areas, each consisting of: an unmodified sulfonated pentablock co-polymer bottom electrode, an acrylate elastically deformable substrate, and an aluminum-modified sulfonated pentablock co-polymer top texturizing electrode were fabricated within the circular openings of the acrylic support frame according to the procedures described in Example 1. Finally, electrical leads consisting of scotch-tape covered aluminum foil were connected to each of the active areas in the array. The overall process furnished the multiplexed architecture shown in FIG. 7C, which was used for the physical, electrical, optical, and infrared characterization experiments.

Example 5. Fabrication of an Adaptive, Infrared Reflecting Composite Material and System with a Single, Odd-Shaped, Aluminum Coated Active Area The system was prepared in a similar fashion to the composite materials of Example 1. First, squid silhouette-shaped mask was cut from Reynolds™ plastic-coated freezer paper with an Epilog Fusion laser cutter. Next, the mask was used to excise appropriately-shaped texturizing electrodes from both aluminum-coated and plain sulfonated pentablock co-polymer films. In turn, these electrodes were used to fabricate the system shown in FIG. 9 according to the procedures described in Example 1. The resulting completed system was used for the physical, electrical, optical, and infrared characterization experiments as needed.

Example 6. Mechanical Actuation of the Adaptive Composite Materials, Systems, and Devices The active areas of the composite materials, systems, and devices of the instant disclosure were mechanically actuated in a home-built size-adjustable holder, which was used to apply/release equiaxial strain to/from the active areas. During mechanical actuation, the length of the square-shaped active areas was increased by ~66.7% for actuation and then contracted by ~40% to return to the initial position, unless otherwise noted. During standard mechanical actuation of the composite materials and systems featuring TiO$_2$/SiO$_2$ Bragg Stack, the length of their square-shaped active areas were increased by ~60% for actuation and then contracted by ~37.5% to return to the initial position, unless otherwise noted. These protocols maintained stringent consistency between experiments.

Example 7. Electrical Actuation of the Adaptive Multispectral Devices from the Sulfonated Pentablock Copolymer and Acrylate Elastomer The tri-layer device structures were electrically actuated in a rigid support frame. For all experiments, the devices were connected to a home-built high-voltage power supply consisting of a Stanford Research DS345 function generator, a Texas Instruments OPA 548 operational amplifier, and an EMCO E80 high-voltage amplifier. The areal strain obtained during electrical actuation with different voltages was recorded and calculated according to the equation:

$$\text{Areal strain } (\%) = [(A_1 - A_0)/A_0] \times 100\%$$

where $A_0$ is the area before actuation and $A_1$ is the area after actuation. The device response time ($t_{res}$) observed during electrical actuation was calculated according to the equation:

$$t_{res} = t_{90\%} - t_{10\%}$$

where $t_{90\%}$ is the rise time to reach 90% of the maximum change in area during one typical actuation cycle and $t_{10\%}$ is the rise time to reach 10% of the maximum change in area during one typical actuation cycle.

Example 8. Electrical Actuation of the Adaptive Infrared Reflecting Composite Materials and Systems Comprising Aluminum Coated Active Areas The adaptive infrared reflecting composite materials and systems were electrically actuated with custom-modified electronics in both stand-alone and multiplexed configurations. For all measurements, the composite materials and systems were connected to a home-built high-voltage power supply consisting of a DS345 function generator (Stanford Research), an OPA 548 operational amplifier (Texas Instruments), and an E80 high-voltage amplifier (EMCO). For multiplexed measurements, the systems' arrays were also connected to a home-built switching/control system featuring nine switches (McMaster-Carr), which allowed for independent control of each active area in the multiplexed array. The obtained electrical characteristics were analyzed with the QuickTime Player and MATLAB software packages. In all cases, the measurements were performed for at least three composite materials or systems and independently verified multiple times for each system. During all measurements, the composite materials and systems were exposed to an incident thermal flux from a warm surface with a temperature of ~37° C. and an orientation of 45°, while the room temperature was maintained at ~23° C. and the relative humidity was maintained at ~49%, unless otherwise noted.

Example 9. Autonomous Electrical Actuation of the Sensor-Integrated Adaptive Infrared Reflecting Systems Comprising Aluminum Coated Active Areas The adaptive infrared-reflecting systems were actuated autonomously without any user input with signals from an integrated sensor. For all measurements, the systems were connected to a home-built autonomous operation system consisting of a TMP36 integrated circuit temperature sensor (Analog) powered by two AA batteries, an OPA 548 operational amplifier (Texas Instruments), and an E80 high-voltage amplifier (EMCO). In this configuration, the sensor's voltage output $V_{sens}$ was dependent on the local temperature according to the equation:

Temp (° C.)=[$V_{sens}$(mV)−500]/10

To generate the appropriate voltage, the sensor's output was connected in series with another AA battery of voltage $V_b$, and the overall output $V_{overall}$ (i.e. $V_{sens}+V_b$) of the system was increased 1,600-fold by the amplifier. To systematically alter its local thermal environment, the sensor was positioned remotely from the systems and independently heated over a temperature range of 26° C. to 48° C., with the resulting areal strain of the system allowed to equilibrate and stabilize after heating to each temperature point. Here, the sensor was remote (not local) relative to the composite material or system to mitigate the possibility of undesired thermal cross-talk (interference). The obtained electrical characteristics were analyzed with the MATLAB software package. In all cases, the experiments were performed for at least four systems and independently verified multiple times for each system. During all measurements, the systems were exposed to an incident thermal flux from a warm surface with a temperature of ~37° C. and an orientation of 45°, while the room temperature was maintained at ~26° C. and the relative humidity was maintained at ~47%, unless otherwise noted.

Example 10. Electrical Actuation of Adaptive Infrared Reflecting Systems Featuring Oddly-Shaped Aluminum Coated Active Areas The adaptive infrared reflecting systems were electrically actuated in variable local thermal environments to demonstrate their thermal camouflage capabilities. For all measurements, the systems were connected to a home-built high-voltage power supply consisting of a DS345 function generator (Stanford Research), an OPA 548 operational amplifier (Texas Instruments), and an E80 high-voltage amplifier (EMCO). To maintain a specific local temperature, the systems were positioned above a surface maintained at a constant temperature of ~35° C. The obtained electrical characteristics were analyzed with the QuickTime Player and MATLAB software packages. In all cases, the experiments were performed for at least three systems and independently verified multiple times for each system. During all measurements, the systems were exposed to an incident thermal flux from a warm surface with a temperature of ~37° C. oriented at a 45° angle with respect to the systems, while the room temperature was maintained at ~23° C. and the relative humidity was maintained at ~45%, unless otherwise noted.

Example 11. Representative Calculation of the Energy Associated with the Electrical Actuation of the Adaptive Infrared Reflecting Composite Materials and Systems of the Application Established literature protocols were used to estimate the energy associated with the electrical actuation of the adaptive infrared reflecting composite materials and systems. To simplify the calculation, it was assumed that the elastically deformable substrates behaved as ideal dynamic parallel plate capacitors, where the substrate elastomer was a perfect electrical insulator (with no leakage current and without accounting for the contribution from electrode resistance). As an example, the calculations were performed for the representative composite material illustrated in FIG. 6A, which was actuated with a square waveform voltage at a frequency of 0.5 Hz (minima of 0 kV and maxima of 3.2 kV). After the application of the voltage (t~1 s), the capacitance (C) of the composite material was described by the equation:

$$C = \varepsilon_r \varepsilon_0 \frac{A}{d}$$

where $\varepsilon_r$ was the relative permittivity of the 3M-VHB 4905 dielectric elastomer substrate (~4.7), $\varepsilon_0$ was the permittivity of free space (~8.854×10$^{-12}$ F/m), A was the material's active area after actuation (~6.5×10$^{-5}$ m$^2$), and d was the estimated dielectric elastomer substrate's thickness after actuation (~2.6×10$^{-5}$ m). This calculation yielded a capacitance of ~104 pF for the system. Moreover, the energy (E) stored in the system was described by the equation:

where C was the capacitance (~104 pF) and U was the applied voltage (3.2 kV). This calculation yielded a stored energy (E) of ~5.3×10$^{-4}$ J and a corresponding stored energy per active area ($E_A$) of ~8.1 J/m$^2$ for the system/material.

Materials and Methods

Visible and Infrared Spectroscopic Characterization of the Adaptive Multispectral Composite Materials and Devices.

The tri-layer device structures were spectroscopically characterized both before and after mechanical actuation. To obtain the total transmittance, diffuse transmittance, total reflectance, and diffuse reflectance in the infrared region of the electromagnetic spectrum, the composite materials and devices were characterized with a Perkin Elmer Frontier Fourier Transform Infrared Spectrometer that was equipped with a PIKE Technologies Mid-Infrared integrating sphere, which features a circular sample port with a ~2.1 cm diameter. The composite materials' and devices' active areas in both their unactuated and actuated states were sufficiently large to cover the sample port. The measurements were performed at an incidence angle of 12° and were referenced to a Pike Technologies diffuse gold standard as appropriate. To obtain the total transmittance, diffuse transmittance, total reflectance, and diffuse reflectance in the visible region of the electromagnetic spectrum, the active areas were characterized with a Jasco V670 UV-Vis-NIR Spectrometer that was equipped with a Jasco ILN-925 150 mm integrating sphere, which features a rectangular-shaped sample port with a ~0.9 cm length and a ~1.3 cm width in transmission mode and a square-shaped sample port with a ~1.6 cm length in reflection mode. The active areas in both unactuated and actuated states were sufficiently large to cover the sample ports. The measurements were performed at normal incidence in transmission mode and at an incidence angle of 5° in reflection mode, and were referenced to Jasco Spectralon standards as appropriate. The specular transmittance was calculated according to the equation:

Specular Transmittance (%)+Diffuse Transmittance (%)=Total Transmittance (%)

The specular reflectance was calculated according to the equation:

Specular Reflectance (%)+Diffuse Reflectance (%)=Total Reflectance (%)

The absorptance was calculated according to the equation:

Total Transmittance (%)+Total Reflectance (%)+Total Absorptance (%)=100%

The obtained spectra were processed and analyzed with the Perkin Elmer Spectrum, Jasco Spectra Manager™ Suite, and Origin Pro software packages.

Infrared Spectroscopy of Adaptive Infrared Reflecting Composite Materials and Systems Featuring Either Aluminum Coated or $TiO_2/SiO_2$ Bragg Stack-Modified Active Areas.

The adaptive infrared reflecting composite materials and systems were spectroscopically characterized in custom-built holders both before and after actuation. To obtain the diffuse reflectance, total reflectance, and total transmittance, the composite materials and systems were characterized with a Frontier Fourier Transform Infrared Spectrometer (FTIR, Perkin Elmer) that was equipped with an upward-looking Mid-Infrared integrating sphere (Pike Technologies), which featured a sample port with a ~2.1 cm diameter. The active areas of the adaptive infrared reflecting composite materials and systems used for all experiments were large enough to completely cover the sample port both before and after actuation. The measurements were performed at an illumination angle of 12 degrees over a wavelength range of 1.5 to 15 μm and referenced to a diffuse gold standard (Pike Technologies). From these measurements, the specular reflectance was calculated according to the equation (as detailed in L. Hanssen, S. Kaplan, R. Datla, Infrared Optical Properties of Materials, NIST Special Publication 250-94, (2015), the disclosures of which are incorporated herein by reference):

Specular reflectance (%)+Diffuse reflectance (%)=Total reflectance (%)

and the absorptance was calculated according to the equation:

Total reflectance (%)+Total transmittance (%)+Total absorptance (%)=100%

To obtain the angle-dependent specular reflectance, the adaptive infrared reflecting composite materials and systems were characterized with a Frontier Optica Fourier Transform Infrared Spectrometer (FTIR, Perkin Elmer) that was equipped either with a 10-degree specular reflectance accessory (10Spec, Pike Technologies) or a Variable Angle specular reflectance accessory (VeeMAX III, Pike Technologies), both of which featured sample ports with a ~1 cm diameter. The active areas of the adaptive infrared reflecting composite materials and systems used for all experiments were large enough to completely cover the sample ports both before and after mechanical actuation. The measurements were performed at various angles over a wavelength range of 1.5 to 15 μm and referenced to a reflective gold standard (Pike Technologies). In all cases, the measurements were performed for at least three composite materials or systems and independently verified at least three times for each composite material or system with the room temperature maintained at ~21° C. and the relative humidity maintained at ~49%, unless otherwise noted. During analysis, the obtained spectra were processed and evaluated with the Spectrum (Perkin Elmer) and Origin Pro software packages.

Physical Characterization of the Adaptive Multispectral Composite Materials and Devices.

The nanoscale and microscale morphologies of the membranes and devices were characterized with atomic force microscopy (AFM) and scanning electron microscopy (SEM). The height and phase images were obtained with an Asylum Cypher atomic force microscope at a typical scan rate of 0.2 Hz/s. The surface microstructure images were obtained with an FEI Quanta 3D FEG scanning electron microscope. The AFM data was analyzed with the Gwyddion software package.

Physical Characterization of the Adaptive Infrared Reflecting Composite Materials and Systems Featuring Either Aluminum Coated or $TiO_2/SiO_2$ Bragg Stack-Modified Active Areas.

The adaptive infrared reflecting composite materials and systems were physically characterized both before and after actuation. The global surface morphologies of the systems were characterized in reflection mode with an Axio Imager A1M optical microscope (Zeiss) equipped with an AxioCam MRc5 Digital Camera (Zeiss). The local surface morphologies of the composite materials and systems were characterized with an XL-30 FEG scanning electron microscope (Philips). The measurements were performed for at least three composite materials or systems and independently verified a minimum of five times for each material or system.

Digital and Infrared Camera Imaging of the Aluminum-Coated Adaptive Infrared Reflecting Composite Materials and Systems.

For the digital imaging, the pictures and videos were obtained with a PowerShot SX520 HS digital camera (Canon). For the infrared imaging, the pictures and videos were obtained with a C2 infrared camera (FLIR) featuring a built-in rainbow color palette for the temperature and an effective spectral range from wavelengths of 7.5 μm to 14 μm. The videos were captured through live streaming to a computer with the FLIR software package and recording with the Icecream Screen Recorder software package. The areal strain was calculated from the images/videos according to the equation:

Areal strain (%)=$[(A_1-A_0)/A_0]\times 100\%$ where $A_0$ is the area prior to actuation and $A_1$ is the area after actuation. For analysis, the obtained digital camera and infrared camera images/videos were processed with the QuickTime Player and MATLAB software packages. In all cases, the measurements were performed for at least three composite materials or systems and independently verified multiple times for each material or system. During all measurements, the composite materials and systems were exposed to an incident thermal flux from a warm surface with a temperature of ~37° C. and an orientation of 45°, while the room temperature was maintained at ~23° C. and the relative humidity was maintained at ~49%, unless otherwise noted.

DOCTRINE OF EQUIVALENTS

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A spectrally adaptive composite material comprising:
   at least one size-variable active area having a variable transmittance, reflectance, and/or absorptance in at least a portion of the electromagnetic spectrum comprising:
   an elastically deformable substrate transparent in at least the portion of the electromagnetic spectrum and having an unrelaxed state wherein the elastically deformable substrate is elastically deformed beyond a relaxed state, and
   a texturizing layer disposed on a first side of the elastically deformable substrate, wherein the texturizing layer is transparent in at least the portion of the electromagnetic spectrum;
   wherein at least when the elastically deformable substrate is in the relaxed state the texturizing layer forms a plurality of geometrically reconfigurable microstructures with at least one size scale in the 10 nm to 100 µm range in at least one size-variable active area;
   wherein the at least one size-variable active area has a smaller surface area and a larger thickness than when the elastically deformable substrate is in the unrelaxed state; and
   wherein the transmittance, reflectance, and/or absorptance of the at least one size-variable active area within at least the portion of the electromagnetic spectrum are altered by the elastic deformation of the elastically deformable substrate into and out of the relaxed state.

2. The composite material of claim 1, wherein the material is configured according to at least one of the following:
   the surface area of the at least one size-variable active area is altered via mechanical actuation;
   the elastically deformable substrate comprises an elastomer; and
   the portion of the electromagnetic spectrum is selected from the group of: visible, near-infrared, short-wavelength infrared, medium-wavelength infrared, long-wavelength infrared, and far infrared.

3. The composite material of claim 1, wherein:
   the elastically deformable substrate is dielectric;
   the texturizing layer is proton or ion-conducting and acts as a top electrode; and
   wherein the at least one size-variable active area further comprises a second texturizing layer disposed on a second side of the elastically deformable substrate, wherein the second texturizing layer acts as a bottom proton or ion-conducting electrode such that the composite material is electrically active.

4. The composite material of claim 3, wherein the variable transmittance, reflectance, and/or absorptance are altered via at least one of the following: electrical actuation and autonomously.

5. The composite material of claim 3, wherein the elastically deformable substrate comprises acrylate elastomer; and wherein the first and second texturizing layers comprise a sulfonated pentablock co-polymer.

6. The composite material of claim 3, wherein the composite material is configured according to at least one of the following:
   the composite material comprises more than one size-variable active area;
   the portion of the electromagnetic spectrum is selected from the group consisting of: visible, near-infrared, short-wavelength infrared, medium-wavelength infrared, long-wavelength infrared, and far infrared; and
   the variable transmittance, reflectance, and/or absorptance of each size-variable active area is altered autonomously without input from an external operator.

7. A composite adaptive reflective material comprising:
   at least one size-variable active area having a variable reflectance in at least a portion of the electromagnetic spectrum comprising:
   an elastically deformable substrate transparent in at least the portion of the electromagnetic spectrum and having an unrelaxed state wherein the elastically deformable substrate is elastically deformed beyond a relaxed state,
   a texturizing layer disposed on a first side of the elastically deformable substrate, wherein the texturizing layer is transparent in at least the portion of the electromagnetic spectrum, and
   a reflective coating disposed on an outer surface of the texturizing layer disposed on a first side of the elastically deformable substrate, wherein the reflective coating is reflective in at least the portion of the electromagnetic spectrum;
   wherein at least when the elastically deformable substrate is in the relaxed state the texturizing layer forms a plurality of geometrically reconfigurable microstructures with at least one size scale in the 10 nm to 100 µm range in at least one size-variable active area;
   wherein the at least one size-variable active area has a smaller surface area and a larger thickness than when the elastically deformable substrate is in the unrelaxed state; and
   wherein the reflectance of the at least one size-variable active area within at least the portion of the electromagnetic spectrum is altered by the elastic deformation of the elastically deformable substrate into and out of the relaxed state.

8. The composite material of claim 7, wherein the composite material is configured according to one of the following:
   surface area of the at least one size-variable active area is altered via mechanical actuation;
   the elastically deformable substrate comprises an elastomer;
   the portion of the electromagnetic spectrum is the Infrared portion;
   the portion of the electromagnetic spectrum is the Infrared portion, and wherein the reflective coating is a thin film of a metal material;
   the portion of the electromagnetic spectrum is the Infrared portion, wherein the reflective coating is a thin film of a metal material, and wherein the metal is selected from the group consisting of: aluminum, copper, and nickel, or any combination thereof;
   the reflective coating is optimized for narrowband infrared reflectance within at least the portion of the electromagnetic spectrum;
   the reflective coating is optimized for narrowband infrared reflectance within at least the portion of the electromagnetic spectrum, and wherein the reflective coating is comprised of alternating layers of materials so as to create a Bragg stack; and
   the reflective coating is optimized for narrowband infrared reflectance within at least the portion of the electromagnetic spectrum, and wherein the reflective coating is comprised of alternating layers of materials so as to create a Bragg stack, and wherein the materials are selected from the group of $TiO_2$ and $SiO_2$ and combinations thereof.

9. The composite material of claim 7, wherein:
the elastically deformable substrate is dielectric;
the texturizing layer is proton or ion-conducting and acts as a top electrode; and
wherein the at least one size-variable active area further comprises a second texturizing layer disposed on a second side of the elastically deformable substrate, wherein the second texturizing layer acts as a bottom proton or ion-conducting electrode such that the composite material is electrically active.

10. The composite material of claim 9, wherein the composite material is configured according to one of the following:
the composite material is elastically deformable substrate comprises acrylate elastomer;
wherein the first and the second texturizing layers comprise a sulfonated pentablock co-polymer;
wherein the variable reflectance is altered autonomously;
the variable reflectance is altered via electrical actuation;
wherein the composite material comprises more than one size-variable active area
wherein the composite material comprises more than one size-variable active area, and wherein the variable reflectance of each size-variable active area is altered via electrical actuation
wherein the composite material comprises more than one size-variable active area, and wherein each size-variable active area is independently addressable
wherein the composite material comprises more than one size-variable active area, and wherein the portion of the electromagnetic spectrum is in the infrared; and
wherein the composite material comprises more than one size-variable active area, and wherein the variable reflectance of each size-variable active area is altered autonomously without input from an external operator.

11. An adaptive system comprising:
a plurality of size-variable active areas, each size-variable active area having a variable transmittance, reflectance, and/or absorptance in at least a portion of the electromagnetic spectrum and comprising:
an elastically deformable dielectric substrate transparent in at least the portion of the electromagnetic spectrum and having an unrelaxed state wherein the elastically deformable dielectric substrate is elastically deformed beyond a relaxed state, and
a first texturizing proton or ion-conducting layer disposed on a first side of the elastically deformable dielectric substrate as a top electrode and a second texturizing proton or ion-conducting layer disposed on a second side of the elastically deformable dielectric substrate as a bottom electrode, wherein both the first and the second texturizing proton or ion-conducting layers are transparent in at least the portion of the electromagnetic spectrum, and
optionally a reflective coating disposed on an outer surface of the first texturizing proton or ion-conducting layer, wherein the reflective coating is reflective in at least the portion of the electromagnetic spectrum;
wherein at least when the elastically deformable dielectric substrate is in the relaxed state at least the first texturizing proton or ion-conducting layer forms a plurality of geometrically reconfigurable microstructures with at least one size scale in the 10 nm to 100 µm range in at least one size-variable active area, and the size-variable active area has a smaller surface area and a larger thickness than when the elastically deformable substrate is in the unrelaxed state; and
wherein the transmittance, reflectance, and/or absorptance of the size-variable active area within at least the portion of the electromagnetic spectrum are altered by the elastic deformation of the elastically deformable dielectric substrate into and out of the relaxed state.

12. A method for altering the transmittance, reflectance, and/or absorptance within at least a portion of the electromagnetic spectrum using a composite material comprising:
at least one size-variable active area, each such size-variable active area having a variable transmittance, reflectance, and/or absorptance in at least a portion of the electromagnetic spectrum comprising:
an elastically deformable substrate transparent in at least the portion of the electromagnetic spectrum and having an unrelaxed state wherein the elastically deformable substrate is elastically deformed beyond a relaxed state, and
at least a first texturizing layer or proton or ion-conducting layer disposed on a first side of the elastically deformable substrate, wherein the at least first texturizing layer is transparent in at least the portion of the electromagnetic spectrum,
optionally a second texturizing layer or proton or ion-conducting layer disposed on a second side of the elastically deformable dielectric substrate as a bottom electrode, wherein where present the second texturizing layer or proton or ion-conducting layer is transparent in at least a portion of the electromagnetic spectrum, and
optionally a reflective coating disposed on an outer surface of at least the first texturizing layer disposed on the first side of the elastically deformable substrate, wherein the reflective coating is reflective in at least the portion of the electromagnetic spectrum;
wherein at least when the elastically deformable substrate is in the relaxed state at least the first texturizing layer forms a plurality of geometrically reconfigurable reflective microstructures with at least one size scale in the 10 nm to 100 µm range in at least one size-variable active area, and the at least one size-variable active area has a smaller surface area and a larger thickness than when the elastically deformable substrate is in the unrelaxed state; and
wherein the transmittance, reflectance, and/or absorptance of the at least one size-variable active area within at least the portion of the electromagnetic spectrum are altered by the elastic deformation of the elastically deformable substrate into and out of the relaxed state.

13. The method of claim 12, wherein:
the elastically deformable substrate is dielectric;
the texturizing layer is proton or ion-conducting and acts as a top electrode; and
wherein the at least one size-variable active area further comprises a second texturizing layer disposed on a second side of the elastically deformable substrate, wherein the second texturizing layer acts as a bottom proton or ion-conducting electrode such that the composite material is electrically active, and the transmittance, reflectance, and/or absorptance are altered via electrical actuation.

* * * * *